United States Patent
Hasegawa et al.

(10) Patent No.: US 7,045,224 B2
(45) Date of Patent: *May 16, 2006

(54) MAGNETIC DETECTING ELEMENT HAVING ANTIFERROMAGNETIC FILM HAVING PREDETERMINED SPACE IN TRACK WIDTH DIRECTION AND METHOD FOR MANUFACTURING THE SAME

(75) Inventors: Naoya Hasegawa, Niigata-ken (JP);
Eiji Umetsu, Niigata-ken (JP);
Masamichi Saito, Niigata-ken (JP);
Yosuke Ide, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 123 days.

This patent is subject to a terminal disclaimer.

(21) Appl. No.: 10/675,435

(22) Filed: Sep. 30, 2003

(65) Prior Publication Data
US 2005/0276997 A1  Dec. 15, 2005

(30) Foreign Application Priority Data
Oct. 7, 2002 (JP) ............................. 2002-293350
Feb. 26, 2003 (JP) ............................. 2003-048716

(51) Int. Cl.
*G11B 5/127* (2006.01)
(52) U.S. Cl. .................. 428/811.5; 428/84.2; 428/812; 428/813; 428/815; 428/816; 360/324.11; 360/324.12
(58) Field of Classification Search ...................... None
See application file for complete search history.

(56) References Cited

U.S. PATENT DOCUMENTS

| | | | | |
|---|---|---|---|---|
| 5,949,623 A * | 9/1999 | Lin | ........................ | 360/324.12 |
| 6,030,753 A | 2/2000 | Lin | | |
| 6,608,740 B1 * | 8/2003 | Tanaka et al. | ......... | 360/324.12 |
| 6,700,756 B1 * | 3/2004 | Hasegawa | .............. | 360/324.12 |
| 2001/0014000 A1 * | 8/2001 | Tanaka et al. | ......... | 360/324.12 |
| 2002/0069511 A1 | 6/2002 | Hasegawa et al. | | |

(Continued)

FOREIGN PATENT DOCUMENTS

JP  8-7225  1/1996

(Continued)

OTHER PUBLICATIONS

JPO Abstract Translation of Hasegawa (JP 2000 - 348309).*

Primary Examiner—Kevin M. Bernatz
(74) Attorney, Agent, or Firm—Brinks Hofer Gilson & Lione

(57) ABSTRACT

The present invention provides a magnetic detecting element including a pinned magnetic layer and a first antiferromagnetic layer which constitutes an exchange coupling film and the structures of which are optimized for properly pinning magnetization of the pinned magnetic layer, improving reproduction output and properly complying with a narrower gap, and a method of manufacturing the magnetic detecting element. The pinned magnetic layer has a synthetic ferrimagnetic structure, and the first antiferromagnetic layer has a predetermined space C formed at the center in the track width direction to produce exchange coupling magnetic fields only between the first antiferromagnetic layer and both side portions of a first magnetic layer of the pinned magnetic layer. Therefore, the magnetization of the pinned magnetic layer can be pinned, and an improvement in reproduction output and gap narrowing can be realized. Furthermore, a magnetic detecting element with high resistance to electrostatic damage (ESD) can be manufactured. Thus, a magnetic detecting element adaptable for a future higher recording density can be provided.

63 Claims, 55 Drawing Sheets

U.S. PATENT DOCUMENTS

| | | | |
|---|---|---|---|
| 2003/0179516 A1* | 9/2003 | Freitag et al. | 360/324.11 |
| 2004/0067389 A1* | 4/2004 | Hasegawa et al. | 428/692 |
| 2004/0207962 A1* | 10/2004 | Saito et al. | 360/324.11 |
| 2005/0018363 A1* | 1/2005 | Hasegawa et al. | 360/324.1 |
| 2005/0042479 A1* | 2/2005 | Tanahashi et al. | 428/694 TM |

FOREIGN PATENT DOCUMENTS

| | | |
|---|---|---|
| JP | 2000-163717 | 11/1998 |
| JP | 2000-163717 | 6/2000 |
| JP | 2001-13910 | 1/2001 |
| JP | 2001-256617 | 9/2001 |

* cited by examiner

SENSING CURRENT

FIG. 48
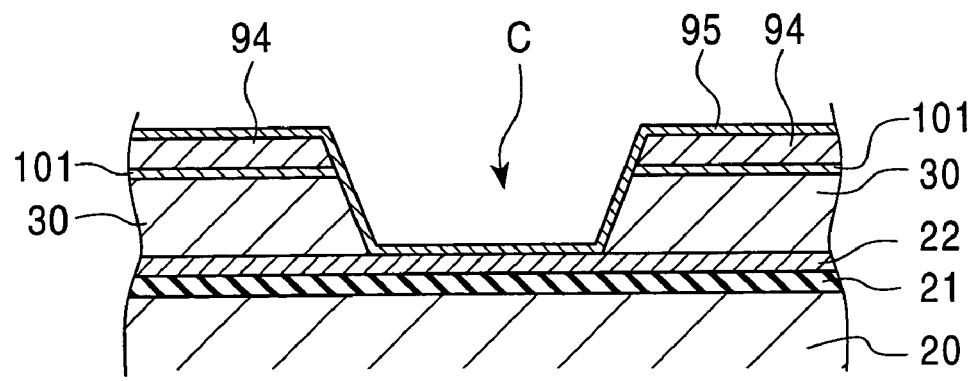
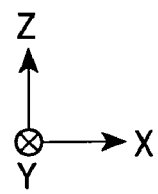
FIG. 49
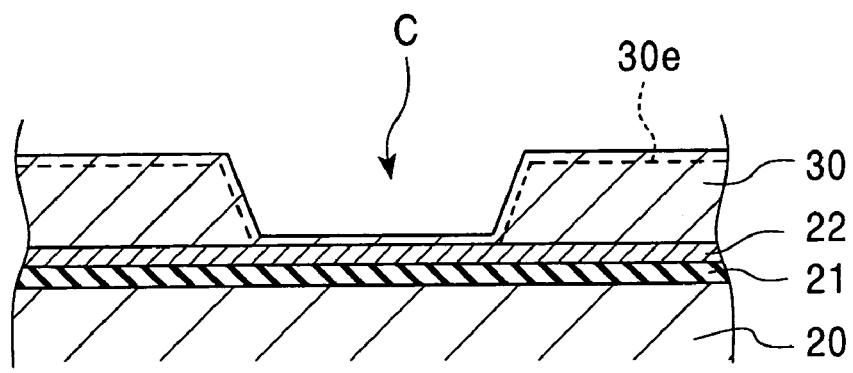
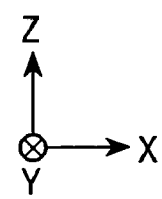

FIG. 65
PRIOR ART
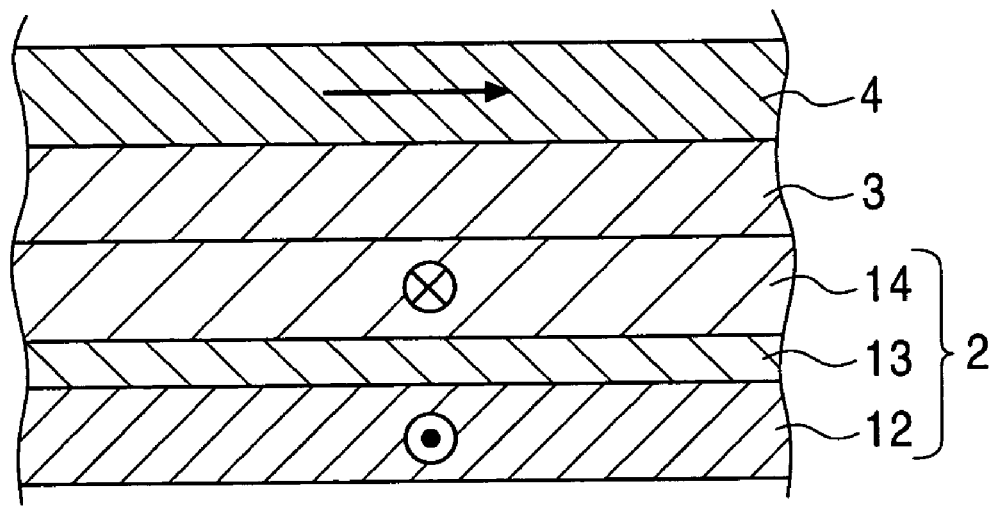
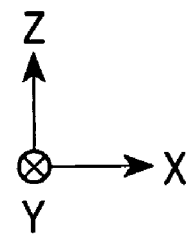

MAGNETIC DETECTING ELEMENT HAVING ANTIFERROMAGNETIC FILM HAVING PREDETERMINED SPACE IN TRACK WIDTH DIRECTION AND METHOD FOR MANUFACTURING THE SAME

BACKGROUND OF THE INVENTION

1. Field of the Invention

The present invention relates to a magnetic detecting element such as a spin valve thin film element mounted on a hard disk device or the like. Particularly, the present invention relates to a magnetic detecting element comprising a pinned magnetic layer and first antiferromagnetic layer whose structures are optimized for properly pinning magnetization of the pinned magnetic layer, improving reproduction output, and properly complying with a narrower gap, and a method for manufacturing the magnetic detecting element.

2. Description of the Related Art

FIG. 63 is a partial sectional view of a conventional magnetic detecting element (spin valve thin film element), as viewed from a surface facing a recording medium.

In FIG. 63, reference numeral 1 denotes an antiferromagnetic layer made of PtMn or the like, a pinned magnetic layer 2 made of a NiFe alloy, a nonmagnetic material layer 3 made of Cu, and a free magnetic layer 4 made of a NiFe alloy being laminated on the antiferromagnetic layer 1.

As shown in FIG. 63, permanent-magnet layers 5 are formed on both sides of these layers in the track width direction (the X direction shown in the drawing), the layers ranging from the antiferromagnetic layer 1 to the free magnetic layer 4, and electrode layers 6 are formed on the respective permanent-magnet layers 5.

In the magnetic detecting element shown in FIG. 63, magnetization of the pinned magnetic layer 2 is pinned in the Y direction shown in the drawing by an exchange coupling magnetic field produced between the antiferromagnetic layer 1 and the pinned magnetic layer 2. On the other hand, magnetization of the free magnetic layer 4 is oriented in the X direction by a longitudinal bias magnetic field from each of the permanent magnet layers 5 provided on both sides of the free magnetic layer 4.

When an external magnetic field enters into the magnetic detecting element shown in FIG. 63 from the Y direction, the magnetization of the free magnetic layer 4 varies to exhibit a magnetoresistive effect in relation to the pinned magnetization of the pinned magnetic layer 2 magnetized in the height direction (the Y direction), reproducing an external signal.

However, the structure of the magnetic detecting element shown in FIG. 63 has the following problems.

A sensing current from the electrode layers 6 preferably mainly flows through the nonmagnetic material layer 3 without shunting to the antiferromagnetic layer 1. However, in the structure shown in FIG. 63, the sensing current easily shunts to the antiferromagnetic layer 1 formed below the bottom of the pinned magnetic layer 2 to cause a current loss, thereby causing the problem of decreasing reproduction output. In the magnetic detecting element shown in FIG. 63, a track width Tw is determined by the width dimension of the upper surface of the free magnetic layer 4 in the track width direction (the X direction). However, the decrease in reproduction output becomes more significant as the track width Tw decreases, and thus a shunt sensing current shunting to the antiferromagnetic layer 1 has a considerable problem.

Also, the antiferromagnetic layer 1 is thicker than the layers laminated thereon. One of the reasons for this is that a large exchange coupling magnetic field is produced between the antiferromagnetic layer 1 and the pinned magnetic layer 2, for appropriately pinning the magnetization of the pinned magnetic layer 2. However, the above-described current loss increases due to the large thickness of the antiferromagnetic layer 1, and the distance between shield layers 7 and 8 formed at the top and bottom of the magnetic detecting element in the thickness direction (the Z direction shown in the drawing) cannot be decreased, failing to manufacture the magnetic detecting element adaptable for a narrower gap.

Furthermore, as shown in FIG. 63, when the antiferromagnetic layer 1 is formed below the entire bottom of the pinned magnetic layer 2, a magnetic detecting element resistant to electrostatic damage (ESD) cannot be manufactured. This is because a sensing current from the electrode layers 6 generates heat in the element, and magnetization of the pinned magnetic layer 2 which should be pinned in the Y direction is easily fluctuated by the effect of a transient current due to the ESD. Heat generation to a temperature lower than the blocking temperature of the antiferromagnetic layer 1 is not a large problem. However, at present, the element decreases in size, and thus heat at a temperature over the blocking temperature is generated in the element, thereby causing a magnetic electrostatic damage phenomenon called "soft ESD" in which the exchange coupling magnetic field produced between the antiferromagnetic layer 1 and the pinned magnetic layer 2 weakens to fluctuate the magnetization of the pinned magnetic layer 2.

The structure of an exchange coupling film comprising the pinned magnetic layer 2 and the antiferromagnetic layer 1 is not limited to a simple structure in which the two layers are simply laminated as shown in FIG. 63. An improved structure of the above-described structure of the exchange coupling film, and a self pinning-system pinned magnetic layer are disclosed in some documents.

For example, FIG. 64 illustrates a magnetic detecting element transcribed from FIG. 1 of Japanese Unexamined Patent Application Publication No. 2000-163717 (referred to as "Patent Document 1" hereinafter). FIG. 64 is a partial sectional view of the magnetic detecting element, as viewed from a surface facing a recording medium. In FIG. 64, the same reference numerals as in FIG. 63 denote the same layers as in FIG. 63, and reference numerals 9 and 10 each denote a gap layer.

As shown in FIG. 64, the antiferromagnetic layer 1 has a thin portion 11 provided at its center in the track width direction and different in thickness from both sides. Patent Document 1 discloses that the thin portion 11 has a weak force for directly pinning the magnetization of the pinned magnetic layer 2, while the magnetization pinning force exerted in both side portions of the antiferromagnetic layer 1 having a sufficient thickness compensates for the weak magnetization pinning force in the central potion of the pinned magnetic layer 2, thereby preventing deterioration in characteristics.

However, the above-described problems remain unsolved by the structure of the magnetic detecting element disclosed in Patent Document 1. Even if the thin portion 11 is formed at the center of the antiferromagnetic layer 1, the sensing current from the electrode layers 6 shunts to the thin portion 11 to cause a current loss, and electrostatic damage also easily occurs. Also, when the thin portion 11 is formed at the center of the antiferromagnetic layer 1, the exchange coupling magnetic field produced between the antiferromagnetic layer 1 and the pinned magnetic layer 2 decreases to apparently decrease the force of pinning the magnetization of the pinned magnetic layer 2, as compared with the force of pinning the magnetization of the pinned magnetic layer 2 of the magnetic detecting element shown in FIG. 63.

If the thin portion 11 of the antiferromagnetic layer 1 is significantly decreased for decreasing the current loss, the exchange coupling magnetic field does not occur between the thin portion 11 and the pinned magnetic layer 2. Therefore, even when magnetization is strongly pinned between both side portions of the pinned magnetic layer 2 and the antiferromagnetic layer 1, as described in Patent Document 1, the magnetization of the central portion of the pinned magnetic layer 2 is controlled only by a bias magnetic field through an exchange interaction within the magnetic layer, and thus the magnetization of the central portion cannot be strongly pinned. Therefore, the magnetization of the central portion easily varies with an external magnetic field to possibly inevitably cause deterioration in the reproduction output.

FIG. 65 shows a portion of the magnetic detecting element transcribed from FIG. 5 of Japanese Unexamined Patent Application Publication No. 8-7325 (referred to as "Patent Document 2" hereinafter). FIG. 65 is a partial sectional view of the magnetic detecting element, as viewed from a surface facing a recording medium. In FIG. 65, the same reference numerals as in FIG. 63 denote the same layers as in FIG. 63.

The magnetic detecting element shown in FIG. 65 comprises the pinned magnetic layer 2 having a three-layer structure including two magnetic layers 12 and 14, and a nonmagnetic layer 13 interposed therebetween. In Patent Document 2, the pinned magnetic layer 2 is referred to as an "automatically pinned layer". As shown in FIG. 65, the antiferromagnetic layer 1 for pinning the magnetization of the pinned magnetic layer 2 is not provided. Patent Document 2 discloses that the two magnetic layers 12 and 14 constituting the pinned magnetic layer 2 are magnetized in opposite directions and automatically pinned, and the magnetizations of the magnetic layers 12 and 14 are not rotated even when an external applied magnetic field enters.

However, when the magnetization of the pinned magnetic layer 2 is pinned only by a magnetic field produced between the magnetic layers 12 and 14 of the pinned magnetic layer 2 without using a bias means such as the antiferromagnetic layer 1, as shown in FIG. 65, the magnetizations of the magnetic layers are easily rotated by various factors such as the magnitude of the external magnetic field, etc. while maintaining an antiparallel state, or the antiparallel state is easily broken to cause deterioration in the reproduction output.

Even when the pinned magnetic layer 2 has the above-described three-layer structure, the degree of a magnetic moment per unit area of each of the magnetic layers 12 and 14 necessary for causing the pinned magnetic layer 2 to function as the "automatically pinned layer" described in Patent Document 2 is not apparently defined.

The magnetic detecting element disclosed in Japanese Unexamined Patent Application Publication No. 8-7235 (referred to as "Patent Document 3" hereinafter) comprises a buffer layer serving as an underlying layer and made of tantalum (Ta), and a pinned ferromagnetic layer laminated thereon. The pinned ferromagnetic layer comprises a first cobalt (Co) film and a second cobalt (Co) film which are laminated with a ruthenium (Ru) film provided therebetween. The magnetization of each of the first and second cobalt (Co) films is pinned by an anisotropic magnetic field.

The first and second cobalt (Co) films are antiferromagnetically coupled with each other and magnetized in antiparallel directions.

However, it was found that in the structure of the magnetic detecting element disclosed in Patent Document 3 in which the Co films are laminated on the buffer layer made of tantalum, the magnetization direction of the pinned ferromagnetic layer cannot be appropriately pinned. This is also suggested in Japanese Unexamined Patent Application Publication No. 2000-113418 (referred to as "Patent Document 4" hereinafter).

The magnetic detecting element disclosed in Patent Document 4 is devised for solving the problem of Patent Document 3. In the magnetic detecting element, a ferromagnetic film of a laminated ferrimagnetic pinned layer is made of CoFe or CoFeNi to improve induced anisotropy.

Patent Document 4 also discloses that an underlying layer made of Ta is provided below the laminated ferrimagnetic pinned layer. However, the results (FIGS. 4, 5, 6, and 7 of Patent Document 4) of the experiments carried out for comparing a case using the Ta underlying layer and a case not using the Ta underlying layer indicate that in the use of a CoFe alloy for the ferromagnetic layer, both a change in magnetoresistance and coercive force are increased when the Ta underlying layer is not provided.

Patent Document 4 also discloses that in order to increase the induced anisotropy of the laminated ferrimagnetic pinned layer, a CoFe alloy is used for the ferromagnetic film, and magnetostriction of the ferromagnetic film is made positive.

The most important factor for pinning the magnetization of the self pinning-system pinned magnetic layer is uniaxial anisotropy derived from the magnetoelastic energy of the pinned magnetic layer. Particularly, it is important to optimize the magnetostriction of the pinned magnetic layer. However, in Patent Document 4, no consideration is given to a mechanism for optimizing the magnetostriction of the pinned magnetic layer, and a specific structure for optimizing the magnetostriction of the pinned magnetic layer is not described.

As described above, there has been conventionally no structure capable of strongly pinning the magnetization of a pinned magnetic layer, improving reproduction output, and appropriately complying with a narrower gap and electrostatic damage.

SUMMARY OF THE INVENTION

The present invention has been achieved for solving the above problems, and an object of the present invention is to provide a magnetic detecting element comprising a pinned magnetic layer and a first antiferromagnetic layer whose structures are optimized for properly pinning magnetization of the pinned magnetic layer, improving reproduction output, and properly complying with a narrower gap or the like, and a method for manufacturing the magnetic detecting element.

A magnetic detecting element of the present invention comprises a multilayer film comprising a first antiferromagnetic layer, a pinned magnetic layer, a nonmagnetic material layer and a free magnetic layer, which are laminated in that order on a substrate, and a magnetization control layer for controlling magnetization of the free magnetic layer, wherein the pinned magnetic layer comprises a first magnetic layer extending in the track width direction in contact with the first antiferromagnetic layer, a second magnetic layer facing the first magnetic layer in the thickness direction, and a nonmagnetic intermediate layer interposed between the first and second magnetic layers, the magnetizations of the first and second magnetic layers being antiparallel to each other, the first antiferromagnetic layer has a predetermined space formed at its center in the track width direction so that the first antiferromagnetic layer is in contact with both side portions of the first magnetic layer in the thickness direction, and the electric resistance in the space changes in relation to the magnetization direction of the free magnetic layer and the magnetization direction of the second magnetic layer.

The above-described magnetic detecting element of the present invention is characterized in that the pinned magnetic layer comprises the first and second magnetic layers, and the nonmagnetic layer interposed between both magnetic layers, and the first antiferromagnetic layer in contact with the first magnetic layer in the thickness direction has the predetermined space at its center in the track width direction.

In the present invention, the magnetizations of both side portions of the pinned magnetic layer are pinned by an exchange coupling magnetic field produced between the pinned magnetic layer and the first antiferromagnetic layer and an antiparallel coupling magnetic field due to a RKKY interaction produced between the first and second magnetic layers. On the other hand, the antiparallel coupling magnetic field due to the RKKY interaction also occurs in the central portion of the pinned magnetic layer. Therefore, the magnetization of the central portion of the pinned magnetic layer can be strongly pinned, as compared with the magnetic detecting element shown in FIG. 64 in which the pinned magnetic layer has a single layer structure, and the magnetization of the central portion is pinned only by a bias magnetic field through an exchange interaction within the magnetic layer.

The quality of magnetization pinning in the central portion of the pinned magnetic layer depends upon the width dimension of the space formed at its center of the first antiferromagnetic layer in the track width direction. However, according to the experiments below, it is found that with the space of about 0.2 μm, the magnetization of the central portion of the pinned magnetic layer can be sufficiently securely pinned. At present when a magnetic element is aimed at a track width Tw of 0.1 μm or less, the space of 0.2 μm or less can be formed without any technical difficulty. Therefore, in the present invention, an exchange coupling film comprising the first antiferromagnetic layer and the pinned magnetic layer can be easily and properly manufactured.

In the present invention, the first antiferromagnetic layer has the predetermined space at its center in the track width direction so as not to produce an exchange coupling magnetic field between the center of the first antiferromagnetic layer and the pinned magnetic layer. Therefore, a nonmagnetic metal layer having the same composition as the first antiferromagnetic layer is not or thinly formed in the space. Thus, a sensing current can be prevented from shunting to the central portion of the first antiferromagnetic layer, thereby improving the reproduction output and achieving a narrower gap. Furthermore, the first antiferromagnetic layer is not or thinly formed at the center of the element to avoid a magnetic damage phenomenon that the direction of an exchange coupling magnetic field between the pinned magnetic layer and the first antiferromagnetic layer is reversed by electrostatic discharge at the center of the pinned magnetic layer. Therefore, a magnetic detecting element having excellent reproducing characteristics can be manufactured in a severe environment in which the element is miniaturized, and increased in density.

In the present invention, the multilayer film comprises a free magnetic layer, a nonmagnetic material layer, a pinned magnetic layer and a first antiferromagnetic layer, which are laminated in that order from below, and the magnetization control layer comprises a second antiferromagnetic layer provided below the free magnetic layer and having a predetermined space at its center in the track width direction so that the magnetization control layer is in contact with the bottoms of both side portions of the free magnetic layer, the first antiferromagnetic layer being in contact with the tops of both side portions of the first magnetic layer constituting the pinned magnetic layer. The magnetization control layer may comprise permanent-magnet layers in direct contact with both side portions of the free magnetic layer.

In this case, assuming that the minimum dimension of the space provided in the first antiferromagnetic layer in the track width direction is WP, and the minimum dimension of the space provided in the magnetization control layer in the track width direction is Wf1, Wf1 is preferably the same as or smaller than WP. When Wf1 is larger than WP, a region of the free magnetic layer, which is represented by Wf1−WP, functions as a sensitive region for detecting an external magnetic field. In this region, the distance between upper and lower shield layers provided above and below the free magnetic layer is increased to cause the problem of widening the pulse width (PW50) of a reproduced waveform and deteriorating resolution. Therefore, Wf1 is preferably the same as or smaller than WP.

In the present invention, the multilayer film comprises a free magnetic layer, a nonmagnetic material layer, a pinned magnetic layer and a first antiferromagnetic layer, which are laminated in that order from below, the magnetization control layer comprises permanent-magnet layers provided on both sides of at least the free magnetic layer and the nonmagnetic layer in the track width direction, the pinned magnetic layer is provided on the nonmagnetic material layer to partially or entirely extend from the nonmagnetic layer to the permanent-magnet layers, and the first antiferromagnetic layer is provided in contact with the tops of both side portions of the first magnetic layer constituting the pinned magnetic layer.

In this structure, preferably, both side regions of the element comprising the respective permanent-magnet layers are disposed on both sides of at least the free magnetic layer and the nonmagnetic material layer in the track width direction, and the pinned magnetic layer is provided on the nonmagnetic material layer to extend from the nonmagnetic material layer to both side regions of the element. Alternatively, preferably, both side regions of the element comprising the respective permanent-magnet layers are disposed on both sides of at least the free magnetic layer, the nonmagnetic material layer and the second magnetic layer and nonmagnetic intermediate layer constituting the pinned magnetic layer in the track width direction, and the first magnetic layer constituting the pinned magnetic layer is provided on the nonmagnetic intermediate layer to extend from the nonmagnetic intermediate layer to both side regions of the element.

In this case, assuming that the minimum dimension of the space provided in the first antiferromagnetic layer in the track width direction is WP, and the minimum width dimension of the free magnetic layer in the track width direction is Wf2, Wf2 is preferably the same as or smaller than WP. The reason for this is as described above.

In the present invention, the multilayer film comprises a first antiferromagnetic layer, a pinned magnetic layer, a nonmagnetic material layer, and a free magnetic layer, which are laminated in that order from below, and the first antiferromagnetic layer has a predetermined space at its center in the track width direction so that the first antiferromagnetic layer is provided in contact with the bottoms of both side portions of the first magnetic layer in the track width direction. Also, the substrate provided below the first antiferromagnetic layer preferably has recessed portions provided on both sides in the track width direction to have a predetermined depth, and the first antiferromagnetic layer is disposed in the recessed portions with the predetermined space in the track width direction.

In this structure, the magnetization control layer comprises a second antiferromagnetic layer provided on the free magnetic layer to have a predetermined space in the track width direction so that the second antiferromagnetic layer is in contact with both side portions of the free magnetic layer. In this case, assuming that the minimum dimension of the space provided in the first antiferromagnetic layer in the track width direction is WP, and the minimum dimension of the space provided in the magnetization control layer in the track width direction is Wf3, Wf3 is preferably the same as or smaller than WP.

The magnetization control layer may comprise permanent-magnet layers provided on both sides of the free magnetic layer in the track width direction so that the bottoms of the permanent-magnet layers are positioned above at least the pinned magnetic layer. In this case, assuming that the minimum dimension of the space provided in the first antiferromagnetic layer in the track width direction is WP, and the minimum width dimension of the free magnetic layer in the track width direction is Wf4, Wf4 is preferably the same as or smaller than WP.

Also, WP is preferably 0.2 μm or less.

In the present invention, electrode layers are preferably provided in both side portions of the magnetic detecting element in such a manner that the direction of a sensing current magnetic field formed by a sensing current flowing from the electrode layers to the multilayer film coincides with the direction of a synthetic magnetic moment of the magnetic layers constituting the pinned magnetic layer, for more strongly pinning the magnetization of the pinned magnetic layer.

In the present invention, a nonmagnetic metal layer having the same composition as that of the first antiferromagnetic layer is preferably provided in the space to make contact with the first magnetic layer, the nonmagnetic metal layer provided in the space being a disordered crystal structure layer thinner than the first antiferromagnetic layer.

In a magnetic field heat treatment of the first antiferromagnetic layer, at least a portion of the disordered lattice is transformed into an ordered lattice to exhibit antiferromagnetism. However, in the nonmagnetic metal layer disposed in the space and having the same composition as that of the first antiferromagnetic layer, the disordered lattice cannot be transformed into the ordered lattice even by a magnetic field heat treatment because the nonmagnetic metal layer is very thin, and thus the nonmagnetic metal layer remains as the disordered crystal structure layer not exhibiting antiferromagnetism.

In the present invention, the crystal of the first magnetic layer is preferably epitaxial or heteroepitaxial with the crystal of the nonmagnetic metal layer, and the end surface of the pinned magnetic layer near the surface facing the recording medium is preferably open.

In the pinned magnetic layer, magnetization pinning of the central portion facing the nonmagnetic metal layer in the thickness direction is also preferably strengthened by uniaxial anisotropy of the pinned magnetic layer.

The factors which determine the magnetic anisotropic magnetic field of a ferromagnetic film include crystal magnetic anisotropy, induced magnetic anisotropy, and magnetoelastic effect. In a film comprising a randomly oriented polycrystal, the crystal magnetic anisotropy among these factors cannot be easily given a uniaxial property. On the other hand, the induced magnetic anisotropy can be given a uniaxial property by applying a magnetic field in one direction during film deposition or heat treatment, and the magnetoelastic effect can be given a uniaxial property by applying uniaxial stress.

In the present invention, of the induced magnetic anisotropy and magnetoelastic effect which determine uniaxial anisotropy for pinning the magnetization of the central portion of the pinned magnetic layer, the magnetoelastic effect is taken into consideration.

The magnetoelastic effect is dominated by magnetoelastic energy. The magnetoelastic energy is defined by the stress applied to the pinned magnetic layer and the magnetostrictive constant of the central portion of the pinned magnetic layer.

In the present invention, the end surface of the pinned magnetic layer near the surface facing the recording medium is open, and thus the symmetry of the stress applied from a gap film or the like in a two-dimensional and isotropic manner is broken to apply uniaxial tensile stress to the pinned magnetic layer in the element height direction (height direction). Therefore, the magnetization direction of the pinned magnetic layer can be properly oriented in a direction by the magnetoelastic effect.

In the present invention, the magnetostrictive constant of the central portion of the pinned magnetic layer is increased to increase the magnetoelastic energy, thereby increasing the uniaxial anisotropy of the central portion of the pinned magnetic layer. In the central portion of the pinned magnetic layer having the increased uniaxial anisotropy, the magnetization of the central portion of the pinned magnetic layer is easily strongly pinned in a predetermined direction, thereby increasing the output of the magnetic detecting element and improving stability and symmetry of the output.

Specifically, the first magnetic layer of the plurality of magnetic layers constituting the pinned magnetic layer is epitaxially or heteroepitaxially joined with the nonmagnetic metal layer made of a PtMn alloy or X—Mn (wherein X is at least one element of Pt, Pd, Ir, Rh, Ru, Os, Ni, and Fe) alloy to produce a distortion in the crystal structure of the central portion of the first magnetic layer, thereby increasing the magnetostrictive constant $\lambda$ of the central portion of the first magnetic layer.

When the nonmagnetic metal layer is made of a PtMn alloy or X—Mn (wherein X is at least one element of Pt, Pd, Ir, Rh, Ru, Os, Ni, and Fe) alloy, in the vicinity of near the interface with the central portion of the first magnetic layer or over the entire region of the nonmagnetic metal layer, the nonmagnetic metal layer assumes a face-centered cubic lattice (fcc) structure in which an equivalent crystal plane represented by a {111} plane is preferentially oriented in parallel with the interface.

The thickness of the nonmagnetic metal layer is preferably 5 Å to 50 Å.

When the nonmagnetic metal layer made of a PtMn alloy or X—Mn (wherein X is at least one element of Pt, Pd, Ir, Rh, Ru, Os, Ni, and Fe) alloy has a thickness in this range, the nonmagnetic metal layer maintains the face-centered cubic crystal structure (fcc) which is given at the time of deposition. When the thickness of the nonmagnetic metal layer becomes 50 Å or more, the crystal structure of the nonmagnetic metal layer is undesirably transformed into a CuAuI-type ordered face-centered tetragonal structure (fct) by heating to about 250° C. or more, like the first antiferromagnetic layer disposed on both sides of the nonmagnetic metal layer. However, even when the thickness of the nonmagnetic metal layer is 50 Å or more, the nonmagnetic metal layer maintains the face-centered cubic (fcc) crystal structure given at the time of deposition unless it is heated to about 250° C. or more.

The Pt content of the PtMn alloy or the content of X element in the X—Mn alloy is preferably 55 atomic percent to 95 atomic percent.

In the vicinity of the interface with the nonmagnetic metal layer or over the entire region of the central portion of the first magnetic layer of the pinned magnetic layer, at least the central portion facing the nonmagnetic metal layer in the thickness direction assumes a face-centered cubic lattice (fcc) structure in which an equivalent crystal plane represented by a {111} plane is preferentially oriented in parallel with the interface.

In the present invention, as described above, the nonmagnetic metal layer assumes the fcc structure in which an equivalent crystal plane represented by a {111} plane is preferentially oriented in parallel with the interface.

Therefore, when at least the central portion of the first magnetic layer facing the nonmagnetic metal layer in the thickness direction assumes the fcc structure in which an equivalent crystal plane represented by a {111} plane is preferentially oriented in parallel with the interface, the constituent atoms of the central portion of the first magnetic layer easily overlap with the constituent atoms of the nonmagnetic metal layer.

However, a predetermined difference or more occurs between the distance between nearest neighbor atoms in the {111} plane of the central portion of the first magnetic layer and the distance between nearest neighbor atoms in the {111} plane of the nonmagnetic metal layer, and thus a distortion occurs in each of the crystal structures of the central portion of the first magnetic layer and the nonmagnetic metal layer, while the constituent atoms of the central portion of the first magnetic layer overlap with the constituent atoms of the nonmagnetic metal layer. Namely, the magnetostrictive constant $\lambda$ can be increased by producing a distortion in the crystal structure of the central portion of the first magnetic layer.

For example, when the first magnetic layer of the pinned magnetic layer is made of Co or $Co_xFe_y$ ($y \leq 20$, $x+y=100$), the central portion of the first magnetic layer can be formed in the fcc structure in which an equivalent crystal plane represented by the {111} plane is preferentially oriented in parallel with the interface.

Alternatively, in the vicinity of the interface with the nonmagnetic metal layer or over the entire region of the central portion of the first magnetic layer of the pinned magnetic layer, at least the central portion facing the nonmagnetic metal layer in the thickness direction preferably assumes a body-centered cubic lattice (bcc) structure in which an equivalent crystal plane represented by a {110} plane is preferentially oriented in parallel with the interface.

Even when the central portion of the first magnetic layer assumes the bcc structure in which an equivalent crystal plane represented by a {110} plane is preferentially oriented in parallel with the interface, the constituent atoms of the central portion of the first magnetic layer easily overlap with the constituent atoms of the nonmagnetic metal layer.

In this case, a predetermined difference or more occurs between the distance between nearest neighbor atoms in the {110} plane of the central portion of the first magnetic layer and the distance between nearest neighbor atoms in the {111} plane of the nonmagnetic metal layer, and thus a distortion occurs in each of the crystal structures of the central portion of the first magnetic layer and the nonmagnetic metal layer, while the constituent atoms of the central portion of the first magnetic layer overlap with the constituent atoms of the nonmagnetic metal layer. Namely, the magnetostrictive constant $\lambda$ can be increased by producing a distortion in the crystal structure of the central portion of the first magnetic layer.

For example, when the first magnetic layer of the pinned magnetic layer is made of $Co_xFe_y$ ($y \geq 20$, $x+y=100$), the central portion of the first magnetic layer can be formed in the bcc structure in which an equivalent crystal plane represented by the {110} plane is preferentially oriented in parallel with the interface. With a composition near y=50, the $Co_xFe_y$ ($y \geq 20$, $x+y=100$) assuming the bcc structure has a larger magnetostrictive constant than that of the $Co_xFe_y$ ($y \leq 20$, $x+y=100$) assuming the fcc structure, and can thus exhibit a larger magnetoelastic effect. Also, the $Co_xFe_y$ ($y \geq 20$, $x+y=100$) assuming the bcc structure has large coercive force, and thus the magnetization of the central portion of the pinned magnetic layer can be strongly pinned.

In the present invention, in the vicinity of the interface between the nonmagnetic metal layer and the first magnetic layer of the pinned magnetic layer, at least the central portion facing the nonmagnetic metal layer in the thickness direction preferably assumes a face-centered cubic lattice (fcc) structure in which an equivalent crystal plane represented by a {111} plane is preferentially oriented in parallel with the interface. Also, in the vicinity of the interface with the nonmagnetic intermediate layer, the central portion assumes a body-centered cubic lattice (bcc) structure in which an equivalent crystal plane represented by a {110} plane is preferentially oriented in parallel with the interface.

When the central portion of the first magnetic layer assumes the bcc structure near the interface with the nonmagnetic intermediate layer, the magnetostrictive constant $\lambda$ can be increased to exhibit the large magnetoelastic effect. On the other hand, when the central portion of the first magnetic layer assumes the fcc structure near the interface with the nonmagnetic metal layer, the central portions of the pinned magnetic layer, the nonmagnetic material layer and the free magnetic layer have constant crystal orientation, thereby increasing the rate of magnetoresistance change (MR ratio).

For example, when the first magnetic layer of the pinned magnetic layer has a composition comprising Co or $Co_xFe_y$ ($y \leq 20$, $x+y=100$) near the interface with the nonmagnetic metal layer, and the first magnetic layer of the pinned magnetic layer has a composition comprising $Co_xFe_y$ ($y \geq 20$, $x+y=100$) near the interface with the nonmagnetic intermediate layer, the first magnetic layer can be formed in the fcc structure in which an equivalent crystal plane represented by the {111} plane is preferentially oriented in parallel with the interface with the nonmagnetic metal layer near the interface, while the first magnetic layer can be formed in the bcc structure in which an equivalent crystal plane represented by the {110} plane is preferentially oriented in parallel with the interface with the nonmagnetic intermediate layer near the interface.

Also, when the composition near the interface with the nonmagnetic intermediate layer comprises $Co_xFe_y$ ($y \geqq 20$, $x+y=100$), the RKKY interaction between the first magnetic layer and the other magnetic layer through the nonmagnetic intermediate layer is desirably increased.

The first magnetic layer of the pinned magnetic layer may have a Fe concentration gradually increasing in the direction from the interface with the nonmagnetic metal layer to the interface with the nonmagnetic intermediate layer.

In the present invention, the difference between the distance of nearest neighbor atoms of the nonmagnetic metal layer and that of the central portion of the first magnetic layer of the pinned magnetic layer in the planar direction parallel to the interface is divided by the distance between nearest neighbor atoms of the first magnetic layer to obtain a value, and the value is preferably 0.05 to 0.20 for producing a distortion in the crystal structure of each of the nonmagnetic metal layer and at least the central portion of the first magnetic layer facing the nonmagnetic metal layer in the thickness direction while the constituent atoms of the nonmagnetic metal layer overlapping with the constituent atoms of at least the central portion of the first magnetic layer.

The first magnetic layer is preferably made of a magnetic material having a positive magnetostrictive constant.

When the first magnetic layer is made of a magnetic material having a positive magnetostrictive constant, the easy magnetization axis of the first magnetic layer becomes parallel to the rearward direction (height direction) of the magnetic detecting element, and the magnetization direction of the first magnetic layer is pinned in parallel or antiparallel with the height direction.

The electrode layers made of Cr, α-Ta or Rh are preferably provided on both side portions of the magnetic detecting element in the track width direction because the compressive stress applied to the pinned magnetic layer can be increased.

A method for manufacturing a magnetic detecting element comprising a multilayer film including a free magnetic layer, a nonmagnetic material layer, a pinned magnetic layer and a first antiferromagnetic layer, which are laminated on a substrate in that order from below, and a magnetization control layer for controlling magnetization of the free magnetic layer comprises the steps of:

(a) forming a second magnetic layer extending in the track width direction and a first magnetic layer on the second magnetic layer with a nonmagnetic intermediate layer provided therebetween so that the first magnetic layer faces the second magnetic layer in the thickness direction to form the pinned magnetic layer, forming, on the first magnetic layer, a nonmagnetic metal layer comprising a disordered crystal structure layer having the same composition as that of the first antiferromagnetic layer and thinner than the first antiferromagnetic layer, and forming a nonmagnetic layer on the nonmagnetic metal layer;

(b) removing the nonmagnetic layer, and forming an upper antiferromagnetic layer thicker than the nonmagnetic metal layer on both sides of the nonmagnetic metal layer to form the first antiferromagnetic layer comprising the nonmagnetic metal layer and the upper antiferromagnetic layer; and (c) performing annealing in a magnetic field to produce exchange coupling magnetic fields between the first antiferromagnetic layer and both side portions of the first magnetic layer, for pinning the magnetizations of the first and second magnetic layers in an antiparallel state.

In the present invention, instead of the step (b), the method preferably comprises the steps of:

(d) removing the nonmagnetic layer, and then forming an upper antiferromagnetic layer thicker than the nonmagnetic metal layer on the nonmagnetic metal layer having the same composition as that of the first antiferromagnetic layer to form the first antiferromagnetic layer comprising the nonmagnetic metal layer and the upper antiferromagnetic layer; and (e) providing a mask layer having a predetermined space in the track width direction on the first antiferromagnetic layer, and then removing the first antiferromagnetic layer from a portion not covered with the mask layer to form a predetermined space in the track width direction, leaving the first antiferromagnetic layer at least on both side portions of the first magnetic layer.

In the step (e), at least a portion of the nonmagnetic metal layer may be left in the space formed by removing the first antiferromagnetic layer from the portion not covered with the mask layer.

The nonmagnetic metal layer having the same composition as that of the antiferromagnetic layer is preferably formed to a thickness smaller than 50 Å.

A method for manufacturing a magnetic detecting element comprising a multilayer film including a first antiferromagnetic layer, a pinned magnetic layer, a nonmagnetic material layer, and a free magnetic layer, which are laminated on a substrate in that order from below, and a magnetization control layer for controlling magnetization of the free magnetic layer comprises the steps of:

(f) providing the first antiferromagnetic layer on both side portions of the substrate in the track width direction;

(g) forming a first magnetic layer extending from the first antiferromagnetic layer to the substrate exposed from the first antiferromagnetic layer, and forming a second magnetic layer on the first magnetic layer with a nonmagnetic metal layer provided therebetween so that the second magnetic layer faces the first magnetic layer in the thickness direction to form a pinned magnetic layer, and forming the nonmagnetic material layer and the free magnetic layer on the pinned magnetic layer; and (h) performing annealing in a magnetic field to produce exchange coupling magnetic fields between the first antiferromagnetic layer and both side portions of the first magnetic layer, for pinning the magnetizations of the first and second magnetic layers in an antiparallel state.

In the present invention, instead of the steps (f) and (g), the method preferably comprises the steps of:

(i) providing recesses each having a predetermined depth on both sides of the substrate in the track width direction;

(j) forming the first antiferromagnetic layer in the recesses, and further forming a nonmagnetic layer on the first antiferromagnetic layer; and (k) removing the nonmagnetic layer, and then forming a nonmagnetic metal layer as a portion of the first antiferromagnetic layer on the first antiferromagnetic layer and on the substrate exposed from the antiferromagnetic layer, the nonmagnetic metal layer having the same composition as that of the first antiferromagnetic layer, a smaller thickness that that of the first antiferromagnetic layer, and a disordered crystal structure, further forming the pinned magnetic layer on the first antiferromagnetic layer and the nonmagnetic metal layer, the pinned magnetic layer comprising a first magnetic layer extending in the track width direction, and a second magnetic layer facing the top of the first magnetic layer with a nonmagnetic intermediate layer provided therebetween in the thickness direction, and then forming the nonmagnetic material layer and the free magnetic layer on the pinned magnetic layer.

The nonmagnetic metal layer is preferably formed to a thickness smaller than 50 Å.

In the steps (a) to (e), the first antiferromagnetic layer can be formed in a predetermined shape on the pinned magnetic layer, and exchange coupling magnetic fields of a predetermined magnitude can be produced between the first antiferromagnetic layer and both side portions of the first magnetic layer. In the steps (f) to (k), the first antiferromagnetic layer can be formed in a predetermined shape below the pinned magnetic layer, and exchange coupling magnetic fields of a predetermined magnitude can be produced between the first antiferromagnetic layer and both side portions of the first magnetic layer.

In providing the first antiferromagnetic layer above or below the pinned magnetic layer, particularly in providing the first antiferromagnetic layer below the pinned magnetic layer, the pinned magnetic layer and the first antiferromagnetic layer are not simply laminated. In order to produce exchange magnetic fields of a predetermined magnitude between the first antiferromagnetic layer and both side portions of the pinned magnetic layer in the track width direction, a technique is required for laminating the pinned magnetic layer and the first antiferromagnetic layer.

In the steps (a) to (d) or (e) to (h), the pinned magnetic layer can be formed in a structure comprising the first and second magnetic layers, and the nonmagnetic layer interposed between both magnetic layers, and the predetermined space can be provided in the first antiferromagnetic layer in the track width direction to produce the magnetic detecting element capable of producing exchange coupling magnetic fields only between the first antiferromagnetic layer and both side portions of the first magnetic layer.

When the first antiferromagnetic layer is formed above the pinned magnetic layer, and a permanent-magnet layer is formed as the magnetization control layer for the free magnetic layer, the pinned magnetic layer and the first antiferromagnetic layer may be simply continuously deposited to facilitate the manufacturing process.

BRIEF DESCRIPTION OF THE DRAWINGS

FIG. 48 is a drawing showing a step for manufacturing the magnetic detecting element shown in FIG. 12;

FIG. 49 is a drawing showing a step performed after the step shown in FIG. 48;

FIG. 65 is a partial sectional view of a magnetic detecting element transcribed from FIG. 5 of Japanese Unexamined Patent Application Publication No. 8-7325.

DESCRIPTION OF THE PREFERRED EMBODIMENTS

Figure 1:
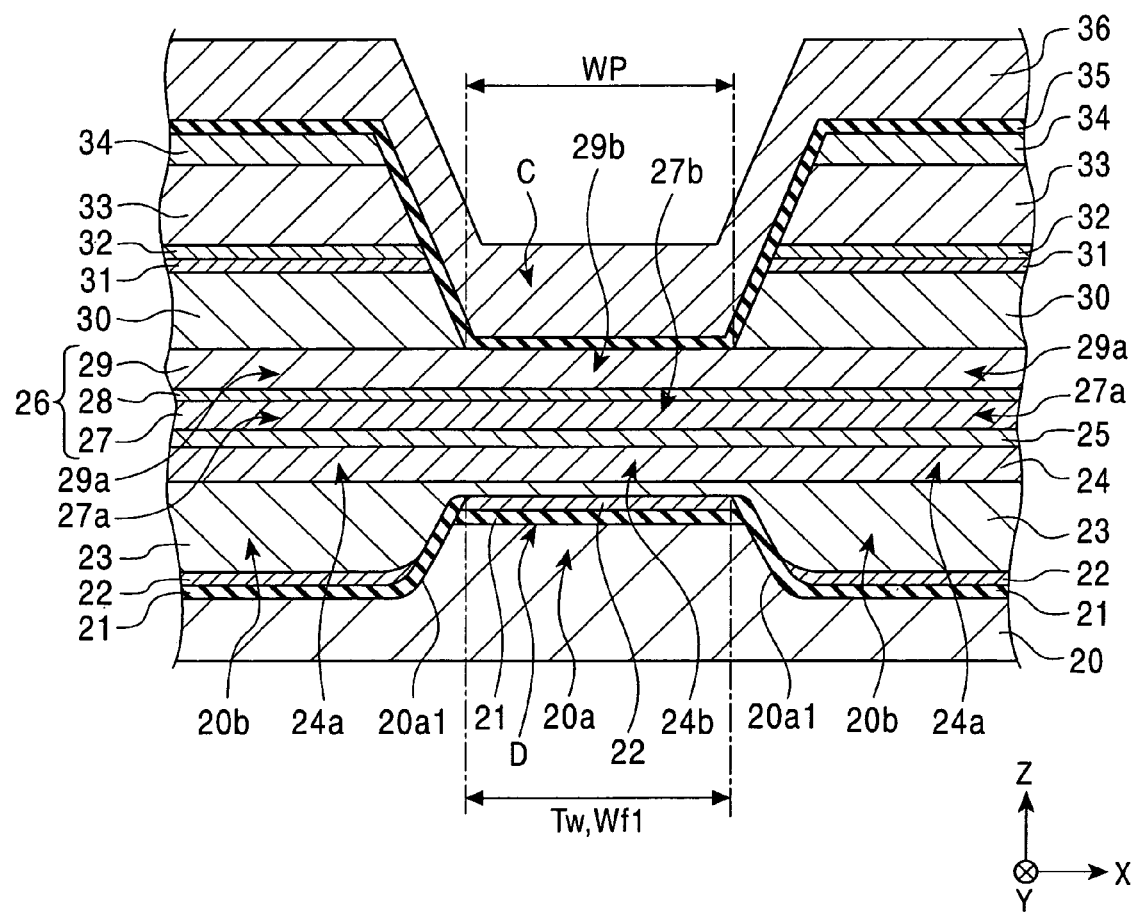
FIG. 1 is a partial sectional view of the structure of a magnetic detecting element according to an embodiment of the present invention, as viewed from a surface facing a recording medium.

FIG. 1 a partial sectional view of the structure of a magnetic detecting element (spin valve thin film element) according to the present invention, as viewed from a surface facing a recording medium. The magnetic detecting element shown in FIG. 1 is a type in which a free magnetic layer 24 is formed below a first antiferromagnetic layer 30.

In FIG. 1, reference numeral 20 denotes a lower shield layer (substrate) made of a magnetic material. The lower shield layer 20 is made of a NiFe alloy, sendust, or the like. As shown in FIG. 1, the lower shield layer 20 has a projection 20a provided at its center in the track width direction (the X direction shown in the drawing) to project in the thickness direction (the Z direction shown in the drawing), and recesses 20b provided on both sides of the projection 20a in the track width direction.

As shown in FIG. 1, a lower gap layer 21 made of an insulating material such as $Al_2O_3$ or the like is formed on the top of the projection 20a of the lower shield layer 20. The lower gap layer 21 is also formed on both side ends 20a1 of the projection 20a in the track width direction and on the bottoms of the recesses 20b.

As shown in FIG. 1, a seed layer 22 made of a NiFe alloy, a NiFeCr alloy or Cr is formed on the lower gap layer 21 formed on the bottoms of the recesses 20b and the projection 20a of the lower shield layer 20.

As shown in FIG. 1, a second antiferromagnetic layer 23 is formed on the seed layer 22. The recesses 20b formed in the lower shield layer 20 is mainly filled with the second antiferromagnetic layer 23. The second antiferromagnetic layer 23 is made of an antiferromagnetic material, for example, such as a PtMn alloy or the like.

A nonmagnetic metal layer made of a material having the same composition as that of the second antiferromagnetic layer 23 is also formed on the seed layer 22 formed on the projection 20a of the lower shield layer 20. However, the nonmagnetic metal layer is thinner than the second antiferromagnetic layer 23 formed in the recesses 20b of the lower shield layer 20. The nonmagnetic metal layer formed on the projection 20a of the lower shield layer 20 and having the same composition as that of the second antiferromagnetic layer 23 preferably has a thickness smaller than 50 Å. The nonmagnetic metal layer has a disordered crystal structure, and an exchange coupling magnetic field is not produced between the nonmagnetic metal layer and the free magnetic layer 24, thereby avoiding the magnetization of the central portion 24b of the free magnetic layer 24 from being pinned by the exchange coupling magnetic field. Namely, the nonmagnetic metal layer is a disordered crystal structure layer.

As shown in FIG. 1, the free magnetic layer 24 is formed on the second antiferromagnetic layer 23. The free magnetic layer 24 is made of a magnetic material such as a NiFe alloy, a CoFe alloy, or the like. In the magnetic detecting element shown in FIG. 1, the free magnetic layer 24 has a single-layer structure. However, the free magnetic layer 24 may have a laminated structure comprising a plurality of magnetic layers, or a synthetic ferrimagnetic structure comprising two magnetic layers and a nonmagnetic layer interposed therebetween.

In the embodiment shown in FIG. 1, magnetizations of both side portions 24a of the free magnetic layer 24 in the track width direction (the X direction) are pinned in the X direction by the exchange coupling magnetic fields produced between both sides potions 24a and the second antiferromagnetic thick layer 23 formed in contact with the bottoms thereof. On the other hand, in the central portion 24b of the free magnetic layer 24 in the track width direction, the exchange coupling magnetic field is not produced between the central portion 24b and the second antiferromagnetic layer 23 because the nonmagnetic metal thin layer having the same composition as that of the second antiferromagnetic layer 23 and the disordered crystal structure is formed below the central portion 24b. Therefore, unlike in both side portions 24a, the magnetization of the central portion 24b of the free magnetic layer 24 is not strongly pinned. The magnetization of the central portion 24b of the free magnetic layer 24 is weakly put into a single domain state to an extent which permits a change of magnetization with an external magnetic field entering in the Y direction shown in the drawing.

Furthermore, a nonmagnetic material layer 25 is formed on the free magnetic layer 24. The nonmagnetic material layer 25 prevents magnetic coupling between a pinned magnetic layer 26 and the free magnetic layer 24, and the sensing current mainly flows through the nonmagnetic material layer 25. The nonmagnetic material layer 25 is preferably made of a nonmagnetic material having conductivity, such as Cu, Cr, Au, Ag, or the like, particularly preferably made of Cu.

The pinned magnetic layer 26 is formed on the nonmagnetic material layer 25. In the embodiment shown in FIG. 1, the pinned magnetic layer 26 has a synthetic ferrimagnetic structure. The pinned magnetic layer 26 has a three-layer structure comprising a first magnetic layer 29 in contact with the first antiferromagnetic layer 30, a second magnetic layer 27 facing the first magnetic layer 29 in the thickness direction (the Z direction), and a nonmagnetic intermediate layer 28 interposed between the first and second magnetic layer 29 and 27.

Each of the magnetic layers 27 and 29 is made of a magnetic material, for example, a NiFe alloy, Co, a CoNiFe alloy, a CoFe alloy, a CoNi alloy, or the like. For example, the first and second magnetic layers 29 and 27 are made of the same material. Each of the magnetic layers 29 and 27 may have a single-layer structure or laminated structure of magnetic layers. Preferred forms of the magnetic layers 27 and 29 will be described in detail below.

The nonmagnetic intermediate layer 28 is made of a nonmagnetic material, for example, one of Ru, Rh, Ir, Cr, Re, and Cu, or an alloy of at least two of these elements. Particularly, the nonmagnetic intermediate layer 28 is preferably made of Ru.

In the embodiment shown in FIG. 1, the first antiferromagnetic layer 30 is formed on both side portions 29a of the first magnetic layer 29 in the track width direction (the X direction shown in the drawing). The first antiferromagnetic layer 30 is not formed on the central portion 29b of the first magnetic layer 29 to form a predetermined space C on the central portion 29b. The first antiferromagnetic layer 30 is preferably made of a PtMn alloy, an X—Mn (wherein X is at least one element of Pd, Ir, Rh, Ru, Os, Ni, and Fe) alloy, or a Pt—Mn—X' (wherein X' is at least one element of Pd, Ir, Rh, Ru, Au, Ag, Os, Cr, Ni, Ar, Ne, Xe, and Kr) alloy. However, the first antiferromagnetic layer 30 may be made of an antiferromagnetic material having a lower blocking temperature than that of the PtMn alloy, such as an IrMn alloy or the like.

In a heat treatment in a magnetic field, exchange coupling magnetic fields are produced between the first antiferromagnetic layer 30 and both side portions 29a of the first magnetic layer 29 to pin the magnetization of the first magnetic layer 29 in the Y direction. Therefore, in a state after the magnetic field heat treatment, at least a portion of the first antiferromagnetic layer 30 is transformed from a disordered lattice to an ordered lattice.

In the embodiment shown in FIG. 1, the pinned magnetic layer 26 has the synthetic ferrimagnetic structure comprising the two magnetic layers 27 and 29 and the nonmagnetic intermediate layer 28 interposed therebetween, and thus an antiparallel coupling magnetic field is applied between the first and second magnetic layers 27 and 29 due to a RKKY interaction. Therefore, magnetizations of both side portions 27a of the second magnetic layer 27 are pinned in a direction opposite to the Y direction. On the other hand, an antiparallel coupling magnetic field is also produced due to the RKKY interaction between the central portions 29b and 27b of the first and second magnetic layers 29 and 27, and the magnetizations of the central portions 29b and 27b of the first and second magnetic layers 29 and 27 are pinned in an antiparallel state following the magnetization directions of both side portions 29a and 27a.

As shown in FIG. 1, a stopper layer 31 made of Cr or the like is formed on the first antiferromagnetic layer 30, and a protective layer 32 made of Ta or the like is formed on the stopper layer 31. Furthermore, an electrode layer 33 made of a nonmagnetic conductive material such as Au, Pd, Cr, Rh, Ru, Ta, W, or the like is formed on the protective layer 32, and a protective layer 34 made of Ta or the like is formed on the electrode layer 33.

As shown in FIG. 1, an upper gap layer 35 made of an insulating material is formed on the protective layer 34 and on the first magnetic layer 29 of the pinned magnetic layer 26, which is exposed from the space C formed in the first antiferromagnetic layer 30. Also, an upper shield layer 36 made of a magnetic material is formed on the upper gap layer 35.

In the embodiment shown in FIG. 1, in the free magnetic layer 24 facing the projection 20a of the lower shield layer 20 in the thickness direction (the Z direction), the width dimension in the track width direction (the X direction) is a track width Tw. The track width Tw is a physical track width (Physical Read Track Width abbreviated to "track width RTw"). This applies to the description below.

The structural characteristics of the magnetic detecting element shown in FIG. 1 will be described below. In the embodiment shown in FIG. 1, the pinned magnetic layer 26 has the three-layer structure comprising the first magnetic layer 29 in contact with the first antiferromagnetic layer 30, the second magnetic layer 27 facing the first magnetic layer 29 in the thickness direction, and the nonmagnetic intermediate layer 28 interposed between the first and second magnetic layers 29 and 27. Since the antiparallel coupling magnetic field is produced due to the RKKY interaction between the first and second magnetic layers 29 and 27, the magnetizations of the first and second magnetic layers 29 and 27 are antiparallel to each other.

The first antiferromagnetic layer 30 is provided only on both side portions 29a of the first magnetic layer 29, not provided on the central portion 29b of the first magnetic layer 29. Therefore, the exchange coupling magnetic field is provided only between the first antiferromagnetic layer 30 and either side portion 29a of the magnetic layer 29, not produced between the first ferromagnetic layer 30 and the central portion 29b of the first magnetic layer 29. Therefore, the magnetizations of both side portions 29a and 27a of the first and second magnetic layers 29 and 27 are pinned in parallel with the height direction (the Y direction) while maintaining the antiparallel state due to the exchange coupling magnetic field and RKKY interaction.

On the other hand, it is recognized from the experiments described below that in the central portions 29b and 27b of the first and second magnetic layers 29 and 27 of the pinned magnetic layer 26, the magnetizations are pinned in parallel with the height direction (the Y direction) while maintaining the antiparallel state due to the RKKY interaction and the bias magnetic field through an exchange interaction in each magnetic layer. In the embodiment shown in FIG. 1, therefore, the magnetization of the pinned magnetic layer 26 can be properly pinned.

Namely, as shown in FIG. 1, the first antiferromagnetic layer 30 is provided on both sides portions of the pinned magnetic layer 26 in the track width direction, and thus exchange coupling magnetic fields are produced only in both side portions. However, the pinned magnetic layer 26 is formed in the synthetic ferrimagnetic structure for the structure of the first antiferromagnetic layer 30 so that the magnetization over the entire region of the pinned magnetic layer 26 can be appropriately pinned in the height direction.

In the magnetic detecting element having the structure shown in FIG. 1, the magnetization of the pinned magnetic layer 26 can be securely pinned, and the effects described below can be expected. First, the first antiferromagnetic layer 30 is not provided on the central portion 29b of the first magnetic layer 29, and thus the sensing current mainly flowing from the electrode layer 33 to the nonmagnetic material layer 25 little shunts to the first antiferromagnetic layer 30 until it reaches the nonmagnetic material layer 25, thereby decreasing a shunt loss and improving reproduction output.

Second, since the first antiferromagnetic layer 30 is not provided on the central portion 29b of the first magnetic layer 29, the distance between the shield layers 20 and 36 in the thickness direction (the Z direction) at its center of the element is decreased to permit so-called "gap narrowing". The central portion 24b of the free magnetic layer 24 is a region having reproduction sensitivity, and thus a decrease in the gap length at the center of the element can properly prevent a problem in which the pulse width (PW50) of a reproduction waveform is widened to deteriorate resolution. Therefore, a magnetic detecting element adaptable for a future higher recording density can be manufactured.

Furthermore, since the first antiferromagnetic layer 30 is not provided on the central portion 29b of the first magnetic layer 29, magnetic electrostatic damage (soft ESD) little occurs in the central portion of the pinned magnetic layer 26. The first antiferromagnetic layer is conventionally provided over the entire region of a pinned magnetic layer, and thus an exchange coupling magnetic field is weakened by the generation of heat at a temperature higher than the blocking temperature of the first antiferromagnetic layer to break the pinned magnetization state of the pinned magnetic layer, thereby deteriorating reproducing characteristics. However, when the first antiferromagnetic layer 30 is not provided on the central portion 29b of the first magnetic layer 29, as shown in FIG. 1, a temperature relationship between the blocking temperature of the first antiferromagnetic layer 30 and heat generation in the central portion of the pinned magnetic layer 26 need not be taken into consideration, and the occurrence of electrostatic damage can be prevented. Also, the electrodes layers 33 having low resistance are superposed on the first antiferromagnetic layer 30 in both side portions of the element to extend in the element height direction (the Y direction), and thus the current densities in both side portions are significantly lower than that in the central portion. Thus, little Joule's heat occurs in both side portions, and little electrostatic damage occurs in both side portions.

In the structure of the magnetic detecting element shown in FIG. 1, the magnetization of the pinned magnetic layer 26 can be properly pinned in the height direction, and an improvement in reproduction output, narrowing of the gap, and the suppression of electrostatic damage can also be realized. Therefore, a magnetic detecting element adaptable for a future higher recording density can be provided.

In the magnetic detecting element shown in FIG. 1, the recesses 20b provided in both side portions of the lower shield layer 20 are filled with the second antiferromagnetic layer 23, and thus the second antiferromagnetic layer 23 has a predetermined space D in the track width direction (the X direction). The minimum width dimension of the space D in the track width direction is Wf1 (the same as the track width Tw in the embodiment shown in FIG. 1).

The minimum dimension of the space C formed in the first antiferromagnetic layer 30 in the track width direction is WP.

In the embodiment shown in FIG. 1, the minimum width dimension Wf1 is the same as or smaller than the minimum dimension WP. When the minimum width dimension Wf1 is the same as or smaller than the minimum dimension WP, the central portion 24b of the free magnetic layer 24 is securely positioned in the narrowest gap (so-called gap length) between the shield layers 20 and 36 in the thickness direction to suppress widening of the reproduction pulse width (PW50) and deterioration of resolution. Since the central portion 24b of the free magnetic layer 24 has high reproducing sensitivity and substantially contributes to the magnetoresistive effect, the gap between the shield layers 20 and 36 provided above and below the central portion 24b of the free magnetic layer 24 must be decreased to prevent the entrance of an excessive external magnetic field into the central portion 24b.

The minimum dimension WP of the space in the first antiferromagnetic layer 30 is preferably 0.3 µm or less, and more preferably 0.2 µm or less. As a result of the experiments described below, it was found that by decreasing the minimum dimension WP, a unidirectional exchange bias magnetic field can be increased to further increase the reproduction output. This is because in the central portion of the element, the magnetizations of the first and second magnetic layers 29 and 27 can be more effectively pinned in an antiparallel state with decreases in the minimum dimension WP.

Next, the magnetic moment per unit area of each of the first and second magnetic layers 29 and 27 constituting the pinned magnetic layer 26 will be described.

When the synthetic magnetic moment (saturation magnetization Ms×thickness t) per unit area obtained by subtracting the magnetic moment per unit area of the first magnetic layer 29 from the magnetic moment per unit area of the second magnetic layer 27 is in the range of −6 (T·nm) to 2.6 (T·nm), in the central portion where the first antiferromagnetic layer 30 is not formed, the magnetization of the pinned magnetic layer 26 does not rotate or rotates by a rotational angle θ which can be suppressed to $\cos\theta \geq 0.8$ or less with a magnetic field in the track width direction.

The synthetic magnetic moment is more preferably 0 (T·nm) to 2.6 (T·nm) so that the spin flop magnetic field of the pinned magnetic layer 26 can be increased, and a margin for the magnetic field strength applied in the magnetic field annealing for controlling the magnetization of the pinned magnetic layer 26 can be widened. Therefore, the magnetizations of the first and second magnetic layers 29 and 27 of the pinned magnetic layer 26 can be appropriately pinned in antiparallel with each other in a direction parallel to the height direction.

The thickness difference obtained from subtracting the thickness of the first magnetic layer 29 from the thickness of the second magnetic layer 27 is preferably in the range of −30 Å to 30 Å. In this case, in the central portion of the element where the first antiferromagnetic layer 30 is not formed, the magnetization of the pinned magnetic layer 26 does not rotate or rotates by a rotational angle θ which can be suppressed to $\cos\theta \geq 0.8$ or less with a magnetic field in the track width direction. The thickness difference is more preferably in the range of 0 Å to 30 Å so that the spin flop magnetic field of the pinned magnetic layer 26 can be increased, and a margin for the magnetic field strength applied in the magnetic field annealing for controlling the magnetization of the pinned magnetic layer 26 can be widened.

In the embodiment shown in FIG. 1, the electrode layers 33 are provided on the first antiferromagnetic layer 30 so that the sensing current flowing from the electrode layers 33 to the multilayer film comprising the pinned magnetic layer 26, the nonmagnetic material layer 25 and the free magnetic layer 24 flows in parallel with (the X direction) the film plane of each layer. The direction of a sensing current magnetic field formed by the sensing current preferably coincides with the direction of the synthetic magnetic moment of the first and second magnetic layers 29 and 27 constituting the pinned magnetic layer 26 because the magnetization of the pinned magnetic layer 26 can be more strongly pinned.

Figure 13:
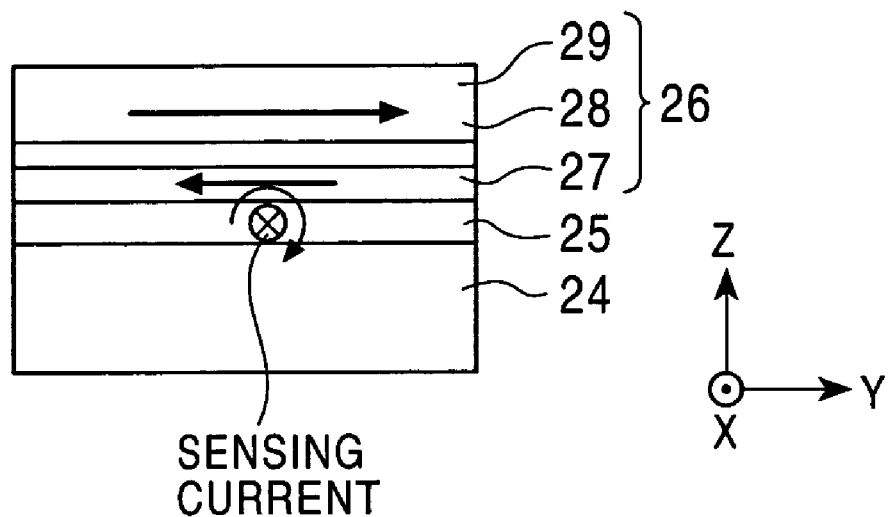
FIG. 13 is a partial sectional view of the structure of a magnetic detecting element according to an embodiment of the present invention taken along a plane parallel to the Y-Z plane, for illustrating a state in which the direction of a synthetic magnetic moment per unit area of a pinned magnetic layer coincides with the direction of a sensing current magnetic field.

FIG. 13 is a partial schematic view showing the pinned magnetic layer 26, the nonmagnetic material layer 25 and the free magnetic layer 24 shown in FIG. 1, taken along a direction parallel to the Y-Z plane. In FIG. 13, the magnetization of the first magnetic layer 29 is oriented in the rightward direction, and the magnetization of the second magnetic layer 27 is oriented in the leftward direction. In FIG. 13, for example, the first and second magnetic layers 29 and 27 are made of the same material, and the thickness of the first magnetic layer 29 is larger than that of the second magnetic layer 27. Therefore, the magnetic moment (saturation magnetization Ms×thickness t) per unit area of the first magnetic layer 29 is larger than that of the second magnetic layer 27, and thus the synthetic magnetic moment is oriented in the rightward direction in the drawing.

On the other hand, the sensing current flows in the vertical direction of the drawing, and the sensing current magnetic field produced by the sensing current is oriented in the rightward direction in the drawing near the pinned magnetic layer 26. Thus, the direction of the sensing current coincides with the direction of the synthetic magnetic moment.

Figure 14:
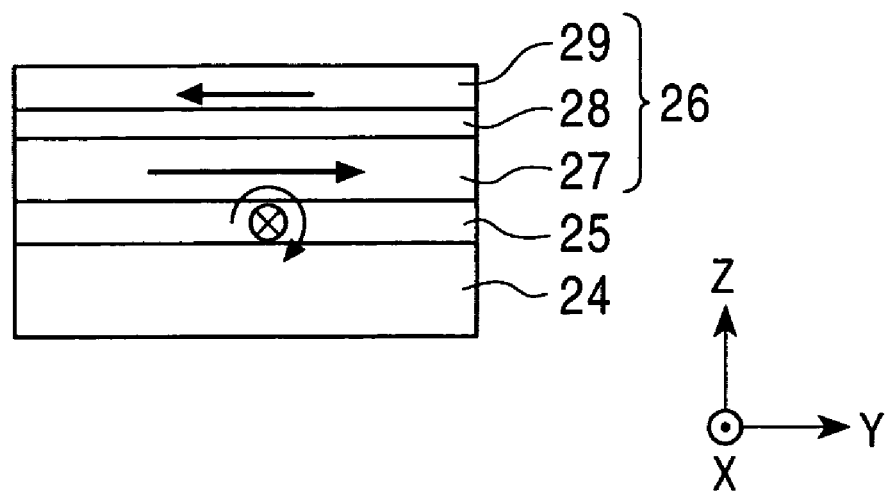
FIG. 14 is a partial sectional view of the structure of a magnetic detecting element according to an embodiment of the present invention taken along a plane parallel to the Y-Z plane, for illustrating a state in which the direction of a synthetic magnetic moment per unit area of a pinned magnetic layer coincides with the direction of a sensing current magnetic field.

Unlike in FIG. 13, in FIG. 14, the magnetic moment per unit area of the first magnetic layer 29 is smaller than that of the second magnetic layer 27. However, the magnetization directions of the first and second magnetic layers 29 and 27 are opposite to those in FIG. 13 so that the synthetic magnetic moment is oriented in the rightward direction in the drawing, which coincides with the rightward direction of the sensing current near the pinned magnetic layer 26.

In this way, the direction of the synthetic magnetic moment can be changed by changing the magnetization direction and the magnetic moment per unit area of each of the magnetic layers 27 and 29.

Figure 2:
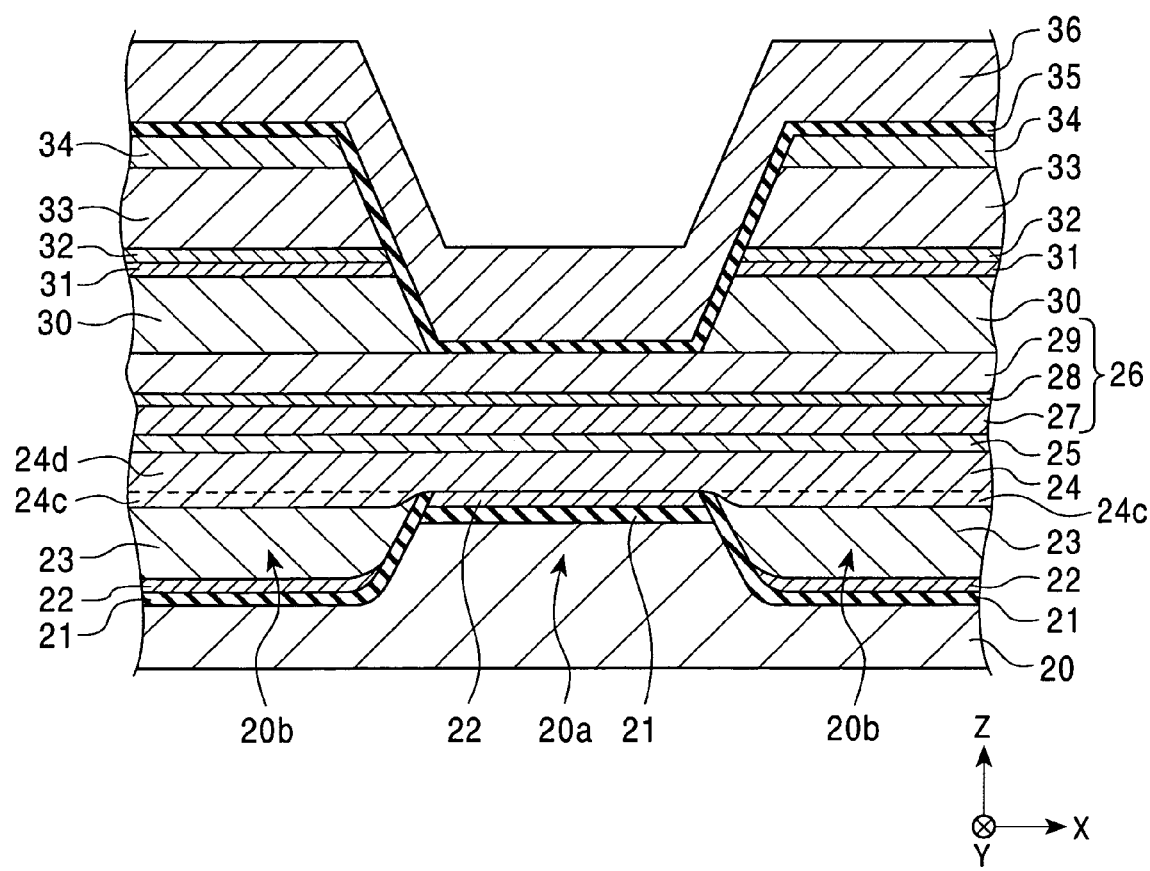
FIG. 2 is a partial sectional view of the structure of a magnetic detecting element according to another embodiment of the present invention, as viewed from a surface facing a recording medium.

FIG. 2 is a partial sectional view of the structure of a magnetic detecting element (spin valve thin film element)

according to the present invention, as viewed from a surface facing a recording medium. The magnetic detecting element shown in FIG. 2 is the same type as the magnetic detecting element shown in FIG. 1, in which a free magnetic layer 24 is formed below a first antiferromagnetic layer 30.

The structure of the magnetic detecting element shown in FIG. 2 is the same as the magnetic detecting element shown in FIG. 1 except the shapes of a second antiferromagnetic layer 23 and the free magnetic layer 24.

In FIG. 2, the recesses 20b formed in both side portions of a lower shield layer 20 in the track width direction (the X direction shown in the drawing) are filled with the second antiferromagnetic layer 23, and a lower layer 24c of the free magnetic layer 24 is also formed on the second antiferromagnetic layer to fill in the recesses 20b. In FIG. 2, an upper layer 24d of the free magnetic layer 24 is formed to extend from the lower layer 24c to a seed layer 22 formed on a projection 20a of the lower shield layer 20. The interface between the lower layer 24c and the upper layer 24d of the free magnetic layer 24 is difficult to determine, as shown by a dotted line, and the lower layer 24c and the upper layer 24d are integrally formed.

In the embodiment shown in FIG. 2, the recesses 20b of the lower shield layer 20 are filled with the second antiferromagnetic layer 23, and unlike in FIG. 1, a nonmagnetic metal thin layer having the same composition as that of the second antiferromagnetic layer 23 does not remain on the projection 20a of the lower shield layer 20.

The difference in the shape of each of the second antiferromagnetic layer 23 and the free magnetic layer 24 between FIGS. 1 and 2 is caused by a difference between the manufacturing processes. Particularly, the effect on an exchange coupling film comprising the pinned magnetic layer 26 and the first antiferromagnetic layer 30 is the same as in FIG. 1.

FIGS. 3 to 8 are partial sectional views of the structures of magnetic detecting elements (spin valve thin film elements) according to respective embodiments, as viewed from a surface facing a recording medium. Each of the magnetic detecting elements shown in FIGS. 3 to 8 is the same type as the magnetic detecting element shown in FIG. 1 in which a free magnetic layer 24 is formed below a first antiferromagnetic layer 30.

Although, in FIGS. 1 and 2, the second antiferromagnetic layer 23 is formed as the magnetization control layer for the free magnetic layer 24, in FIGS. 3 to 8, a permanent-magnet layer 41 is used for controlling the magnetization of the free magnetic layer 24. In FIGS. 3 to 8, layers denoted by the same reference numerals as in FIG. 1 are the same layers as in FIG. 1, and thus a description thereof is omitted.

Figure 3:
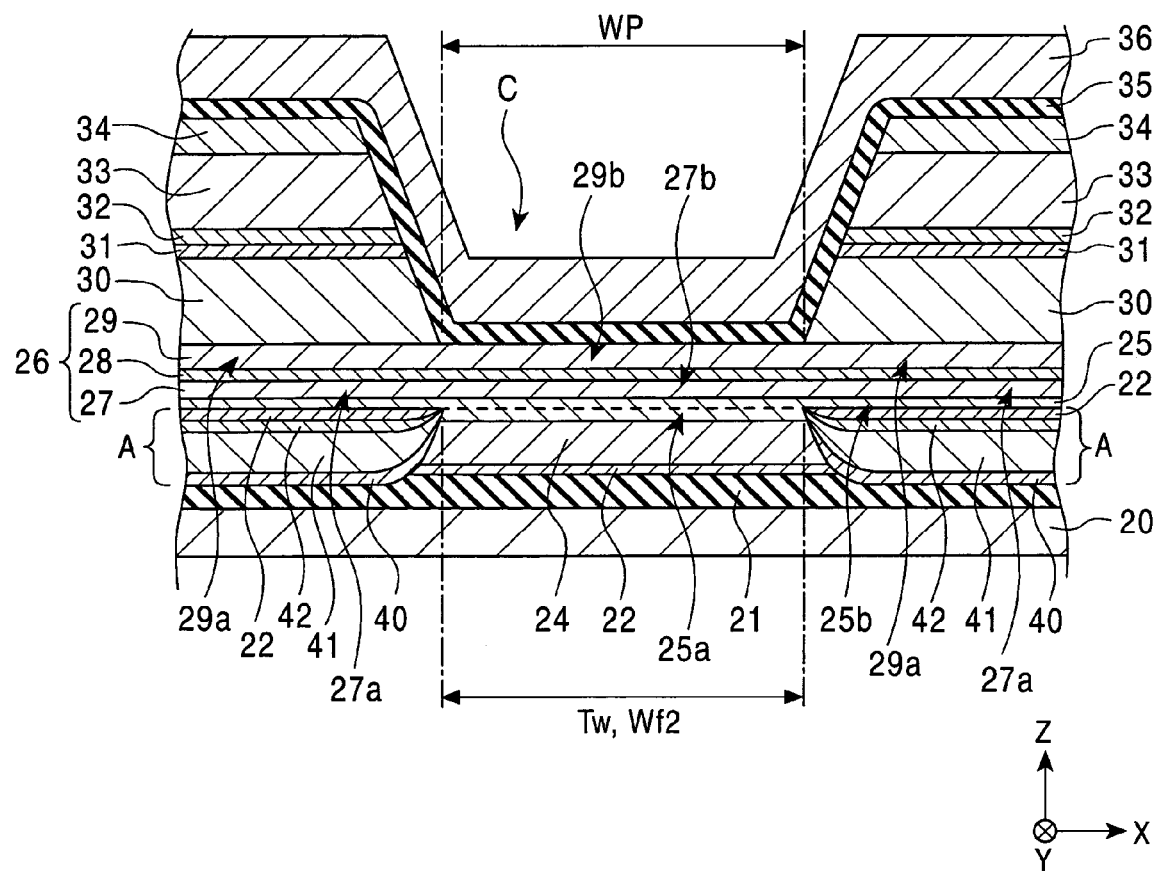
FIG. 3 is a partial sectional view of the structure of a magnetic detecting element according to still another embodiment of the present invention, as viewed from a surface facing a recording medium.

As shown in FIG. 3, a lower gap layer 21 is formed on the lower shield layer 20, and a seed layer 22 is formed on the central portion of the lower gap layer 21 in the track width direction (the X direction shown in the drawing). Furthermore, the free magnetic layer 24 is formed on the seed layer 22, and a permanent-magnet layer 41 is formed as a magnetization control layer for the free magnetic layer 24 on both sides of the free magnetic layer 24 in the track width direction. The permanent-magnet layer 41 is made of a CoPt alloy, a CoPtCr alloy, or the like. As shown in FIG. 3, a bias underlying layer 40 made of Cr, W, or the like is formed below the permanent-magnet layer 41, so that the characteristics (coercive force Hc and remanence ratio S) of the permanent-magnet layer 41 can be improved by providing the permanent-magnet layer 41 on the bias underlying layer 40. The track width Tw is regulated by the width dimension of the top of the free magnetic layer 24 in the track width direction.

Also, a protective layer 42 made of Ta or the like, and a seed layer 22 are laminated on the permanent-magnet layer 41, and thus both side regions A each comprising the permanent-magnet layer 41, the protective layer 42 and the seed layer 22 are formed on both sides of the free magnetic layer 24 in the track width direction.

In FIG. 3, a longitudinal bias magnetic field is applied to the free magnetic layer 24 from the permanent-magnetic layer 41 to bring the magnetization of the free magnetic layer 24 into a single domain state in the track width direction.

In FIG. 3, a lower layer 25a of a nonmagnetic material layer 25 is formed on the free magnetic layer 24, and both side regions A are disposed on both sides of the lower layer 25a. Also, an upper layer 25b of the nonmagnetic material layer 25, which is formed integrally with the lower layer 25a, is formed to extend from the lower layer 25a to both side regions A, the nonmagnetic material layer 25 comprising the lower layer 25a and the upper layer 25b. In FIG. 3, the boundary between the lower layer 25a and the upper layer 25b is denoted by a dotted line.

As shown in FIG. 3, a pinned magnetic layer 26 having a synthetic ferrimagnetic structure comprising a first magnetic layer 29, a second magnetic layer 27, and a nonmagnetic intermediate layer 28 interposed therebetween is formed on the nonmagnetic material layer 25. Since an antiparallel coupling magnetic field occurs between the first and second magnetic layers 29 and 27 due to the RKKY interaction, the magnetizations of the first and second magnetic layers 29 and 27 are antiparallel to each other.

As shown in FIG. 3, the first antiferromagnetic layer 30 is provided only on both side portions 29a of the first magnetic layer 29, not provided on the central portion 29b of the first magnetic layer 29. Therefore, an exchange coupling magnetic field occurs only between the first antiferromagnetic layer 30 and either side portion 29a of the first magnetic layer 29, not occur between the first antiferromagnetic layer 30 and the central portion 29b of the first magnetic layer 29. Therefore, the magnetizations of both side portions 29a and 27a of the first and second magnetic layers 29 and 27 are pinned in a direction parallel to the height direction (the Y direction) while maintaining an antiparallel state due to the exchange coupling magnetic field and the RKKY interaction.

On the other hand, the magnetizations of the central portions 29b and 27b of the first and second magnetic layers 29 and 27 of the pinned magnetic layer 26 are pinned in a direction parallel to the height direction (the Y direction) while maintaining an antiparallel state due to the RKKY interaction and a bias magnetic field through an exchange interaction in each magnetic layer. In the embodiment shown in FIG. 3, the magnetization of the pinned magnetic layer 26 can be properly pinned.

In the structure of the magnetic detecting element shown in FIG. 3, the magnetization of the pinned magnetic layer 26 can be properly pinned in the height direction, and an improvement in reproduction output, gap narrowing and the high resistance to electrostatic damage (ESD) can be realized. Therefore, a magnetic detecting element adaptable for a future higher recording density can be provided.

In the magnetic detecting element shown in FIG. 3, the minimum width dimension of the free magnetic layer 24 provided between the permanent-magnet layers 41 in the track width direction is Wf2 (the same as the track width Tw in the embodiment shown in FIG. 3), and the minimum dimension of the space C formed at its center of the first antiferromagnetic layer 30 in the track width direction is WP.

In the embodiment shown in FIG. 3, the minimum width dimension Wf2 is the same as or smaller than the minimum dimension WP. In this way, when the minimum width dimension Wf2 is the same as or smaller than the minimum dimension WP, the free magnetic layer 24 can be securely disposed in the narrowest gap (gap length) between the shield layers 20 and 36 in the thickness direction, thereby suppressing widening of the reproduction pulse width (PW50) and deterioration in resolution.

In the embodiment shown in FIG. 3, electrode layers 33 are provided on the first antiferromagnetic layer 30 so that the sensing current flowing from the electrode layers 33 to the multilayer film comprising the pinned magnetic layer 26, the nonmagnetic material layer 25 and the free magnetic layer 24 flows in parallel (the X direction) with the film plane of each layer. In this case, the direction of a sensing current magnetic field formed by the sensing current preferably coincides with the direction of the synthetic magnetic moment of the first and second magnetic layers 29 and 27 constituting the pinned magnetic layer 26, for strongly pinning the magnetization of the pinned magnetic layer 26. The way of coinciding the direction of the synthetic magnetic moment with the direction of the sensing current magnetic field is described above with reference to FIGS. 13 and 14.

The preferred range of the synthetic magnetic moment per unit area of the first and second magnetic layers 29 and 27 is described above with reference to FIG. 1. In FIG. 3, however, second magnetic field annealing performed in the manufacturing method described below is unnecessary, and thus the synthetic magnetic moment need not be set to 0 T·nm or more.

Figure 4:
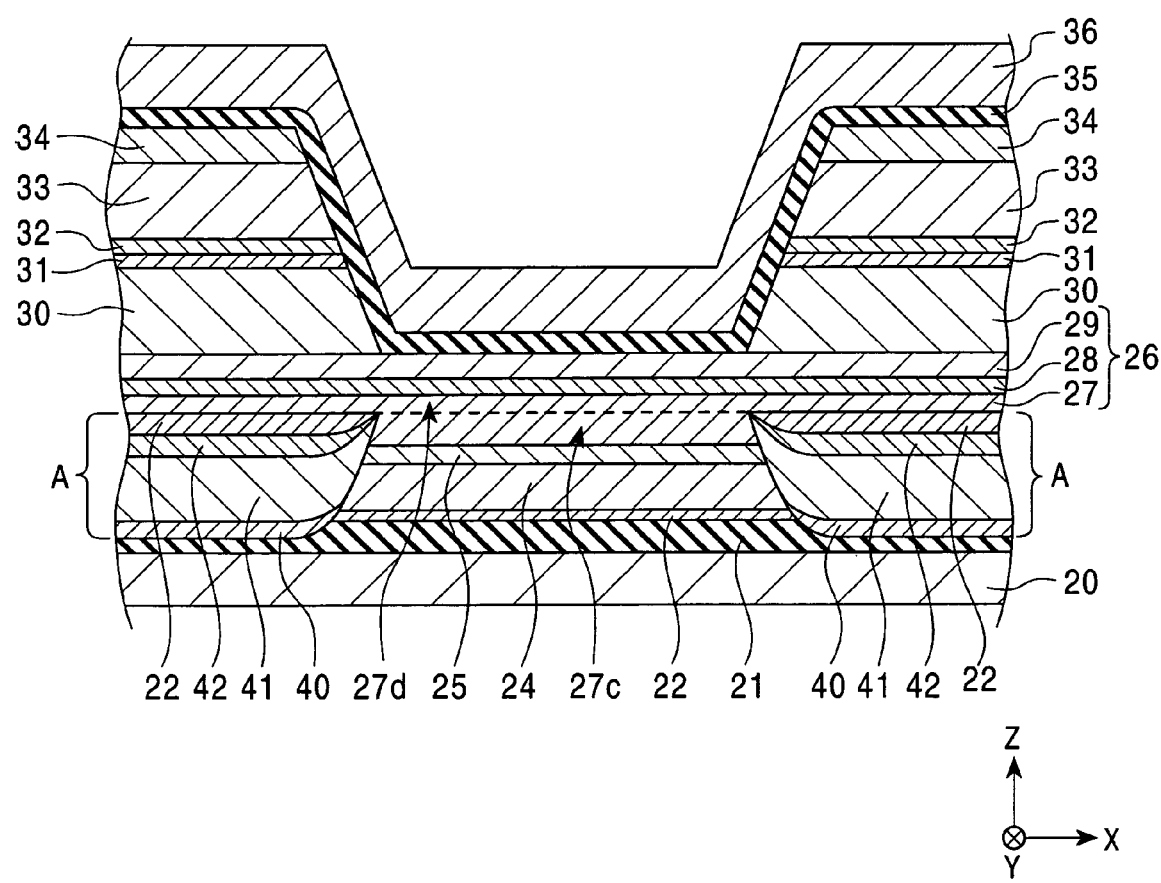
FIG. 4 is a partial sectional view of the structure of a magnetic detecting element according to a further embodiment of the present invention, as viewed from a surface facing a recording medium.

FIG. 4 is different from FIG. 3 in that a seed layer 22, a free magnetic layer 24 and a nonmagnetic material layer 25 are formed on the central portion of a lower gap layer 21 in the track width direction (the X direction shown in the drawing), a lower layer 27c of a second magnetic layer 27 constituting a pinned magnetic layer 26 is formed on the nonmagnetic material layer 25, and both side regions A each comprising a permanent-magnet layer 41 are formed on both sides of the layers ranging from the seed layer 22 to the lower layer 27c in the track width direction.

In FIG. 4, an upper layer 27d of the second magnetic layer 27 is formed to extend from the lower layer 27c of the second magnetic layer 27 to both side regions A, the second magnetic layer 27 comprising the lower layer 27c and the upper layer 27d integrally formed.

Figure 5:
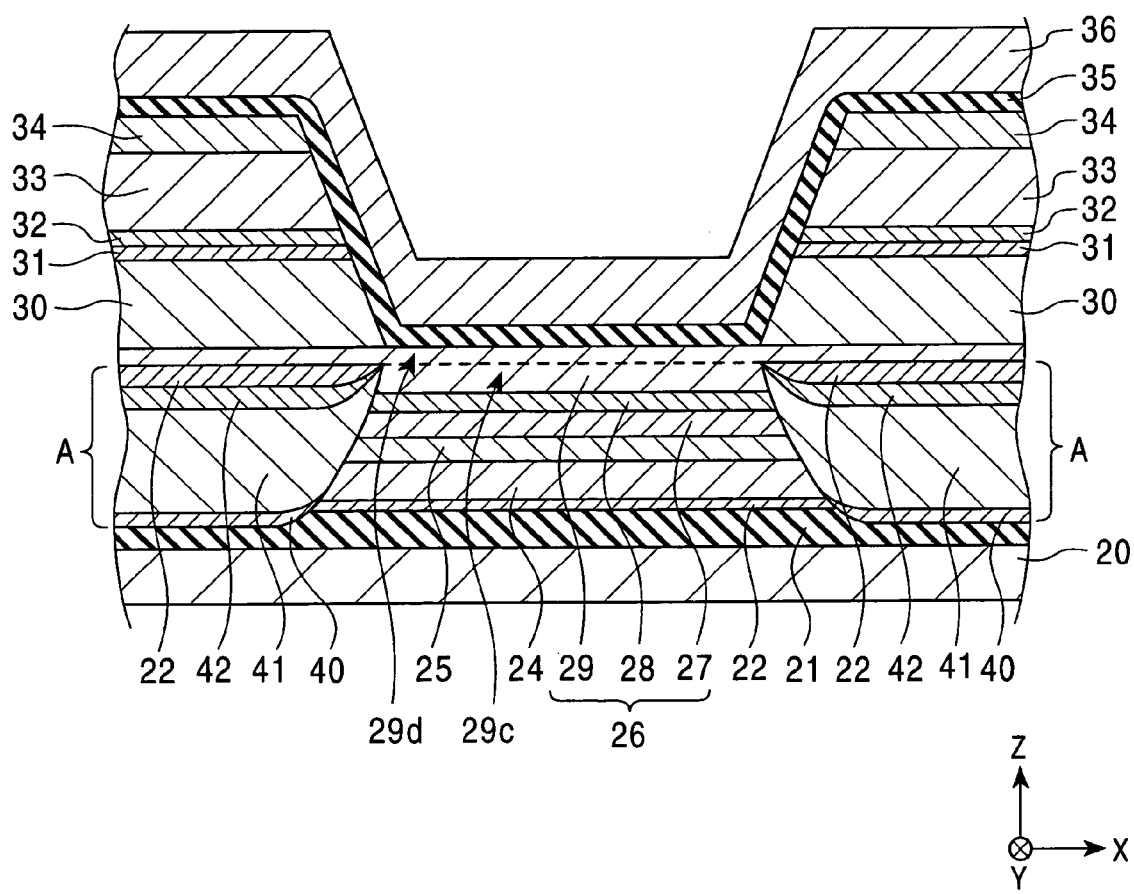
FIG. 5 is a partial sectional view of the structure of a magnetic detecting element according to a still further embodiment of the present invention, as viewed from a surface facing a recording medium.

FIG. 5 is different from FIGS. 3 and 4 in that a seed layer 22, a free magnetic layer 24, a nonmagnetic material layer 25, and a second magnetic layer 27 and a nonmagnetic intermediate layer 28 constituting a pinned magnetic layer 26 are formed on the central portion of a lower gap layer 21 in the track width direction (the X direction shown in the drawing), a lower layer 29c of a first magnetic layer 29 is formed on the nonmagnetic intermediate material layer 28, and both side regions A each comprising a permanent-magnet layer 41 are formed on both sides of the layers ranging from the seed layer 22 to the lower layer 29c of the first magnetic layer 29 in the track width direction.

In FIG. 5, an upper layer 29d of the first magnetic layer 29 is formed to extend from the lower layer 29c of the first magnetic layer 29 to both side regions A, the first magnetic layer 29 comprising the lower layer 29c and the upper layer 29d integrally formed.

Figure 6:
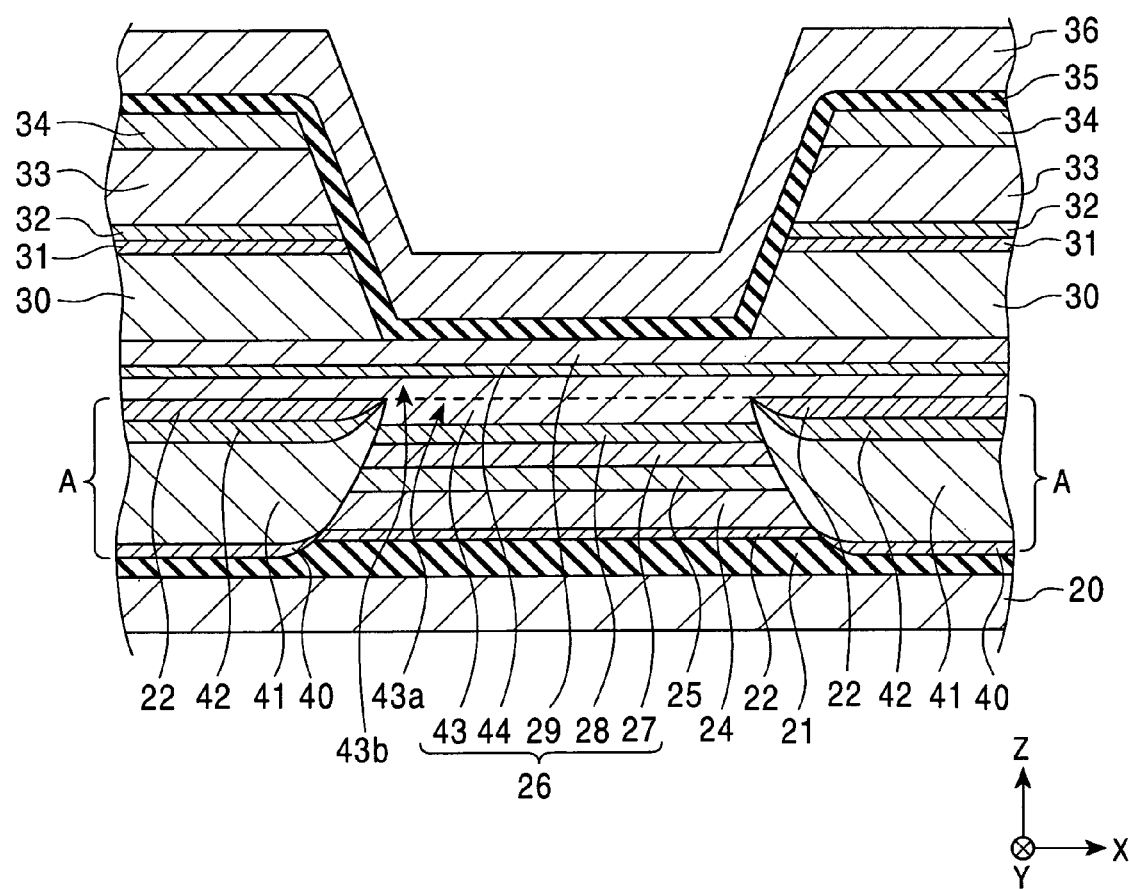
FIG. 6 is a partial sectional view of the structure of a magnetic detecting element according to a further embodiment of the present invention, as viewed from a surface facing a recording medium.

FIG. 6 is different from FIGS. 3 to 5 in that a seed layer 22, a free magnetic layer 24, a nonmagnetic material layer 25, and a second magnetic layer 27 and a nonmagnetic intermediate layer 28 constituting a pinned magnetic layer 26 are formed on the central portion of a lower gap layer 21 in the track width direction (the X direction shown in the drawing), a lower layer 43a of a magnetic intermediate layer 43 is formed on the nonmagnetic intermediate layer 28, and both side regions A each comprising a permanent-magnet layer 41 are formed on both sides of the layers ranging from the seed layer 22 to the lower layer 43a of the magnetic intermediate layer 43 in the track width direction.

In FIG. 6, an upper layer 43b of the magnetic intermediate layer 43 is formed to extend from the lower layer 43a of the magnetic intermediate layer 43 to both side regions A, the magnetic intermediate layer 43 comprising the lower layer 43a and the upper layer 43b integrally formed. Furthermore, a nonmagnetic intermediate layer 44 made of the same material as the nonmagnetic intermediate layer 28 is formed on the magnetic intermediate layer 43, and a first magnetic layer 29 is formed on the nonmagnetic intermediate layer 44. In FIG. 6, the pinned magnetic layer 26 has a five-layer laminated structure.

Figure 7:
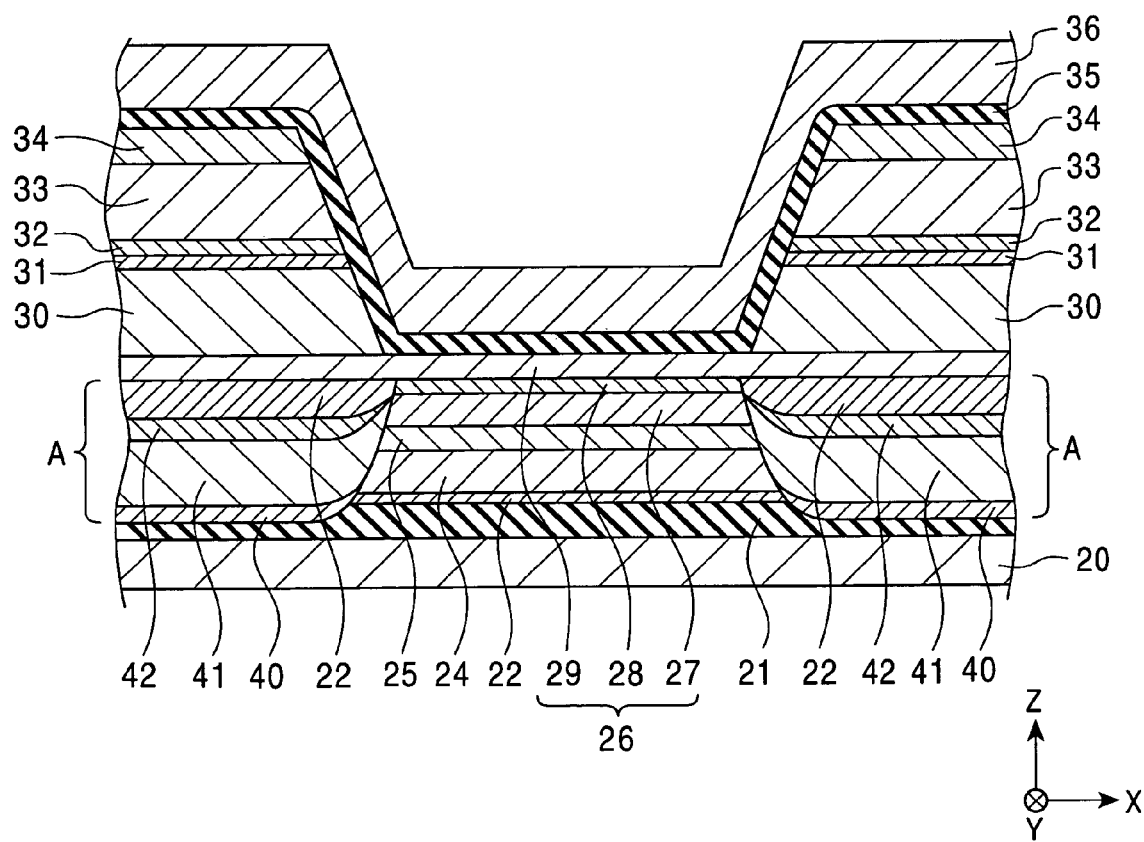
FIG. 7 is a partial sectional view of the structure of a magnetic detecting element according to a further embodiment of the present invention, as viewed from a surface facing a recording medium.

FIG. 7 is different from FIGS. 3 to 6 in that a seed layer 22, a free magnetic layer 24, a nonmagnetic material layer 25, and a second magnetic layer 27 and a nonmagnetic intermediate layer 28 constituting a pinned magnetic layer 26 are formed on the central portion of a lower gap layer 21 in the track width direction (the X direction shown in the drawing), and both side regions A each comprising a permanent-magnet layer 41 are formed on both sides of the layers ranging from the seed layer 22 to the nonmagnetic intermediate layer 28 in the track width direction.

In FIG. 7, a first magnetic layer 29 is formed to extend from the nonmagnetic intermediate layer 28 to both side regions A.

Figure 8:
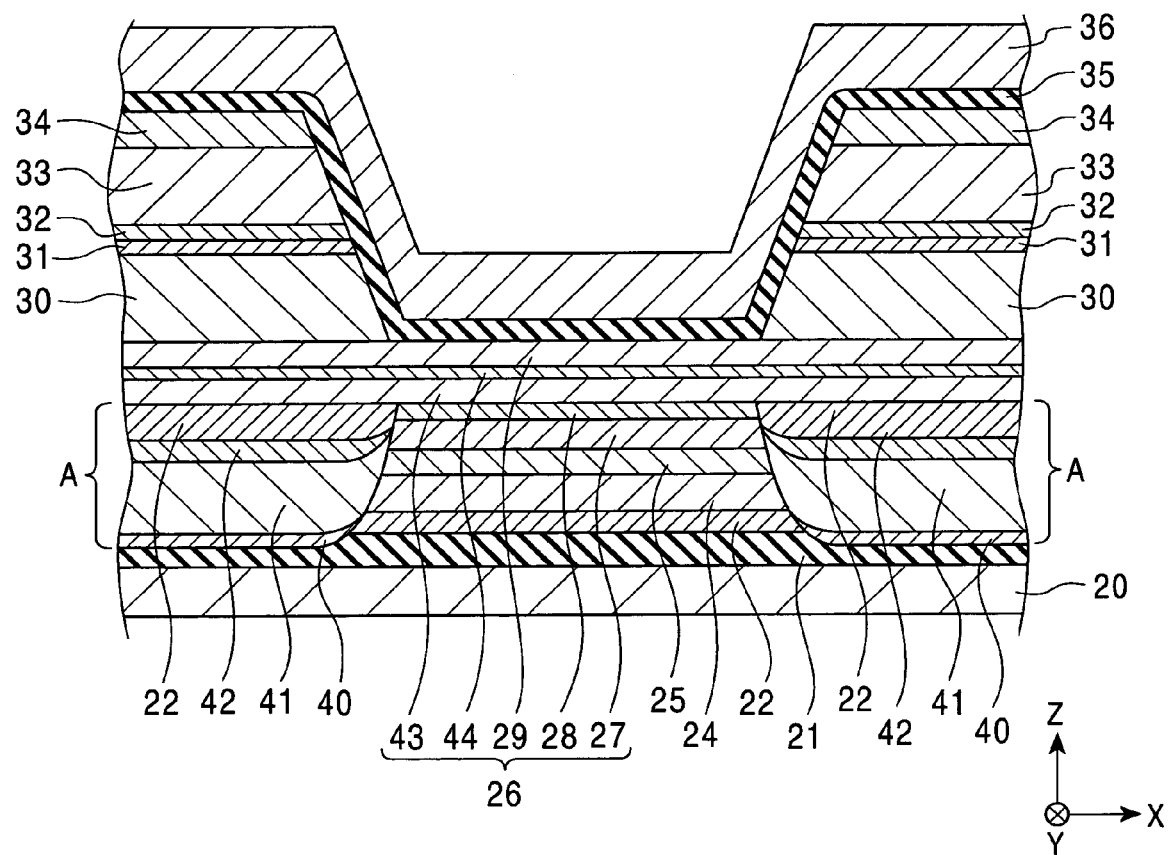
FIG. 8 is a partial sectional view of the structure of a magnetic detecting element according to a further embodiment of the present invention, as viewed from a surface facing a recording medium.

FIG. 8 is different from FIGS. 3 to 7 in that a seed layer 22, a free magnetic layer 24, a nonmagnetic material layer 25, and a second magnetic layer 27 and a nonmagnetic intermediate layer 28 constituting a pinned magnetic layer 26 are formed on the central portion of a lower gap layer 21 in the track width direction (the X direction shown in the drawing), and both side regions A each comprising a permanent-magnet layer 41 are formed on both sides of the layers ranging from the seed layer 22 to the nonmagnetic intermediate layer 28 in the track width direction.

In FIG. 8, a magnetic intermediate layer 43 is formed to extend from the nonmagnetic intermediate layer 28 to both side regions A, and a nonmagnetic intermediate layer 44 and a first magnetic layer 29 are laminated on the magnetic intermediate layer 43.

The differences between the structures shown in FIGS. 3 to 8 are due to the manufacturing methods. When the lower layer 25a and the upper layer 25b are separately formed to form the nonmagnetic material layer 25 as shown in FIG. 3, or when the lower layer 27c and the upper layer 27d are separately formed to form the second magnetic layer 27 as shown in FIG. 4, a disturbance easily occurs between the atomic arrangements of the lower layer and the upper layer to cause a fear that MR characteristics deteriorate. However, the effect of securely pinning the magnetizations of both side portions of the pinned magnetic layer 26 can be expected.

In FIG. 5, the lower layer 29c and the upper layer 29d of the first magnetic layer 29 are separately formed, and thus there remains a fear about whether or not the magnetization of the central portion of the pinned magnetic layer 26 is properly pinned. However, an improvement in MR characteristics can be expected.

In FIG. 6, the magnetic intermediate layer 43 is provided in the pinned magnetic layer 26 to cause a fear that the reproduction output is decreased by a current loss to the magnetic intermediate layer 43. However, the optimization of magnetization pinning of the pinned magnetic layer 26 and an improvement in MR characteristics can be expected.

Like in FIG. 5, in FIG. 7, there remains a fear about whether or not the magnetization of the central portion of the pinned magnetic layer 26 is properly pinned, but an improve in MR characteristics can be expected. Like in FIG. 6, in FIG. 8, there is a fear that the reproduction output is decreased by a current loss to the magnetic intermediate layer 43, but the optimization of magnetization pinning of the pinned magnetic layer 26 and an improvement in MR characteristics can be expected.

Figure 9:
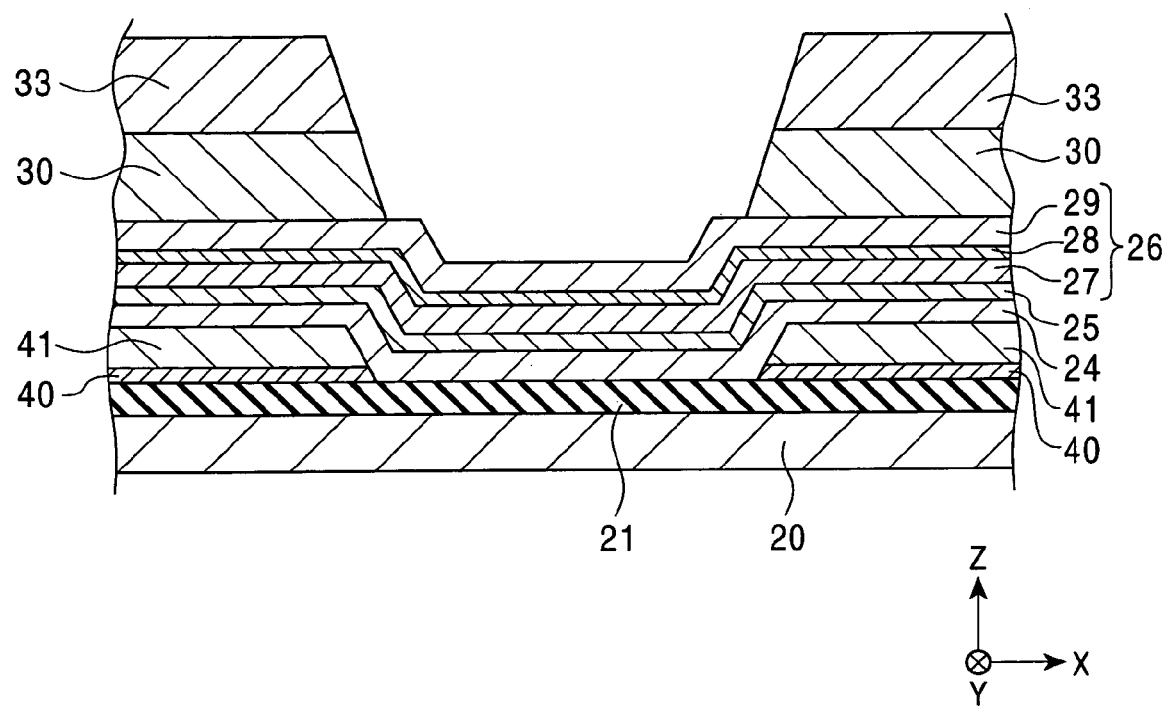
FIG. 9 is a partial sectional view of the structure of a magnetic detecting element according to a further embodiment of the present invention, as viewed from a surface facing a recording medium.

In the magnetic detecting element shown in FIG. 9, a pair of permanent magnet layers 41 is formed on a lower gap layer 21 with a predetermined space in the track width direction (the X direction shown in the drawing), and a free magnetic layer 24 is formed on the permanent-magnet layers 41 and on the space between the permanent-magnet layers 41. In this embodiment, the free magnetic layer 24 is preferably in direct contact with the permanent-magnet layers 41, for appropriately suppressing the occurrence of side reading.

Figure 10:
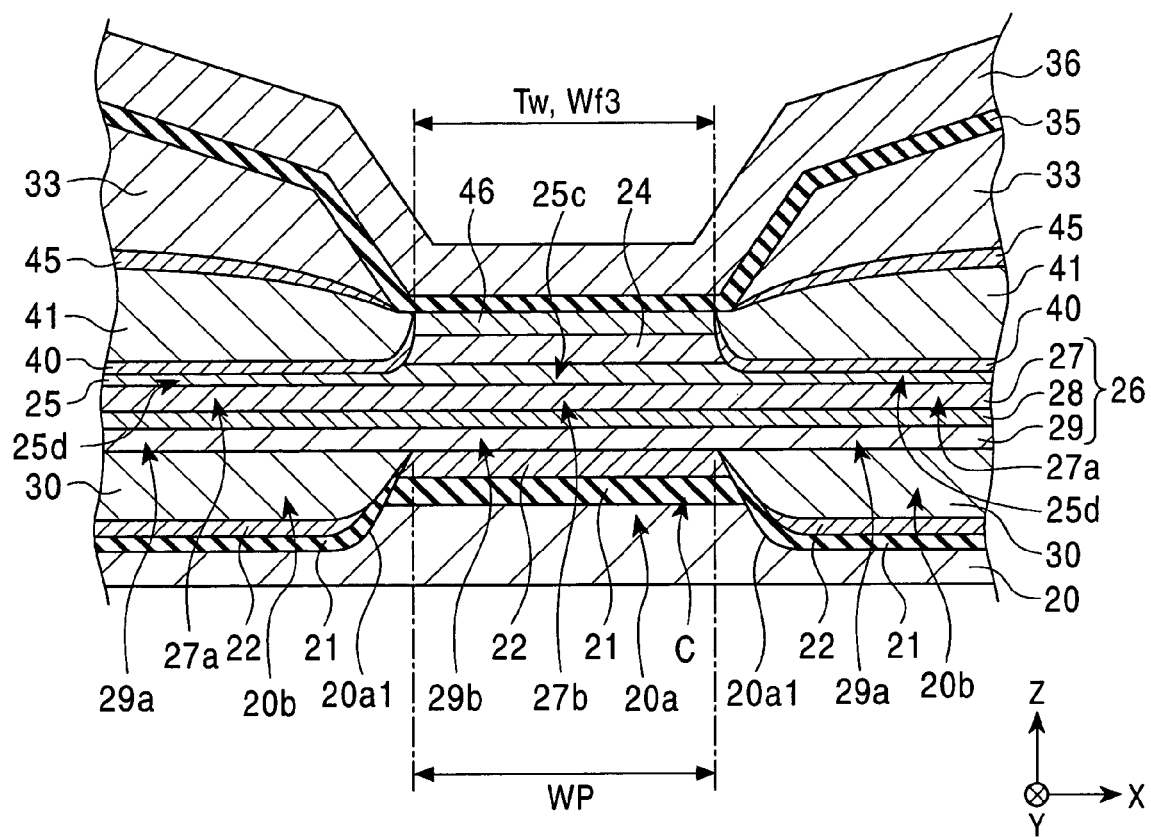
FIG. 10 is a partial sectional view of the structure of a magnetic detecting element according to a further embodiment of the present invention, as viewed from a surface facing a recording medium.

FIG. 10 is a partial sectional view of the structure of a magnetic detecting element (spin valve thin film element) according to the present invention, as viewed from a surface facing a recording medium. The magnetic detecting element shown in FIG. 10 is a type in which a free magnetic layer 24 is formed above a first antiferromagnetic layer 30.

As shown in FIG. 10, the lower shield layer 20 has a projection 20a provided at its center in the track width direction (the X direction shown in the drawing) to project in the thickness direction (the Z direction shown in the drawing), and recesses 20b provided on both sides of the projection 20a in the track width direction.

As shown in FIG. 10, a lower gap layer 21 made of an insulating material such as $Al_2O_3$ or the like is formed on the top of the projection 20a of the lower shield layer 20. The lower gap layer 21 is also formed on both side ends 20a1 of the projection 20a in the track width direction and on the bottoms of the recesses 20b.

As shown in FIG. 10, a seed layer 22 made of a NiFe alloy, a NiFeCr alloy or Cr is formed on the lower gap layer 21 formed on the bottoms of the recesses 20b and the projection 20a of the lower shield layer 20.

As shown in FIG. 10, a first antiferromagnetic layer 30 is formed on the seed layer 22 formed in the recesses 20b of the lower shield layer 20. Namely, the recesses 20b formed in the lower shield layer 20 are filled with the first antiferromagnetic layer 30.

The first antiferromagnetic layer 30 is not formed on the seed layer 22 formed on the projection 20a of the lower shield layer 20 so that exchange coupling magnetic fields are produced between the first antiferromagnetic layer 30 and both side portions 29a of the first magnetic layer 29 constituting the pinned magnetic layer 26. A nonmagnetic metal layer having the same composition as that of the first antiferromagnetic layer 30 may also be formed to a thickness smaller than 50 Å on the projection 20a of the lower shield layer 20. In this case, an exchange coupling magnetic field is not produced between the nonmagnetic metal layer and the central portion 29b of the first magnetic layer 29 constituting the pinned magnetic layer 26. Namely, since the nonmagnetic metal layer is thin, the nonmagnetic metal layer cannot be transformed from a disordered lattice to an ordered lattice even by a heat treatment in a magnetic field.

As shown in FIG. 10, the first magnetic layer 29 is formed to extend from the seed layer 22 formed on the projection 20a of the lower shield layer 20 to the first antiferromagnetic layer 30, and a second magnetic layer 27 is formed on the first magnetic layer 29 with a nonmagnetic intermediate layer 28 provided therebetween. The pinned magnetic layer 26 is formed in a synthetic ferrimagnetic structure comprising the first magnetic layer 29, the second magnetic layer 27, and the nonmagnetic intermediate layer 28. Magnetizations of the first and second magnetic layers 29 and 27 are pinned while maintaining an antiparallel state in parallel with the height direction (the Y direction).

Furthermore, a nonmagnetic material layer 25 is formed on the pinned magnetic layer 26. The nonmagnetic material layer 25 has a projecting central portion 25c in the track width direction (the X direction), and recessed both sides 25d on both sides of the central portion 25c. Also, a free magnetic layer 24 and a protective layer 46 made of Ta are formed on the central portion 25c of the nonmagnetic material layer 25, and a permanent-magnet layers 41 is formed to extend from each of both side portions 25d of the nonmagnetic material layer 25 to each side ends of at least the free magnetic layer 24 in the track width direction. The bottoms of the permanent-magnet layers 41 are preferably positioned above at least the pinned magnetic layer 26. When the bottoms of the permanent-magnet layers 41 are positioned below the surface of the pinned magnetic layer 26, both side portions of the pinned magnetic layer 26 in the track width direction are partially removed to fail to properly pin the magnetization of the pinned magnetic layer 26. Therefore, the bottoms of the permanent-magnet layers 41 must be positioned above at least the pinned magnetic layer 26.

In FIG. 10, bias underlying layers 40 made of Cr or the like are preferably formed between at least the permanent-magnet layers 41 and both side portions 25d of the nonmagnetic material layer 25, for improving the characteristics of the permanent-magnet layers 41. By providing a Ta layer below each bias underlying layer 40, the crystal orientation of a body-centered cubic structure of each bias underlying layer 40 can be optimized to preferably further improve the characteristics (coercive force Hc and remanence ratio S) of the permanent-magnet layers 41. When the bias underlying layers and Ta layer are provided, the bottoms of these layers must be positioned above at least the pinned magnetic layer 26.

As shown in FIG. 10, electrode layers 33 are provided on the respective permanent-magnet layers 41 with anti-diffusion layers 45 provided therebetween and made of Ta.

Like in the magnetic detecting elements shown in FIGS. 1 to 8, in the magnetic detecting element shown in FIG. 10, the pinned magnetic layer 26 has a synthetic ferrimagnetic structure comprising a first magnetic layer 29 in contact with the first antiferromagnetic layer 30, a second magnetic layer 27 facing the first magnetic layer 29 in the thickness direction, and a nonmagnetic intermediate layer 28 interposed between the first and second magnetic layer 29 and 27. Since an antiparallel coupling magnetic field occurs between the first and second magnetic layers 29 and 27 due to the RKKY interaction, the magnetizations of both magnetic layers 29 and 27 are antiparallel to each other.

The first antiferromagnetic layer 30 is formed to a large thickness below both side portions 29a of the first magnetic layer 29. Therefore, an exchange coupling magnetic field occurs between the first antiferromagnetic layer 30 and both side portions 29a of the first magnetic layer 29, so that the magnetizations of both side portions 29a and 27a of the first and second magnetic layers 29 and 27 are pinned in parallel with the height direction (the Y direction) while maintaining an antiparallel state due to the exchange coupling magnetic field and RKKY interaction.

On the other hand, in the central portion of the pinned magnetic layer 26, the first antiferromagnetic layer 30 is not formed below the first magnetic layer 29, and thus an exchange coupling magnetic field is not produced in the central portion of the first magnetic layer 29. However, the magnetizations of the central portions 29b and 27b of the first and second magnetic layers 29 and 27, respectively, are pinned in parallel with the height direction (the Y direction) while maintaining an antiparallel state due to a bias magnetic field through an exchange interaction in each magnetic layer and the RKKY interaction. Therefore, in the embodiment shown in FIG. 10, the magnetization of the pinned magnetic layer 26 can be properly pinned.

In the magnetic detecting element having the structure shown in FIG. 10, the first antiferromagnetic layer 30 is not formed below the central portion 29b of the first magnetic layer 29, or the nonmagnetic metal layer having the same composition as the first antiferromagnetic layer 30 is formed to a thickness smaller than 50 Å below the central portion 29b. Therefore, the sensing current flowing from the electrode layers 33 mainly to the nonmagnetic material layer 25 little shunts to the first antiferromagnetic layer 30, thereby decreasing a shunt loss and improving the reproduction output.

When the nonmagnetic metal layer having the same composition as that of the first antiferromagnetic layer 30 is not provided or provided to a thickness smaller than 50 Å below the central portion 29b of the first magnetic layer 29, in the central portion of the element, the distance between the shield layers 20 and 36 can be narrowed, i.e., so-called gap narrowing can be realized.

Furthermore, when the nonmagnetic metal layer having the same composition as that of the first antiferromagnetic layer 30 is not provided or provided to a thickness smaller than 50 Å below the central portion 29b of the first magnetic layer 29, magnetic electrostatic damage (soft ESD) little occurs in the central portion of the pinned magnetic layer 26.

In this way, in the structure of the magnetic detecting element shown in FIG. 10, the magnetization of the pinned magnetic layer 26 can be properly pinned in the height direction, and an improvement in the reproduction output and gap narrowing can be realized. Therefore, a magnetic detecting device adaptable for a future higher recording density can be provided.

In the magnetic detecting element shown in FIG. 10, the minimum width dimension of the free magnetic layer 24 disposed between the permanent-magnet layers 41 in the track width direction is Wf3 (the same as the track width Tw in the embodiment shown in FIG. 10).

The minimum dimension of the space C formed in the first antiferromagnetic layer 30 in the track width direction is WP.

In the embodiment shown in FIG. 10, the minimum width dimension Wf3 is the same as or smaller than the minimum dimension WP. When the minimum width dimension Wf3 is the same as or smaller than the minimum dimension WP, the free magnetic layer 24 is securely positioned in the narrowest space (so-called gap length) between the shield layers 20 and 36 in the thickness direction to suppress widening of the reproduction pulse width (PW50) and deterioration of resolution.

In the embodiment shown in FIG. 10, electrode layers 33 are provided on the permanent-magnet layers 41 through anti-diffusion layers 45 so that the sensing current flowing from the electrode layers 33 to the multilayer film comprising the pinned magnetic layer 26, the nonmagnetic material layer 25 and the free magnetic layer 24 flows in parallel (the X direction) with the film plane of each layer. In this case, the direction of a sensing current magnetic field formed by the sensing current preferably coincides with the direction of a synthetic magnetic moment of the first and second magnetic layers 29 and 27 constituting the pinned magnetic layer 26, for strongly pinning the magnetization of the pinned magnetic layer 26. The way of coinciding the direction of the synthetic magnetic moment with the direction of the sensing current magnetic field is described above with reference to FIGS. 13 and 14.

The preferred range of the synthetic magnetic moment per unit area of the pinned magnetic layer 26 is described above with reference to FIG. 1. In FIG. 10, however, second magnetic field annealing performed in the manufacturing method described below is unnecessary, and thus the synthetic magnetic moment need not be set to 0 T·nm or more.

Figure 11:
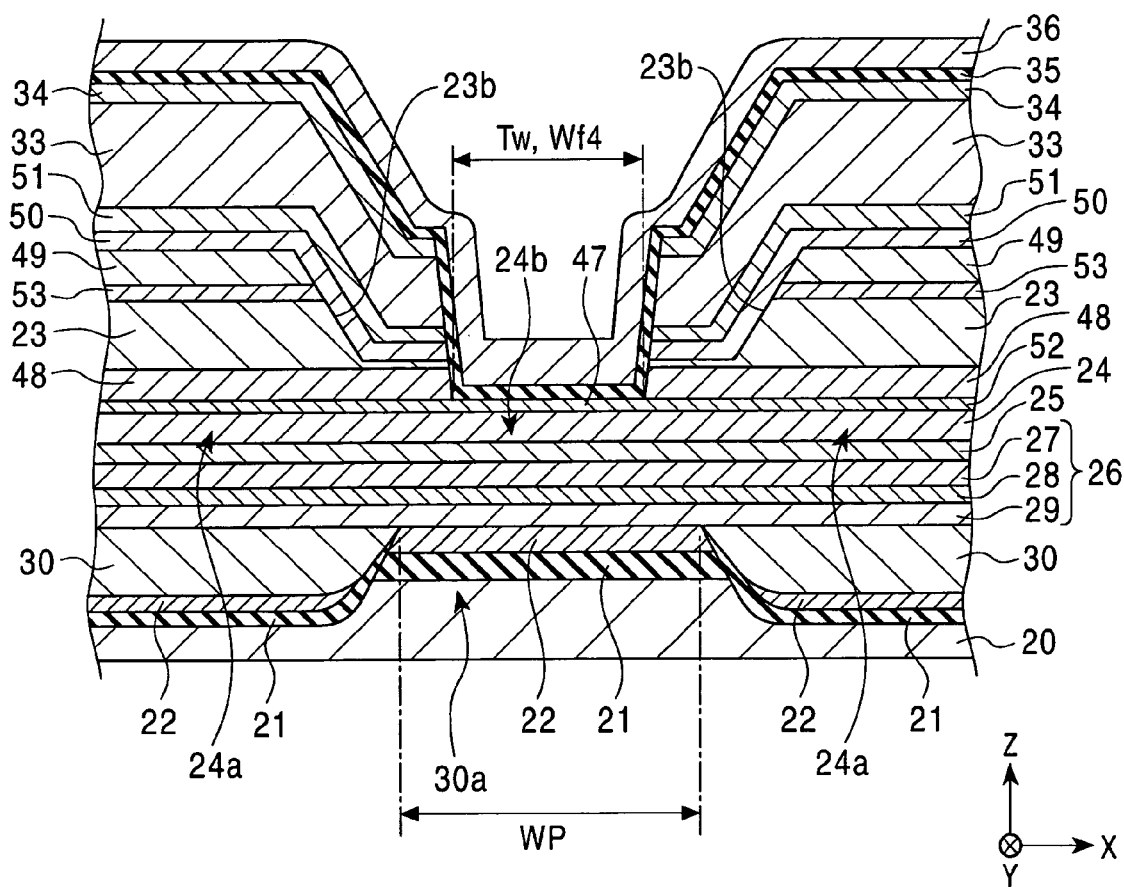
FIG. 11 is a partial sectional view of the structure of a magnetic detecting element according to a further embodiment of the present invention, as viewed from a surface facing a recording medium.

FIG. 11 is a partial sectional view of the structure of a magnetic detecting element (spin valve thin film element) according to the present invention, as viewed from a surface facing a recording medium. The magnetic detecting element shown in FIG. 11 is the same type as in FIG. 10 in which a free magnetic layer 24 is formed above a first antiferromagnetic layer 30. In FIG. 11, layers denoted by the same reference numerals as in FIG. 10 are the same layers as in FIG. 10, and thus the description thereof is omitted.

The magnetic detecting element shown in FIG. 11 is the same as the magnetic detecting element shown in FIG. 10 in the structure ranging from the lower shield layer 20 to the pinned magnetic layer 26.

The nonmagnetic material layer 25 having a uniform thickness is formed on the pinned magnetic layer 26 in the track width direction, and the free magnetic layer 24 is formed on the nonmagnetic material layer 25.

As shown in FIG. 11, a nonmagnetic intermediate layer 52 is formed on the free magnetic layer 24, and ferromagnetic layers 48 are formed on both side portions 24a of the free magnetic layer 24 in the track width direction (the X direction) through the nonmagnetic intermediate layer 52. Also, a second antiferromagnetic layer 23 having a space larger than the space between the ferromagnetic layers 48 in the track width direction (the X direction) is formed on the ferromagnetic layers 48. Furthermore, stopper layers 53 made of Cr or the like, protective layers 49 made of Ta or the like, and stopper layers 50 made of Cr or the like, and protective layers 51 made of Ta or the like are formed on the second antiferromagnetic layer 23.

The magnetizations of the ferromagnetic layers 48 overlapped with the second antiferromagnetic thick layer 23 in the thickness direction (the Z direction) are strongly pinned in the track width direction (the X direction) by an exchange coupling magnetic field produced between the ferromagnetic layers 48 and the second antiferromagnetic layer 23. In the regions facing the ferromagnetic layers 48 in the thickness direction, each ferromagnetic layer 48 having the strongly pinned magnetization, the magnetization of the free magnetic layer 24 is pinned in a direction opposite to the magnetization direction of the ferromagnetic layers 48 by exchange coupling due to the RKKY interaction between the free magnetic layer 24 and the ferromagnetic layers 48.

On the other hand, in the regions extending from the inner ends 23b of the second antiferromagnetic layer 23 to the center in the track width direction (the X direction), a bias magnetic field through an exchange interaction in the ferromagnetic layers 48 and the free magnetic layer 24, and exchange coupling due to the RKKY interaction produced between the ferromagnetic layers 48 and the free magnetic layer 24 act on the ferromagnetic layers 48 and the free magnetic layer 24 facing the ferromagnetic layers 48 in the thickness direction (the Z direction). Therefore, in the regions extending from the inner ends 23b of the second antiferromagnetic layer 23 to the center in the track width direction (the X direction), the sensitivity of the ferromagnetic layers 48 and the free magnetic layer 24 can be lowered to zero.

Also, the ferromagnetic layers 48 are not formed on the central portion 24b of the free magnetic layer 24 in the track width direction with the nonmagnetic intermediate layers 52 provided therebetween in the thickness direction. Therefore, only the bias magnetic field acts through the exchange interaction in each magnetic layer without exchange coupling due to the RKKY interaction between the second antiferromagnetic layer 23 and the central portion 24b. The central portion 24b of the free magnetic layer 24 is thus put into a single magnetic domain state to an extent which permits magnetization reversal with high sensitivity to an external magnetic field.

The synthetic magnetic moment (Net Mst) per unit area of the free magnetic layer 24 and the ferromagnetic layers 48 is preferably 0 T·nm to 2.6 T·nm. By setting the synthetic magnetic moment (Net Mst) in the above range, the reproduction sensitivity of a portion where the free magnetic layer 24 overlaps with each ferromagnetic layer 48 can be properly decreased. Specifically, the sensitivity {Δv (±100 Oe)/Δv (±4000 Oe) can be decreased to 0.2 or less.

The reason why the Net Mst is set to be a plus value, i.e., why the magnetic moment per unit area of the free magnetic layer is set to be larger than the magnetic moment per unit area of the ferromagnetic layers, is to improve the stability of a reproduction waveform, and facilitate the magnetic field annealing step for controlling the magnetization direction of the free magnetic layer 24.

In the present invention, the thickness difference obtained by subtracting the thickness (t) of the ferromagnetic layers 48 from the thickness (t) of the free magnetic layer 24 is preferably 0 Å to 30 Å. By setting the thickness difference in this range, the reproduction sensitivity of the portion where the free magnetic layer 24 overlaps with each ferromagnetic layer 48 can be properly decreased. Specifically, the sensitivity {Δv (±100 Oe)/Δv (±4000 Oe) can be decreased to 0.2 or less. Also, when the thickness of the free magnetic layer 24 is larger than the thickness of the ferromagnetic layers 48, the same effect as that achieved with a plus value of Net Mst can be obtained.

The minimum width dimension Wf3 shown in FIG. 10 corresponds to the minimum width dimension Wf4 of the space between the ferromagnetic layers 48 in the track width direction in FIG. 11. The minimum width dimension Wf4 is the same as or smaller than the minimum dimension WP so that the central portion 24b of the free magnetic layer 24 can be positioned in the narrowest space (so-called gap length) between the shield layers 20 and 36 in the thickness direction, thereby suppressing widening of the reproduction pulse width (PW50) and deterioration in resolution.

Figure 12:
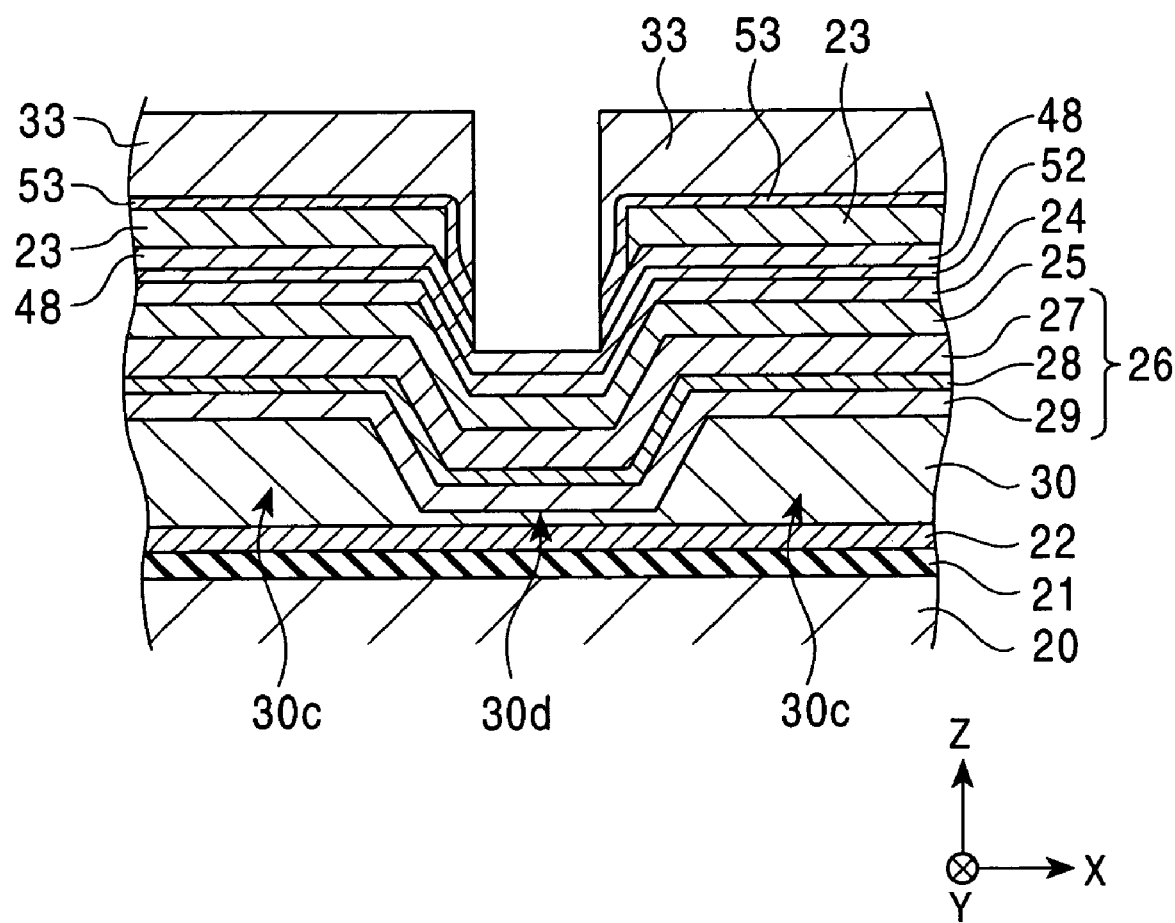
FIG. 12 is a partial sectional view of the structure of a magnetic detecting element according to a further embodiment of the present invention, as viewed from a surface facing a recording medium.

FIG. 12 is a partial sectional view of the structure of a magnetic detecting element (spin valve thin film element) according to the present invention, as viewed from a surface facing a recording medium. The magnetic detecting element shown in FIG. 12 is the same type as in FIGS. 10 and 11 in which a free magnetic layer 24 is formed above a first antiferromagnetic layer 30. In FIG. 12, layers denoted by the same reference numerals as in FIGS. 10 and 11 are the same layers as in FIGS. 10 and 11, and thus the description thereof is omitted.

In FIG. 12, the lower gap layer 21 and the seed layer 22 are formed on the lower shield layer 20, the seed layer 22 having a flat surface. The first antiferromagnetic layer 30 is formed on the flat surface so that the first antiferromagnetic layer 30 is thick in both side portions 30c in the track width direction. A nonmagnetic metal layer having the same composition as the first antiferromagnetic layer 30 is left with a thickness, for example, smaller than 50 Å, in the central portion 30d. However, the nonmagnetic metal layer having the same composition as the first antiferromagnetic layer 30 need not be formed in the central portion 30d.

Since the first antiferromagnetic layer 30 is formed on the flat surface so that it becomes thick in both side portions, the magnetic detecting element has a shape in which the both side portions rise, and the central portion is depressed. In FIG. 12, the ferromagnetic layers 48 and the second antiferromagnetic layers 23 are used as layers for controlling the magnetization of the free magnetic layer 24. The shapes of these layers are described above with reference to FIG. 11.

The magnetic detecting element of the structure shown in FIG. 12 has the same effect as that of the magnetic detecting element shown in FIG. 10. Namely, the magnetization of the pinned magnetic layer 26 can be properly pinned in the height direction, and an improvement in the reproduction output and narrowing of the gap can be realized. Therefore, a magnetic detecting element adaptable for a future higher recording density can be provided.

Figure 15:
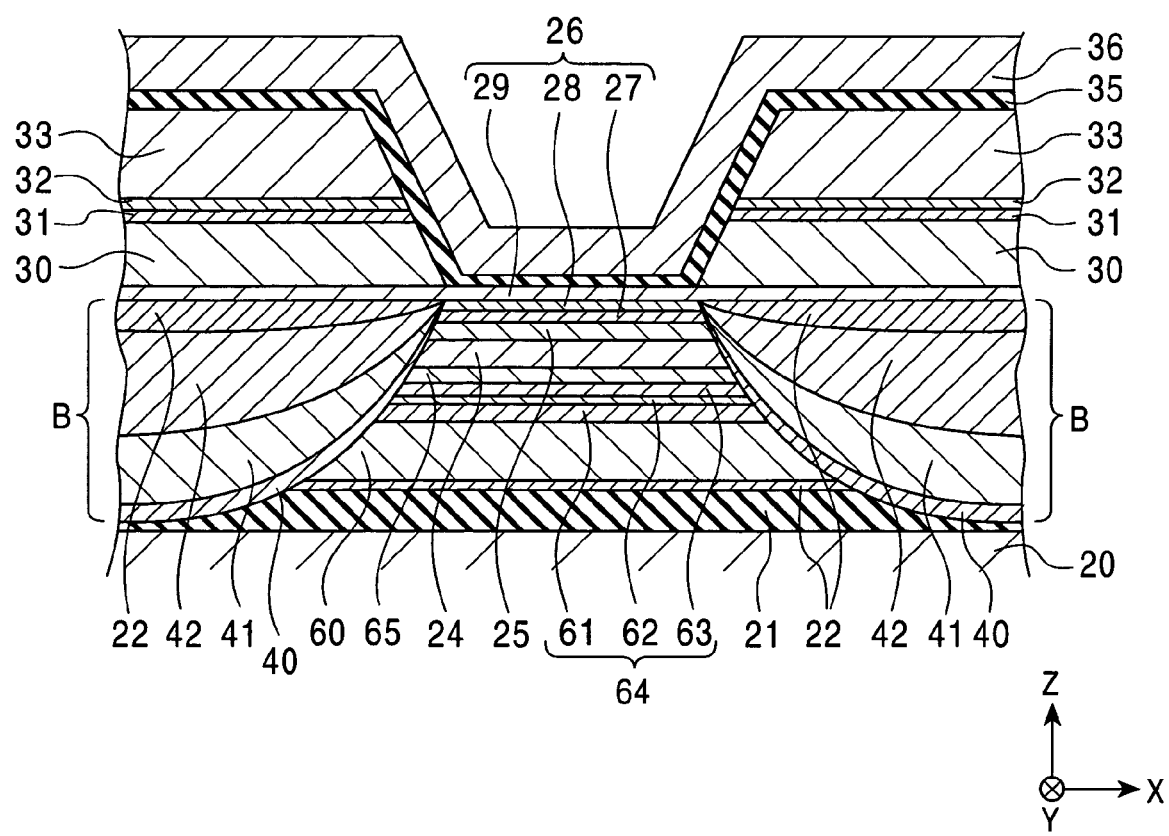
FIG. 15 is a partial sectional view of the structure of a magnetic detecting element according to a further embodiment of the present invention, as viewed from a surface facing a recording medium.

FIG. 15 is a partial sectional view of the structure of a magnetic detecting element (spin valve thin film element) according to the present invention, as viewed from a surface facing a recording medium.

FIG. 15 shows the structure of a dual spin valve thin film element. In each of the magnetic detecting elements shown in FIGS. 1 to 12, each of the free magnetic layer 24 and the pinned magnetic layer 26 is provided singly. However, in FIG. 15, one free magnetic layer 24 and two pinned magnetic layers 26 and 64 are provided. The magnetic detecting element shown in each of FIGS. 1 to 12 is referred to as a "single spin valve thin film element", and the magnetic detecting element shown in FIG. 15 is referred to as a "dual spin valve thin film element". Although the dual spin valve thin film element has the effect of increasing a rate of resistance change as compared with the single spin valve thin film element, the dual spin valve thin film element has a disadvantage that the gap length increases.

The structure of the magnetic detecting element shown in FIG. 15 is similar to that shown in FIG. 7. Namely, the magnetic detecting element shown in FIG. 15 corresponds to the magnetic detecting element shown in FIG. 7 converted to a dual spin valve thin film element.

Namely, in FIG. 15, a third antiferromagnetic layer 60 is provided on the seed layer 20, and the lower pinned magnetic layer 64 is provided on the third antiferromagnetic layer 60. The pinned magnetic layer 64 has a synthetic ferrimagnetic structure comprising the three layers including a first magnetic layer 61, a second magnetic layer 63 facing the first magnetic layer 61 in the thickness direction, and a nonmagnetic intermediate layer 62 interposed between both magnetic layers 61 and 63.

The free magnetic layer 24 is formed on the lower pinned magnetic layer 64 with a nonmagnetic material layer 65 provided therebetween, the nonmagnetic material layer 65 having the same film structure and shape as in FIG. 7.

In FIG. 15, both side regions B each comprising a laminate of a bias underlying layer 40, a permanent-magnet layer 41, a protective layer 42 and a seed layer 22 are formed on both sides of the layers in the track width direction (the X direction), the layers ranging from the seed layer 22 to the nonmagnetic intermediate layer 28 constituting the upper pinned magnetic layer 26.

Figure 16:
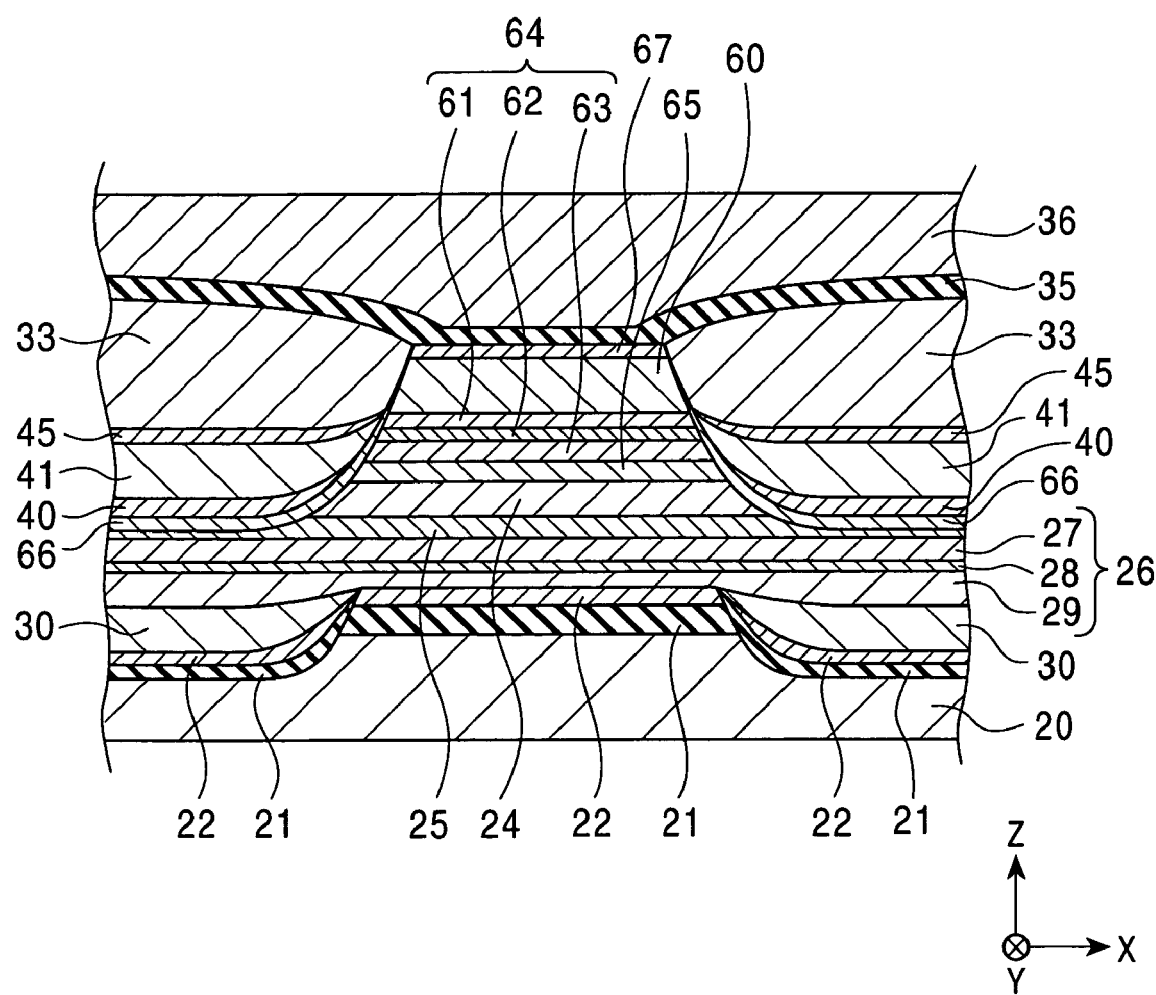
FIG. 16 is a partial sectional view of the structure of a magnetic detecting element according to a further embodiment of the present invention, as viewed from a surface facing a recording medium.

FIG. 16 is a partial sectional view of the structure of a magnetic detecting element (spin valve thin film element) according to the present invention, as viewed from a surface facing a recording medium. Like FIG. 15, FIG. 16 shows the structure of a dual spin valve thin film element.

The structure of the magnetic detecting element shown in FIG. 16 is similar to that shown in FIG. 10. Namely, the magnetic detecting element shown in FIG. 16 corresponds to the magnetic detecting element shown in FIG. 10 converted to a dual spin valve thin film element.

In FIG. 16, a structure ranging from a lower shield layer 20 to a nonmagnetic material layer 25 is the same as in FIG. 10. Namely, a free magnetic layer 24, a nonmagnetic material layer 65, a pinned magnetic layer 64 having a three-layer synthetic ferrimagnetic structure comprising a first magnetic layer 61, a second magnetic layer 63 and a nonmagnetic intermediate layer 62 interposed between both magnetic layers 61 and 63, a third antiferromagnetic layer 60, and a protective layer 67 made of Ta are laminated on the central portion of the nonmagnetic material layer 25 in the track width direction (the X direction). Also, an underlying layer 66 made of Ta, a bias underlying layer 40, a permanent-magnet layer 41, an anti-diffusion layer 45 and an electrode layer 33 are formed in that order from below on either side of the layers in the track width direction, the layers ranging from the free magnetic layer 24 to the protective layer 67.

As shown in FIGS. 15 and 16, an exchange coupling film comprising the first antiferromagnetic layer 30 and the pinned magnetic layer 26 formed above or below the free magnetic layer 24 has the same structure as the exchange coupling film of each of the single spin valve thin film elements shown in FIG. 1 to 12. Namely, the pinned magnetic layer 26 has the synthetic ferrimagnetic structure, and at least the first antiferromagnetic layer 30 is provided in contact with both side portions of the pinned magnetic layer 26 in the track width direction to produce the exchange coupling magnetic fields only between the first antiferromagnetic layer 30 and both side portions of the first magnetic layer 29 constituting the pinned magnetic layer 26.

Therefore, in the structure of the dual spin valve thin film element shown in FIG. 15 or 16, the magnetization of the pinned magnetic layer 26 can be properly pinned in the height direction, and an improvement in the reproduction output and gap narrowing can be realized. Therefore, a magnetic detecting element adaptable for a future higher recording density can be provided.

In FIGS. 15 and 16, the third antiferromagnetic layer 60 in contact with the other pinned magnetic layer 64 in the thickness direction is provided over the upper or lower surface of the pinned magnetic layer 64. However, like the first antiferromagnetic layer 30, at least the third antiferromagnetic layer 60 is provided in contact with both side portions of the pinned magnetic layer 64 in the track width direction to produce the exchange coupling magnetic fields only between the third antiferromagnetic layer 30 and both side portions of the first magnetic layer 61 constituting the pinned magnetic layer 64, thereby permitting a further improvement in the reproduction output and further narrowing of the gap. Therefore, a magnetic detecting element adaptable for a future higher recording density can be provided.

Figure 17:
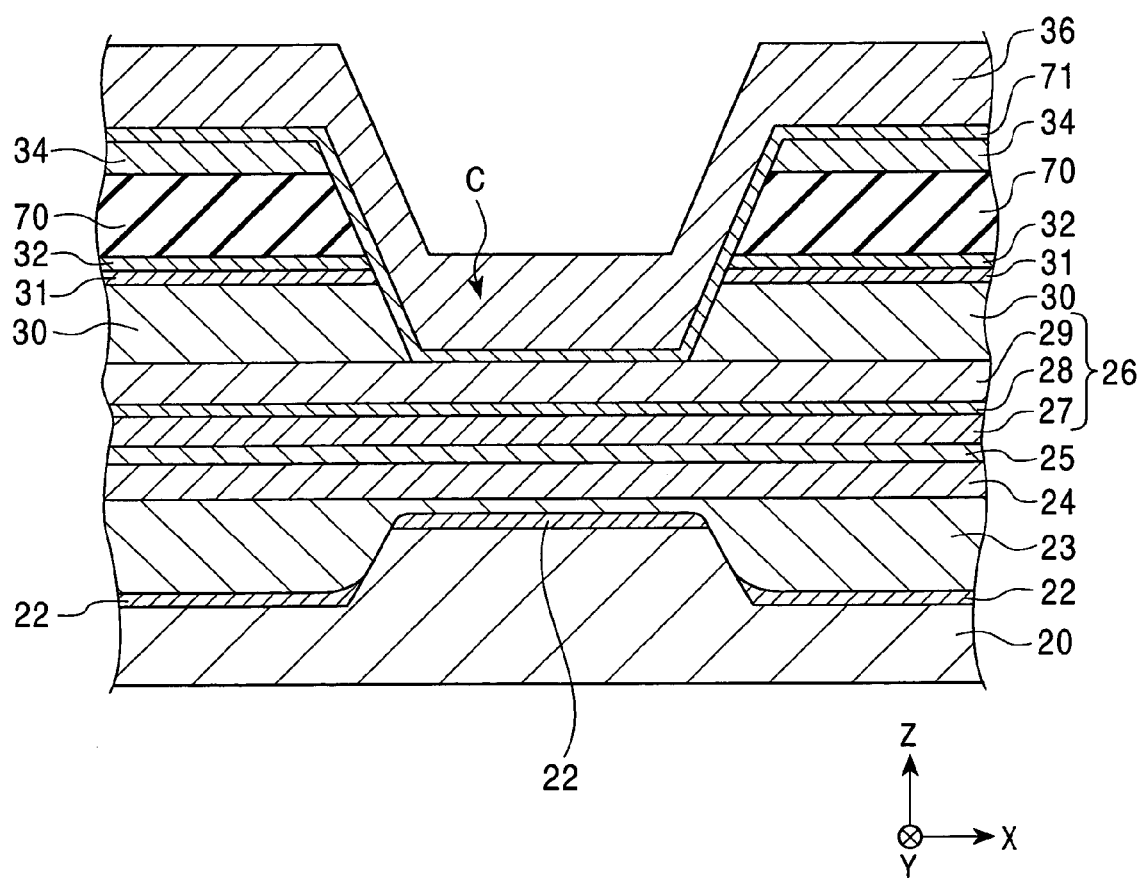
FIG. 17 is a partial sectional view of the structure of a magnetic detecting element according to a further embodiment of the present invention, as viewed from a surface facing a recording medium.

FIG. 17 is a partial sectional view of the structure of a magnetic detecting element (spin valve thin film element) according to the present invention, as viewed from a surface facing a recording medium.

Each of the magnetic detecting elements shown in FIGS. 1 to 16 is a CIP (current in the plane) type in which a sensing current from the electrode layers 33 flows in substantially parallel with each film plane of the multilayer film comprising the pinned magnetic layer 26, the nonmagnetic material layer 25 and the free magnetic layer 24. However, the construction of each of the magnetic detecting elements shown in FIGS. 1 to 16 can be applied to a CPP (current perpendicular the plane) type in which the sensing current flows in the thickness direction of each of the layers of the multilayer film.

In the embodiment shown in FIG. 17, the magnetic detecting element shown in FIG. 1 is converted to the CPP type. In FIG. 17, the layers denoted by the same reference numerals as in FIG. 1 are the same layers as in FIG. 1.

In the embodiment shown in FIG. 17, the lower shield layer 20 functions both as a shield layer and as a lower electrode layer. Also, the seed layer 22 is preferably provided on the lower shield layer 20 to function as a lower gap layer because the parasitic resistance of the element can be decreased when a gap layer made of an insulating material is not provided on the lower shield layer 20.

In FIG. 17, insulating layers 70 are disposed in the portions where the electrode layers 33 shown in FIG. 1 are provided, and a protective layer 71 made of a nonmagnetic material such as Ta or the like is formed on the insulating layers 70 and on the first magnetic layer 29 exposed from the space C of the first antiferromagnetic layer 30. The upper shield layer 36 is formed on the protective layer 71. The protective layer 71 functions as an upper gap layer, and the upper shield layer 36 functions both as a shield layer and as an upper electrode layer.

In FIG. 17, the nonmagnetic material layer 25 is made of, for example, Cu. However, in a tunneling magnetoresistive element (TMR element) using the principle of a tunneling effect, the nonmagnetic material layer 25 is made of an insulating material, for example, $Al_2O_3$ or the like.

Like in FIG. 1, in the CPP type magnetic detecting element shown in FIG. 17, the magnetization of the pinned magnetic layer 26 can be properly pinned in the height direction, and gap narrowing can be realized. Therefore, a magnetic detecting element adaptable for a future higher recording density can be provided.

As described above, the first antiferromagnetic layer 30 is provided above or below both side portions of the first magnetic layer 29 constituting the pinned magnetic layer 26, and the nonmagnetic metal layer having the same composition as the first antiferromagnetic layer 30 may be provided in the space C formed at the center of the first antiferromagnetic layer 30 in the track width direction (the X direction). However, when the nonmagnetic metal layer is provided, the technique described below is preferably made for desirably pinning the magnetization of the central portion of the pinned magnetic layer 26.

Figure 18:
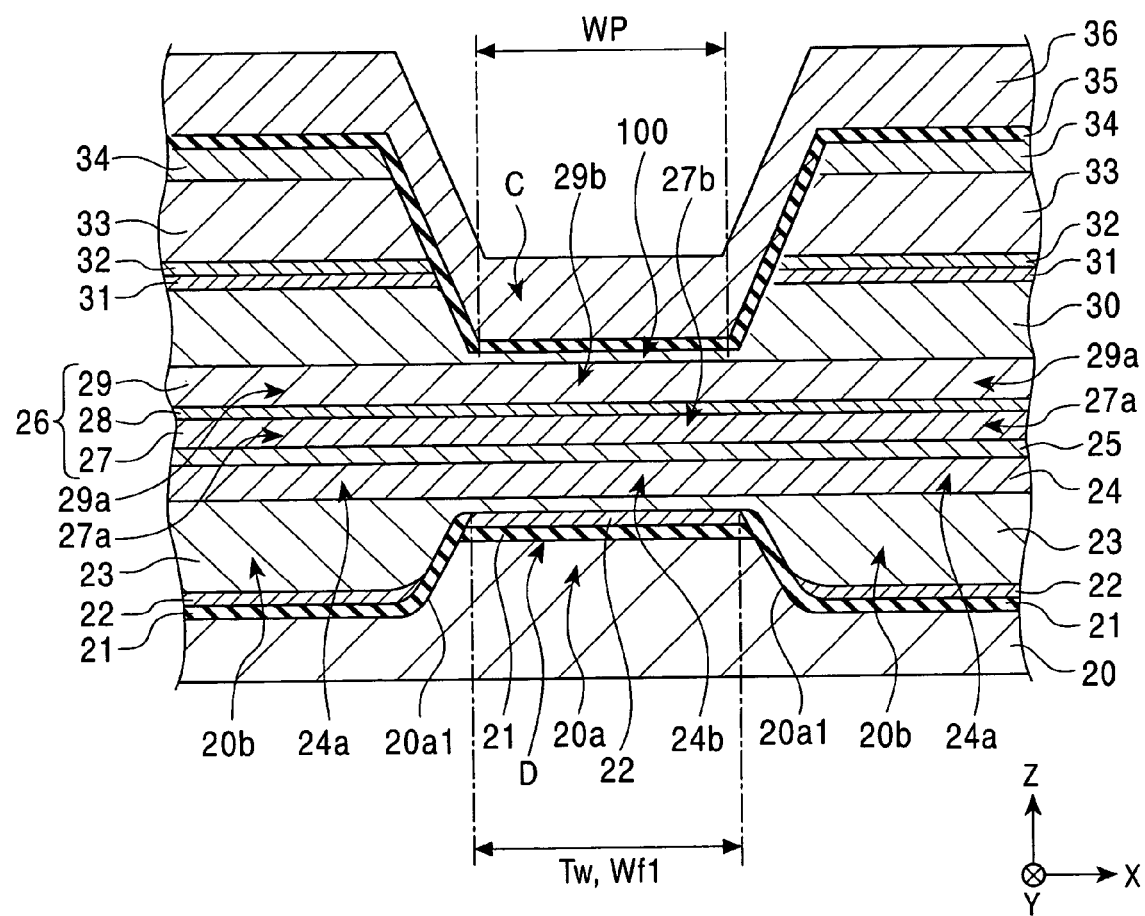
FIG. 18 is a partial sectional view of the structure of a magnetic detecting element according to a further embodiment of the present invention, as viewed from a surface facing a recording medium.

FIG. 18 shows a structure of the magnetic detecting element shown in FIG. 1 in which a nonmagnetic metal material 100 is provided in the space C at the center of the first antiferromagnetic layer 30.

The nonmagnetic metal layer 100 has the same composition as the first antiferromagnetic layer 30 formed on both sides of the space. For example, the nonmagnetic metal layer 100 is made of a PtMn alloy or X—Mn (wherein X is at least one element of Pt, Pd, Ir, Rh, Ru, Os, Ni, and Fe) alloy.

The thickness of the nonmagnetic metal layer 100 is smaller than that of the first antiferromagnetic layer 30, and preferably 5 Å to 50 Å.

When the thickness of the nonmagnetic metal layer 100 made of a PtMn alloy or X—Mn (wherein X is at least one element of Pt, Pd, Ir, Rh, Ru, Os, Ni, and Fe) alloy is in the above range, the nonmagnetic metal layer maintains a face-centered cubic crystal structure (fcc) given at the time of deposition. When the thickness of the nonmagnetic metal layer 100 is larger than 50 Å, the crystal structure of the nonmagnetic metal layer 100 is undesirably transformed into a CuAuI-type ordered face-centered tetragonal structure (fct) by heating to about 250° C. or more in the same manner as the first antiferromagnetic layer 30. However, even when the thickness of the nonmagnetic metal layer 100 is larger than 50 Å, the nonmagnetic metal layer 100 maintains the face-centered cubic (fcc) crystal structure given at the time of deposition unless it is heated to about 250° C. or more.

When the nonmagnetic metal layer 100 made of a PtMn alloy or X—Mn (wherein X is at least one element of Pt, Pd, Ir, Rh, Ru, Os, Ni, and Fe) alloy has the face-centered cubic crystal structure (fcc), no or very low exchange coupling magnetic field occurs at the interface between the nonmagnetic metal layer 100 and the central potion 29$b$ of the first magnetic layer 29, and thus the magnetization direction of the central portion 29$b$ of the first magnetic layer 29 cannot be pinned by the exchange coupling magnetic field. This point is as described above. As described above, the bias magnetic field through the exchange interaction in the magnetic layer and the coupling magnetic field due to the RKKY interaction are applied to the first magnetic layer 29.

In FIG. 18, the magnetization of the central portion of the pinned magnetic layer 26 is stabilized in consideration of uniaxial anisotropy in the central portion of the pinned magnetic layer 26 other than the above-described operation.

In the embodiment shown in FIG. 18, the thickness of the second magnetic layer 27 is larger than that of the first magnetic layer 29. For example, the magnetization of the second magnetic layer 27 is oriented in the height direction (the Y direction), and the magnetization of the first magnetic layer 29 is pinned in the direction antiparallel to the height direction.

The thickness of the first magnetic layer 29 is 10 Å to 30 Å, and the thickness of the second magnetic layer 27 is 15 Å to 35 Å. With the first magnetic layer 29 having a larger thickness, the bias magnetic field for pinning the magnetization of the pinned magnetic layer 26 increases. However, with the first magnetic layer 29 having a larger thickness, a shunt loss is increased. Also, a distortion occurs in the crystal structure of the central portion 29$b$ of the first magnetic layer 29 due to conformity with the nonmagnetic metal layer 100, thereby increasing the magnetostrictive constant λ and uniaxial anisotropy due to the distortion. However, with the first magnetic layer 29 having a larger thickness, a distortion occurring near the interface of the central portion 29$b$ of the first magnetic layer 29 is small relative to the whole volume of the fist magnetic layer 29, thereby decreasing the magnetostrictive constant λ and uniaxial anisotropy.

In this embodiment, of the induced magnetic anisotropy and the magnetoelastic effect which determine the uniaxial anisotropy for pinning the magnetization of the central portion of the pinned magnetic layer 26, the magnetoelastic effect is mainly utilized.

The magnetoelastic effect is dominated by magnetoelastic energy. The magnetoelastic energy is defined by stress σ applied to the pinned magnetic layer 26 and the magnetostrictive constant λ of the central portion of the pinned magnetic layer 26.

Figure 21:
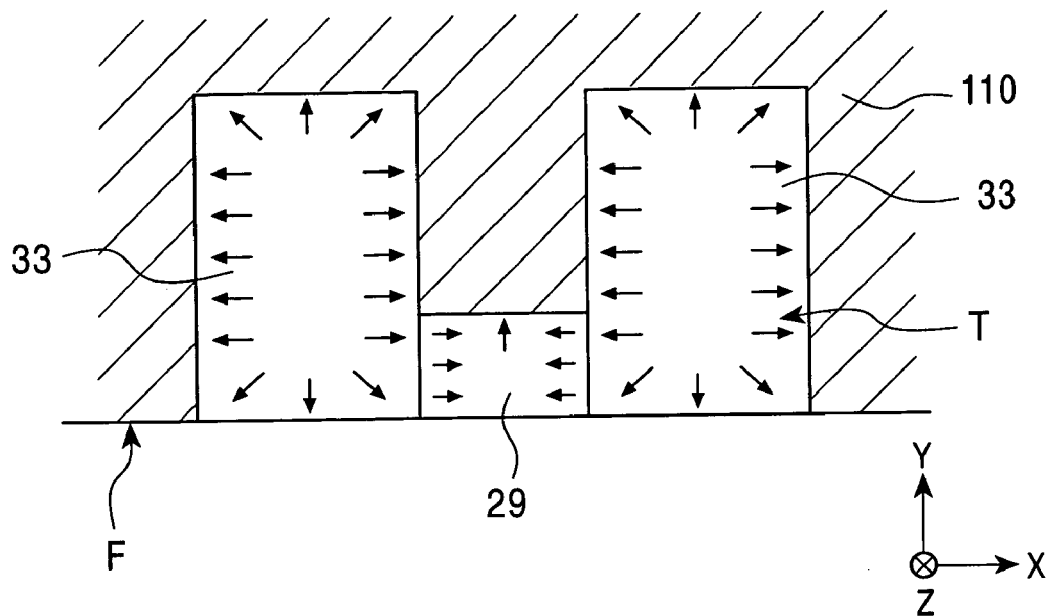
FIG. 21 is a partial plan view of the magnetic detecting element shown in FIG. 18.

FIG. 21 is a partial top plan view of the magnetic detecting element shown in FIG. 18 (as viewed from a direction opposite to the Z direction). FIG. 21 shows only the electrode layers 33 and the first magnetic layer 29 among the layers constituting the magnetic detecting element T.

As shown in FIG. 21, the periphery of the magnetic detecting element T is filled with an insulating material layer 110 shown by oblique lines.

The end surface F of the magnetic detecting element T near the surface facing the recording medium is an open end which is exposed or covered with a protective thin layer having a thickness of 20 Å to 50 Å and made of diamond-like carbon (DLC) or the like.

Therefore, in the magnetic detecting element T, tensile stress is applied in parallel with the height direction (the Y direction) from the gap layers 21 and 35 disposed at the bottom and top. Although the stress of each gap layer is originally isotropic in a two-dimensional manner, the symmetry is broken by the open end F, and thus uniaxially anisotropic tensile stress is applied in the height direction.

Furthermore, as shown in FIG. 21, compressive stress occurs from the electrode layers 33 in directions parallel and antiparallel to the track width direction (the X direction), and the compressive stress is transmitted to the lower layer of the magnetic detecting element T. As a result, the tensile stress in the height direction and the compressive stress in the track width direction are applied to the pinned magnetic layer 26 having the end surface F open near the surface facing the recording medium. Since the first magnetic layer 29 is made of a magnetic material having a positive value of magnetostrictive constant, the easy magnetization axis of the first magnetic layer 29 becomes parallel to the rearward direction (the height direction, the Y direction shown in the drawing) of the magnetic detecting element by the magnetoelastic effect.

In the embodiment shown in FIG. 18, the magnetostrictive constant of the central portion of the pinned magnetic layer 26 is increased to increase the magnetoelastic energy applied to the central portion, thereby increasing the uniaxial anisotropy of the central portion of the pinned magnetic layer 26. With the central portion of the pinned magnetic layer 26 having the increased uniaxial anisotropy, the magnetization of the central portion of the pinned magnetic layer 26 is strongly pinned in a predetermined direction without the exchange coupling magnetic field between the central portion and the first antiferromagnetic layer 30 unlike in both side portions, thereby increasing the output of the magnetic detecting element and improving the stability and symmetry of the output.

More specifically, the central portion 29$b$ of the first magnetic layer 29 constituting the pinned magnetic layer 26 is joined with the nonmagnetic metal layer 100 to produce a distortion in the crystal structure of the central portion 29$b$ of the first magnetic layer 29, thereby increasing the magnetostrictive constant λ of the central portion 29b of the first magnetic layer 29.

As described above, the nonmagnetic metal layer 100 assumes the fcc structure in which an equivalent crystal plane represented by the {111} plane is preferentially oriented in parallel with the interface.

On the other hand, when the first magnetic layer 29 of the pinned magnetic layer 26 is made of Co or $Co_xFe_y$ (y≦20, x+y=100), the first magnetic layer 29 assumes the face-centered cubic lattice (fcc) structure. Also, in the first magnetic layer 29, an equivalent crystal plane represented by the {111} plane is preferentially oriented in parallel with the interface.

Therefore, the constituent atoms of the central portion 29b of the first magnetic layer 29 easily overlap with the constituent atoms of the nonmagnetic metal layer 100, and thus the crystal in the nonmagnetic metal layer 100 epitaxially is coherent with the crystal in the central portion of the pinned magnetic layer 26.

However, a predetermined difference or more must be present between the distance between nearest neighbor atoms in the {111} plane of the central portion 29b of the first magnetic layer 29 and the distance between nearest neighbor atoms in the {111} plane of the nonmagnetic metal layer 100.

In order to produce a distortion in each crystal structure for increasing the magnetostriction of the central portion 29b of the first magnetic layer 29 while the constituent atoms of the nonmagnetic metal layer 100 overlap with the constituent atoms of the central portion 29b of the first magnetic layer 29, the Pt content of the PtMn alloy used as the material for the nonmagnetic metal layer 100, or the X element content of the X—Mn alloy is preferably controlled.

For example, when the Pt content of the PtMn alloy, or the X element content of the X—Mn alloy is 51 atomic percent or more, the magnetostriction of the central portion 29b of the first magnetic layer 29 overlapping with the nonmagnetic metal layer 100 rapidly increases. When the Pt content of the PtMn alloy, or the X element content of the X—Mn alloy is 55 atomic percent to 95 atomic percent, the magnetostriction of the central portion 29b of the first magnetic layer 29 is stabilized at a high value.

Also, the difference between the distance between nearest neighbor atoms in the {111} plane of the nonmagnetic metal layer 100 and the distance between nearest neighbor atoms in the {111} plane of the central portion 29b of the first magnetic layer 29 is divided by the distance between nearest neighbor atoms in the {111} plane of the central portion 29b of the first magnetic layer 29 to obtain a value (referred to as a "mismatch value" hereinafter). The value is preferably 0.05 to 0.20.

Figure 22:
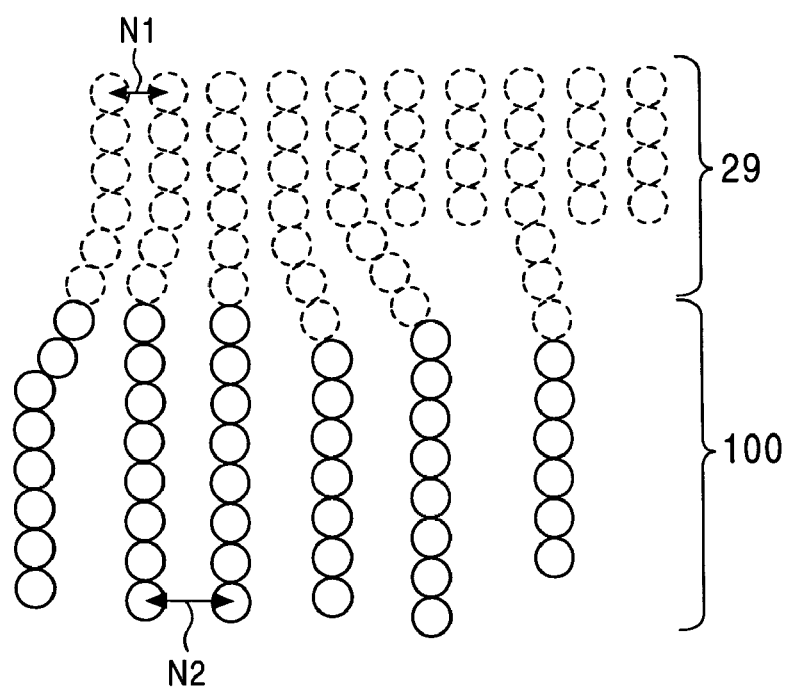
FIG. 22 is a schematic view showing a state in which a distortion occurs in a state in which a nonmagnetic metal layer is coherent with a central portion of a first magnetic layer of a pinned magnetic layer.

In the magnetic detecting element of this embodiment, as schematically shown in FIG. 22, a distortion occurs in each crystal structure near the interface, while the constituent atoms of the nonmagnetic metal layer 100 overlap with the constituent atoms of the central portion 29b of the first magnetic layer 29.

In FIG. 22, reference numeral N1 denotes the distance between nearest neighbor atoms in the {111} plane of the central portion 29b of the first magnetic layer 29, and reference numeral N2 denotes the distance between nearest neighbor atoms in the {111} plane of the nonmagnetic metal layer 100. Each of the distances N1 and N2 is measured at a position away from the interface between the nonmagnetic metal layer 100 and the central portion 29b of the first magnetic layer 29 because of the small effect of the distortion.

In this way, when a distortion occurs in the crystal structure of the central portion 29b of the first magnetic layer 29, the magnetostrictive constant λ of the central portion of the first magnetic layer 29 can be increased to exhibit the large magnetoelastic effect.

Figure 23:
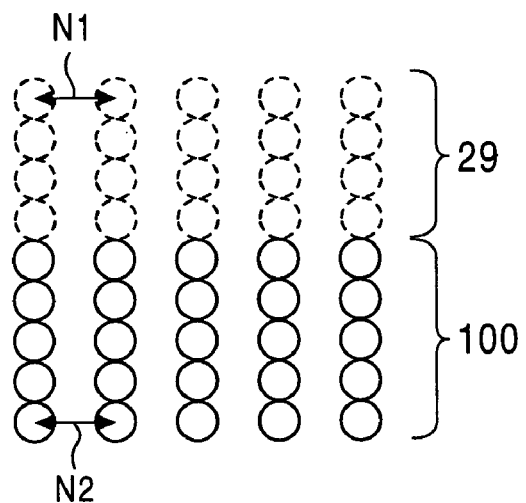
FIG. 23 is a schematic view showing alignment between a nonmagnetic metal layer and a central portion of a first magnetic layer of a pinned magnetic layer.

When the mismatch value between the nonmagnetic metal layer 100 and the central portion 29b of the first magnetic layer 29 is too small, no distortion occurs in the crystal structure near the interface when the atoms of the nonmagnetic metal layer 100 overlap with the atoms of the central portion 29b of the first magnetic layer 29, as shown in FIG. 23. Therefore, the magnetostrictive constant λ of the central portion 29b of the first magnetic layer 29 cannot be increased.

Figure 24:
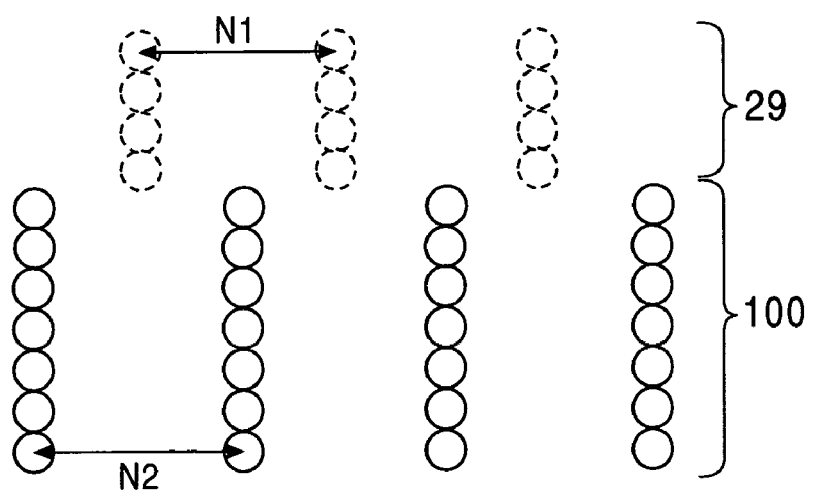
FIG. 24 is a schematic drawing showing an incoherent state between a nonmagnetic metal layer and a central portion of a first magnetic layer of a pinned magnetic layer.

When the mismatch value between the nonmagnetic metal layer 100 and the central portion 29b of the first magnetic layer 29 is too large, the atoms of the nonmagnetic metal layer 100 do not overlap with the atoms of the central portion 29b of the first magnetic layer 29 to create a non-epitaxial or incoherent state, as schematically shown in FIG. 24. In the non-epitaxial or incoherent state between the atoms of the nonmagnetic metal layer 100 and the central portion 29b of the first magnetic layer 29, no distortion occurs in the crystal structure near the interface, and thus the magnetostrictive constant λ of the central portion 29b of the first magnetic layer 29 cannot be increased.

The central portion 29b of the first magnetic layer 29 constituting the pinned magnetic layer 26 may assume a body-centered cubic lattice (bcc) structure in which an equivalent crystal plane represented by the {110} plane is preferentially oriented in parallel with the interface.

For example, when the first magnetic layer 29 of the pinned magnetic layer 26 is made of $Co_xFe_y$ (y≧20, x+y=100), the first magnetic layer 29 assumes the body-centered cubic lattice (bcc) structure.

As described above, the nonmagnetic metal layer 100 assumes the fcc structure in which an equivalent crystal plane represented by the {111} plane is preferentially oriented in parallel with the interface.

The atomic arrangement in the equivalent crystal plane represented by the {110} plane of a crystal having the bcc structure is similar to the atomic arrangement in the equivalent crystal plane represented by the {111} plane of a crystal having the fcc structure, and thus the crystal having the bcc structure and the crystal having the fcc structure can be put into a coherent state, i.e., a heteroepitaxial state, in which the atoms of one of the crystals overlap with the atoms of the other crystal.

Furthermore, a predetermined difference or more occurs between the distance between nearest neighbor atoms in the {110} plane of the central portion 29b of the first magnetic layer 29 and the distance between nearest neighbor atoms in the {111} plane of the nonmagnetic metal layer 100. Therefore, a distortion occurs in each crystal structure near the interface between the central portion 29b of the first magnetic layer 29 and the nonmagnetic metal layer 100, while the constituent atoms of the central portion 29b of the first magnetic layer 29 overlap with the constituent atoms of the nonmagnetic metal layer 100. Thus, the magnetostrictive constant λ of the central portion 29b of the first magnetic layer 29 can be increased by producing a distortion in the crystal structure of the central portion 29b of the first magnetic layer 29.

With a composition near y=50, the $Co_xFe_y$ (y≧20, x+y=100) assuming the bcc structure has a larger magnetostrictive constant λ than that of the $Co_xFe_y$ (y≦20, x+y=100) assuming the fcc structure, and thus the larger magnetoelastic effect can be expected. Also, the $Co_xFe_y$ (y≧20, x+y=100) assuming the bcc structure has large coercive force, and thus the magnetization of the central portion of the pinned magnetic layer 26 can be strongly pinned.

In the present invention, the central portion 29b of the first magnetic layer 29 and the nonmagnetic metal layer 100 may be put into a coherent state near the interface therebetween, in which the constituent atoms of the central portion 29b of the first magnetic layer 29 overlap with most of the constituent atoms of the nonmagnetic metal layer 100. For example, as schematically shown in FIG. 22, there may be a portion in which the constituent atoms of the central portion 29b of the first magnetic layer 29 do not overlap with the constituent atoms of the nonmagnetic metal layer 100.

As the material for the second magnetic layer 27, either $Co_xFe_y$ (y≧20, x+y=100) assuming the bcc structure or $Co_xFe_y$ (y≦20, x+y=100) assuming the fcc structure may be used.

When $Co_xFe_y$ (y≧20, x+y=100) assuming the bcc structure is used as the material for the second magnetic layer 27, positive magnetostriction can be increased. The $Co_xFe_y$ (y≧20, x+y=100) assuming the bcc structure has high coercive force, and thus the magnetization of the central portion of the pinned magnetic layer 26 can be strongly pinned. Also, the RKKY interaction between the first and second magnetic layers 29 and 27 through the nonmagnetic intermediate layer 23b can be strengthened.

On the other hand, the second magnetic layer 27 is in contact with the nonmagnetic material layer 25 and has a large effect on the magnetoresistive effect. Therefore, when the second magnetic layer 27 is made of Co or $Co_xFe_y$ (y≦20, x+y=100) assuming the fcc structure, the magnetoresistive effect little deteriorates.

In the embodiment shown in FIG. 18, when each of the electrode layers 33 is made of Cr (chromium), α-Ta or Rh, and the lattice spacing of each electrode layer 33 in a direction parallel to the film plane is 0.2044 nm or more, 0.2337 nm or more, and 0.2200 nm or more for the {110} plane of Cr (bcc), the {110} plane of α-Ta (bcc), and the {111} plane of Rh (fcc), respectively, the compressive stress applied to the pinned magnetic layer 26 formed below the electrode layers 33 can be increased. In this case, the electrode layers 33 are stretched in the arrow directions shown in FIG. 21, i.e., in the outward direction of the electrodes 33, and the compressive stress is applied to the pinned magnetic layer 26 in parallel and antiparallel to the track width direction (the X direction shown in the drawing).

The lattice spacing of each electrode layer 33 in parallel with the film plane can be measured by X-ray diffraction or electron beam diffraction. In a bulk state, the lattice spacings of Cr, α-Ta and Rh in a direction parallel to the film plane are 0.2040 nm, 0.2332 nm, and 0.2196 nm for the {110} plane of Cr (bcc), the {110} plane of α-Ta (bcc), and the {111} plane of Rh (fcc), respectively. With the lattice spacing of the above value or more, the electrode layers 33 apply compressive stress to the pinned magnetic layer 26.

The electrode layers 33 made of Cr and the electrode layers 33 made of a soft metal such as Au have the following difference in the compressive stress.

For example, the compressive stress produced by a film comprising a bias underlying layer of Cr (50 Å), a hard bias layer of CoPt (200 Å), an intermediate layer of Ta (50 Å), an electrode layer of Au (800 Å), and a protective layer of Ta (50 Å), which are laminated in turn from below, is 280 MPa.

On the other hand, the compressive stress produced by a film comprising a bias underlying layer of Cr (50 Å), a hard bias layer of CoPt (200 Å), an intermediate layer of Ta (50 Å), an electrode layer of Cr (1400 Å), and a protective layer of Ta (50 Å), which are laminated in turn from below, is 670 MPa.

In depositing the electrode layers 33 by sputtering, ion beam sputtering is performed by a sputtering apparatus in which the pressure of Ar, Xe, Kr, or the like is decreased to $5 \times 10^{-3}$ Pa to $1 \times 10^{-1}$ Pa. In the sputtering apparatus in which the pressure of Ar, Xe, Kr, or the like is decreased, the probability of collision of Cr atoms of the electrode layers 33 with Ar or Xe atoms is decreased to deposit the Cr atoms maintaining high energy. When Cr atoms having high energy and scattered from a target collide with a Cr film, which has been deposited, and are buried in the Cr film, the electrode layers 33 are stretched outward.

When the permanent-magnet layers 41 overlap with both side portions of a portion of the pinned magnetic layer 26 in the track width direction, as shown in FIG. 5, the magnetization direction of the pinned magnetic layer 26 is easily inclined by a longitudinal bias magnetic field produced by each permanent-magnet layer 41. Therefore, the magnetostriction of the free magnetic layer 24 is preferably made negative. As described above, the compressive stress is applied to both side portions of the magnetic detecting element, and thus the easy magnetization axis of the free magnetic layer 24 having negative magnetostriction easily becomes parallel or antiparallel to the track width direction by the magnetoelastic effect.

The magnetizations of both side portions of the free magnetic layer 24 in the track width direction are easily instabilized by a demagnetizing field. However, both end portions of the free magnetic layer 24 in the track width direction are near the permanent-magnet layers 41, and thus great compressive stress is applied to both side portions. Therefore, in both sides portions of the free magnetic layer 24 in the track width direction, anisotropy due to the magnetoelastic effect is increased to stabilize the magnetization directions.

Even when the thickness of each permanent-magnet layer 41 is decreased to decrease the longitudinal bias magnetic field, the free magnetic layer 24 can be stably put into the single domain state. When the thickness of each permanent-magnet layer 41 can be decreased to decrease the longitudinal bias magnetic field, the pinned magnetization state of the pinned magnetic layer 26 in the height direction can be stabilized.

Since, in the central portion of the free magnetic layer 24, the compressive stress is lower than that applied to both side portions, thereby suppressing a decrease in magnetic field detection sensitivity.

The magnetostrictive constant λ of the free magnetic layer 24 is preferably in the range of $-8 \times 10^{-6} \leq \lambda \leq 0.5 \times 10^{-6}$. The thickness of the permanent-magnet layers 41 is preferably in the range of 100 Å≦t≦200 Å. With the free magnetic layer 24 having excessively negative magnetostriction λ or the permanent-magnet layers 41 having an excessively large thickness, the reproduction sensitivity of the magnetic detecting element deteriorates. On the other hand, with the free magnetic layer 24 having excessively high magnetostriction λ or the permanent-magnet layers 41 having an excessively small thickness, the reproduction waveform of the magnetic detecting element is easily disturbed.

Figure 19:
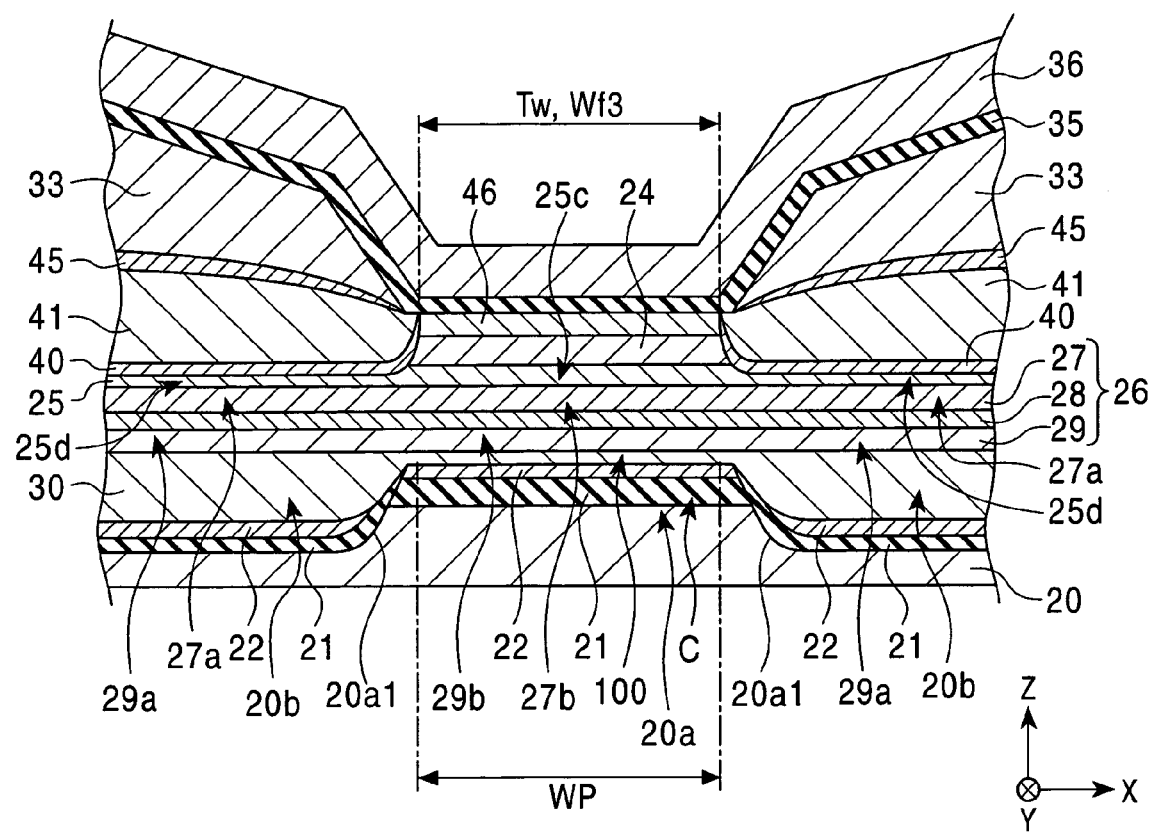
FIG. 19 is a partial sectional view of the structure of a magnetic detecting element according to a further embodiment of the present invention, as viewed from a surface facing a recording medium.

FIG. 19 shows a magnetic detecting element according to a modified embodiment of that shown in FIG. 10. Like in FIG. 18, in FIG. 19, a nonmagnetic metal layer 100 having a small thickness and the same composition as that of a first antiferromagnetic layer 30 is formed in a space formed at the center of the first antiferromagnetic layer 30 in the track width direction. The preferred forms of the nonmagnetic metal layer 100 and a first magnetic layer 29 are described in detail above with reference to FIG. 18, and thus the description thereof is omitted.

Figure 20:
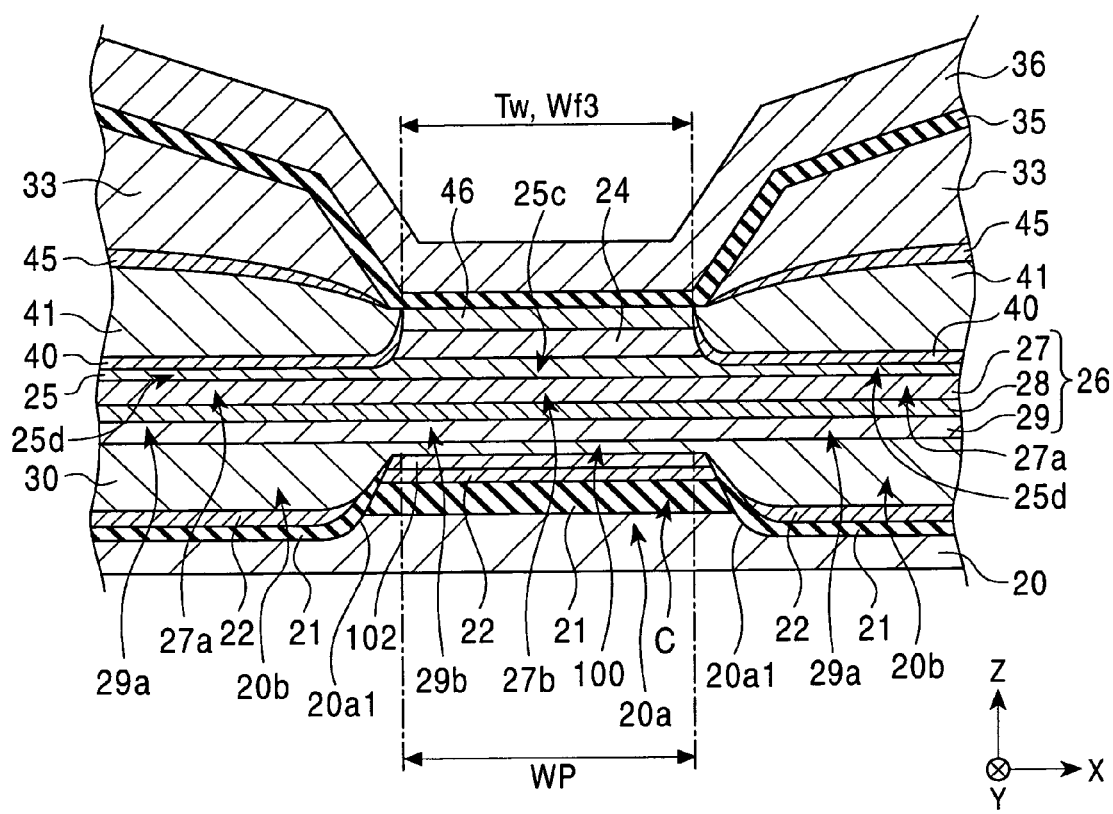
FIG. 20 is a partial sectional view of the structure of a magnetic detecting element according to a further embodiment of the present invention, as viewed from a surface facing a recording medium.

FIG. 20 shows a magnetic detecting element according to a modified embodiment of that shown in FIG. 19. In FIG. 20, a nonmagnetic metal layer 102 made of at least one selected from Ru, Re, Os, Ti, Rh, Ir, Pd, Pt, and Al is interposed between a seed layer 22 and a nonmagnetic metal layer 100 formed in the space at the center of a first antiferromagnetic layer 30.

The distance between nearest neighbor atoms in the {111} plane or C plane of the nonmagnetic metal layer 102 made of Ru or the like is smaller than the distance between nearest neighbor atoms in the {111} plane of the nonmagnetic metal layer 100 made of a PtMn alloy or X—Mn (wherein X is at least one element of Pd, Ir, Rh, Ru, Os, Ni, and Fe) alloy. In this case, the distance between nearest neighbor atoms in parallel with the film plane can be stepwisely increased in the direction from the seed layer 22 to the nonmagnetic metal layer 100, thereby suppressing the phenomenon that an excessive distortion occurs in the central portion 29b of the first magnetic layer 29 to partially increase an incoherent region.

Figure 25:
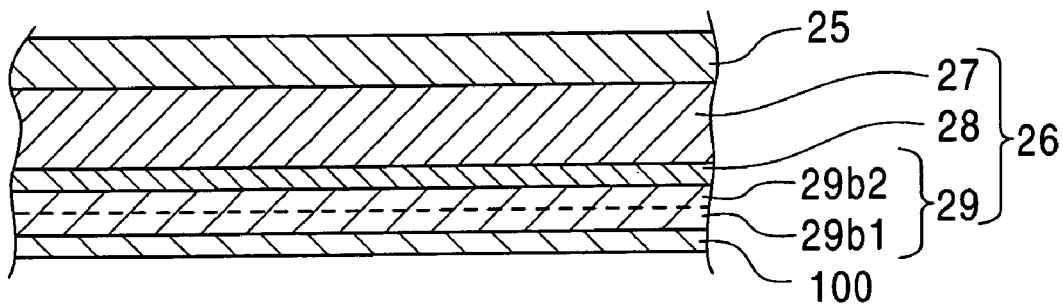
FIG. 25 is a partial sectional view of the vicinity of a central potion of a pinned magnetic layer of a magnetic detecting element according to the present invention.
Figure 26:
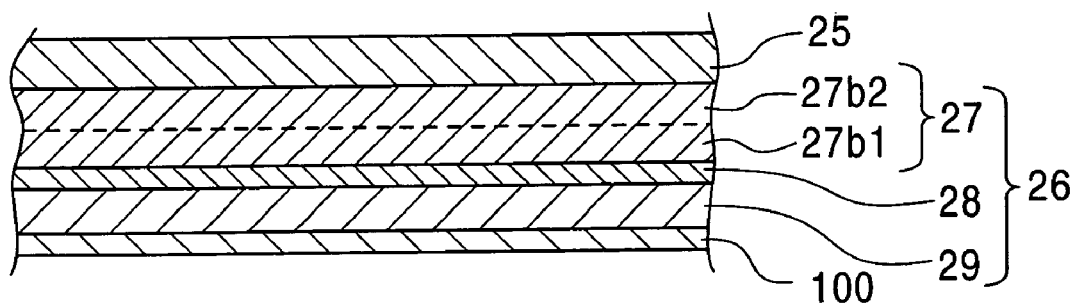
FIG. 26 is a partial sectional view of the vicinity of a central potion of a pinned magnetic layer of a magnetic detecting element according to the present invention.
Figure 27:
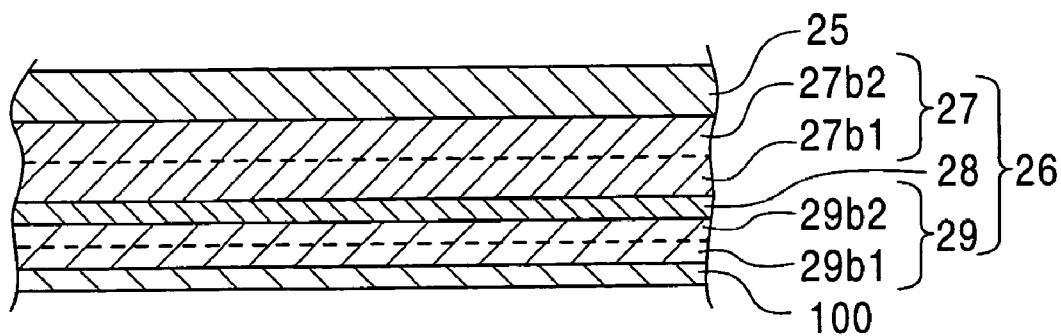
FIG. 27 is a partial sectional view of the vicinity of a central potion of a pinned magnetic layer of a magnetic detecting element according to the present invention.

FIGS. 25 to 27 are partial sectional views respectively showing the pinned magnetic layers 26 according to other embodiments. Each of FIGS. 25 to 27 is an enlarged view showing the pinned magnetic layer 26 near the center of the element shown in FIG. 19.

As shown in FIG. 25, the first magnetic layer 29 constituting the pinned magnetic layer 26 may comprise a fcc magnetic layer 29b1 provided near the nonmagnetic metal layer 100, and a bcc magnetic layer 29b2 provided near the nonmagnetic intermediate layer 28.

The fcc magnetic layer 29b1 has a face-centered lattice (fcc) structure in which an equivalent crystal plane represented by the {111} plane is preferentially oriented in parallel with the interface, and the bcc magnetic layer 29b2 has a body-centered lattice (bcc) structure in which an equivalent crystal plane represented by the {110} plane is preferentially oriented in parallel with the interface.

The fcc magnetic layer 29b1 is made of Co or $Co_xFe_y$ ($y \leq 20$, $x+y=100$), and the bcc magnetic layer 29b2 is made of $Co_xFe_y$ ($y \geq 20$, $x+y=100$).

The first magnetic layer 29 has the bcc structure near the interface with the nonmagnetic intermediate layer 28, and thus the magnetostrictive constant λ of the central portion 29b of the first magnetic layer 29 can be increased to exhibit the large magnetoelastic effect. Also, when the first magnetic layer 29 has a composition of $Co_xFe_y$ ($y \geq 20$, $x+y=100$) near the nonmagnetic intermediate layer 28, the RKKY interaction between the first magnetic layer 29 and the second magnetic layer 27 through the nonmagnetic intermediate layer 28 is strengthened.

On the other hand, the first magnetic layer 29 has the fcc structure near the interface with the nonmagnetic metal layer 100, and thus the central portions of the pinned magnetic layer 26, the nonmagnetic material layer 25 and the free magnetic layer 24 have constant crystal orientation, thereby increasing the crystal gain size and increasing the rate (MR ratio) of magnetoresistance change.

As shown in FIG. 26, the second magnetic layer 27 constituting the pinned magnetic layer 26 may comprise a fcc magnetic layer 27b2 provided near the nonmagnetic material layer 25, and a bcc magnetic layer 27b1 provided near the nonmagnetic intermediate layer 28.

The fcc magnetic layer 27b2 has a face-centered cubic lattice (fcc) structure in which an equivalent crystal plane represented by the {111} plane is preferentially oriented in parallel with the interface, and the bcc magnetic layer 27b1 has a body-centered cubic lattice (bcc) structure in which an equivalent crystal plane represented by the {110} plane is preferentially oriented in parallel with the interface, The fcc magnetic layer 27b2 is made of Co or $Co_xFe_y$ ($y \leq 20$, $x+y=100$), and the bcc magnetic layer 27b1 is made of $Co_xFe_y$ ($y \geq 20$, $x+y=100$).

The second magnetic layer 27 has the bcc structure near the interface with the nonmagnetic intermediate layer 28, and thus the magnetostrictive constant λ of the central portion 27b of the second magnetic layer 27 can be increased to exhibit the large magnetoelastic effect. Also, when the second magnetic layer 27 has a composition of $Co_xFe_y$ ($y \geq 20$, $x+y=100$) near the nonmagnetic intermediate layer 28, the RKKY interaction between the first magnetic layer 29 and the second magnetic layer 27 through the nonmagnetic intermediate layer 28 is strengthened.

On the other hand, when the central portion 29b of the first magnetic layer 29 has the fcc structure near the interface with the nonmagnetic metal layer 100, deterioration in the magnetoresistive effect can be suppressed.

As shown in FIG. 27, the first magnetic layer 29 constituting the pinned magnetic layer 26 may comprise a fcc magnetic layer 29b1 provided near the nonmagnetic metal layer 100, and a bcc magnetic layer 29b2 provided near the nonmagnetic intermediate layer 28, and the second magnetic layer 27 may comprise a fcc magnetic layer 27b2 provided near the nonmagnetic material layer 25, and a bcc magnetic layer 27b1 provided near the nonmagnetic intermediate layer 28.

In FIGS. 25 to 27, the first magnetic layer 29 has a laminated structure comprising the fcc magnetic layer 29b1 and the bcc magnetic layer 29b2, or the second magnetic layer 27 a laminated structure comprising the fcc magnetic layer 27b2 and bcc magnetic layer 27b1.

However, in the present invention, in the vicinity of the interface with the nonmagnetic metal layer 100, the first magnetic layer 29 of the pinned magnetic layer 26 may assume the face-centered cubic lattice (fcc) structure in which an equivalent crystal plane represented by the {111} plane is preferentially oriented in parallel with the interface, and in the vicinity of the interface with the nonmagnetic intermediate layer 28, the first magnetic layer 29 may assume the body-centered cubic lattice (bcc) structure in which an equivalent crystal plane represented by the {110} plane is preferentially oriented in parallel with the interface.

Therefore, the first magnetic layer 29 of the pinned magnetic layer 26 may have a composition comprising Co or $Co_xFe_y$ ($y \leq 20$, $x+y=100$) and thus assumes the fcc structure in which an equivalent crystal plane represented by the {111} plane is preferentially oriented in parallel with the interface. Also, the Fe concentration may be gradually increased in the direction from the interface with the nonmagnetic metal layer 100 to the interface with the nonmagnetic intermediate layer 28 so that the first magnetic layer 29 has a composition comprising $Co_xFe_y$ ($y \geq 20$, $x+y=100$) near the nonmagnetic intermediate layer 28 and thus assumes the body-centered cubic lattice (bcc) structure in which an equivalent crystal plane represented by the {110} plane is preferentially oriented in parallel with the interface.

Similarly, the second magnetic layer 27 may be made of the CoFe alloy in which the Fe concentration gradually increases from the interface with the nonmagnetic material layer 25 to the interface with the nonmagnetic intermediate layer 28.

FIGS. 28 to 32 are drawings respectively showing steps of the method for manufacturing the magnetic detecting element shown in FIG. 1. Each of FIGS. 28 to 32 is a partial sectional view of the magnetic detecting element in each step, as viewed from the surface facing the recording medium.

Figure 28:
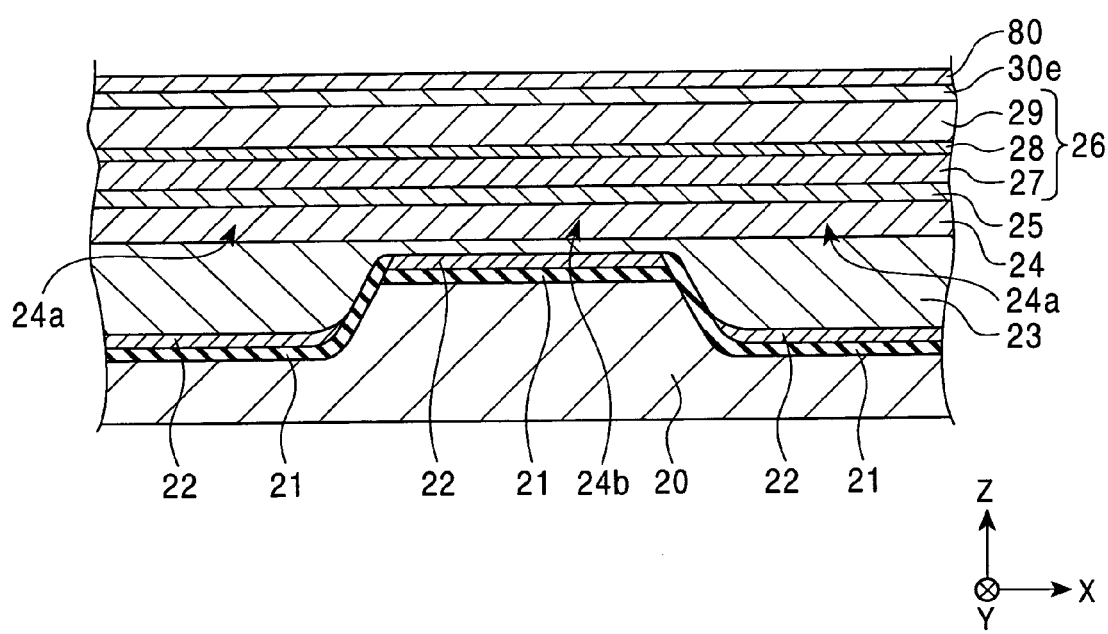
FIG. 28 is a drawing showing a step for manufacturing the magnetic detecting element shown in FIG. 1.

In the step shown in FIG. 28, first, the lower shield layer 20, the lower gap layer 21, the seed layer 22, the second antiferromagnetic layer 23, the free magnetic layer 24, the nonmagnetic material layer 25, and the pinned magnetic layer 26 having the synthetic ferrimagnetic structure comprising the first magnetic layer 29, the second magnetic layer 27 and the nonmagnetic intermediate layer 28 interposed between both magnetic layers 29 and 27 are formed in the shape shown in FIG. 28. Then, a nonmagnetic metal thin layer 30e having the same composition as the first antiferromagnetic layer 30 is deposited on the first magnetic layer 29, and a nonmagnetic layer 80 made of Ru, Cr, or the like is deposited on the nonmagnetic metal layer 30e. The nonmagnetic layer 80 serves as a protective layer for preventing oxidation of the nonmagnetic metal layer 30e.

The thickness of the nonmagnetic metal layer 30e is smaller than 50 Å. With such a thin nonmagnetic metal layer 30e, even in magnetic field annealing in the next step, the nonmagnetic metal layer 30e cannot be transformed from a disordered lattice to an ordered lattice due to a binding force of bonding with the first magnetic layer 29 provided below the nonmagnetic metal layer 30e. Therefore, the nonmagnetic metal layer 30e does not have antiferromagnetism, and no exchange coupling magnetic field is produced between the first magnetic layer 29 and the nonmagnetic metal layer 30e. Namely, the nonmagnetic metal layer 30e remains in the disordered crystal structure.

After the laminated film having the shape shown in FIG. 28 is deposited, first magnetic field annealing is performed. The laminated film is heat-treated at a first heat treatment temperature with a first magnetic field (the X direction) applied in parallel with the track width Tw direction (the X direction shown in the drawing) to produce exchange coupling magnetic fields between the second antiferromagnetic layer 23 and both side portions 24a of the free magnetic layer 24, so that magnetizations of both side portions 24a of the free magnetic layer are pinned in the X direction.

A material layer having the same composition as that of the second antiferromagnetic layer 23 is formed to a small thickness, for example, a thickness smaller than 50 Å, below the central portion 24b of the free magnetic layer 24. However, the exchange coupling magnetic field is not produced between the central portion 24b of the free magnetic layer 24 and the second antiferromagnetic layer 23 because of the small thickness, and thus the central portion 24b of the free magnetic layer 24 is put into a single domain state to an extent which permits magnetization reversal with an external magnetic field.

As described above, the exchange coupling magnetic field is not produced between the first magnetic layer 29 and the nonmagnetic metal layer 30e having the same composition as that of the antiferromagnetic layer even by the first magnetic field annealing.

Figure 29:
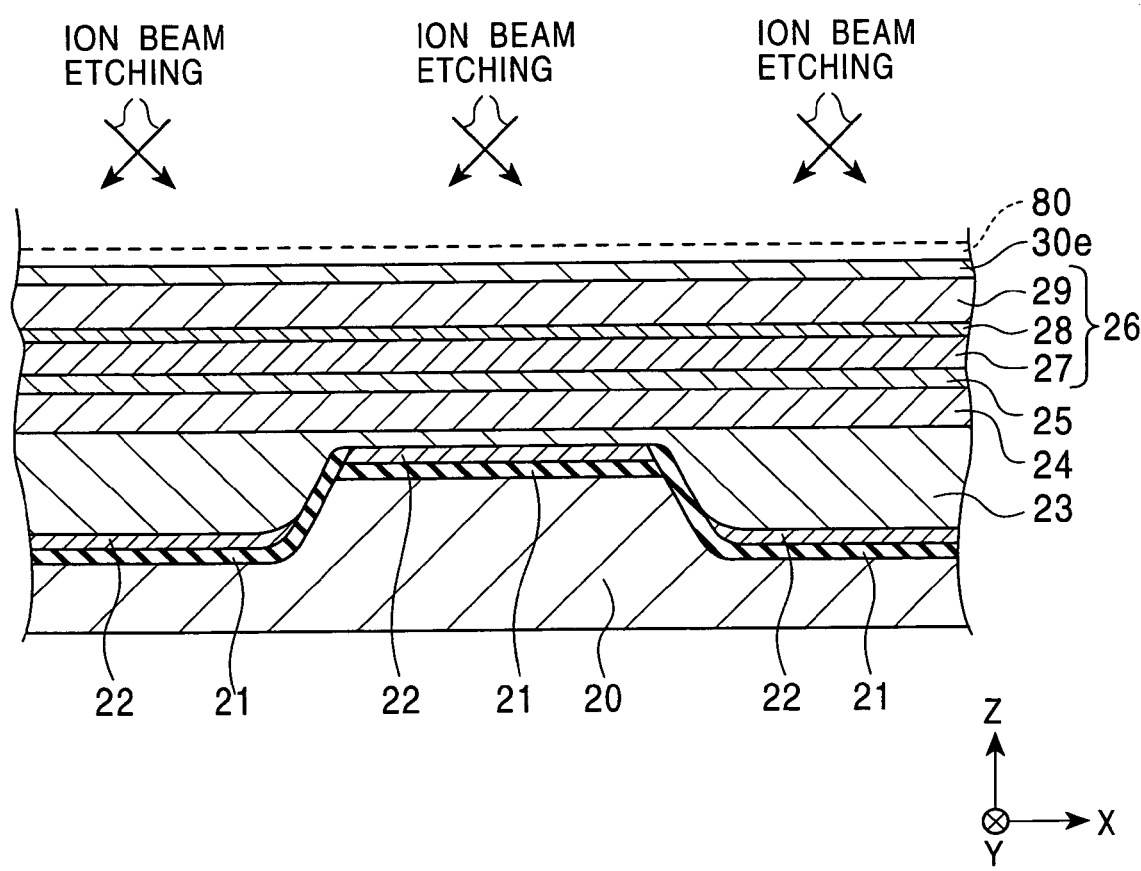
FIG. 29 is a drawing showing a step performed after the step shown in FIG. 28.

In the next step shown in FIG. 29, the nonmagnetic layer 80 is removed by low-energy ion beam etching. The term "low-energy ion beam etching" is defined as "ion milling" using an ion beam with a beam voltage (acceleration voltage) of less than 1000 V. For example, a beam voltage of 100 V to 500 V is used. In this embodiment, an argon (Ar) ion beam with a low beam voltage of 200 V is used. The definition of "low-energy ion beam etching" applies to the description below.

Figure 30:
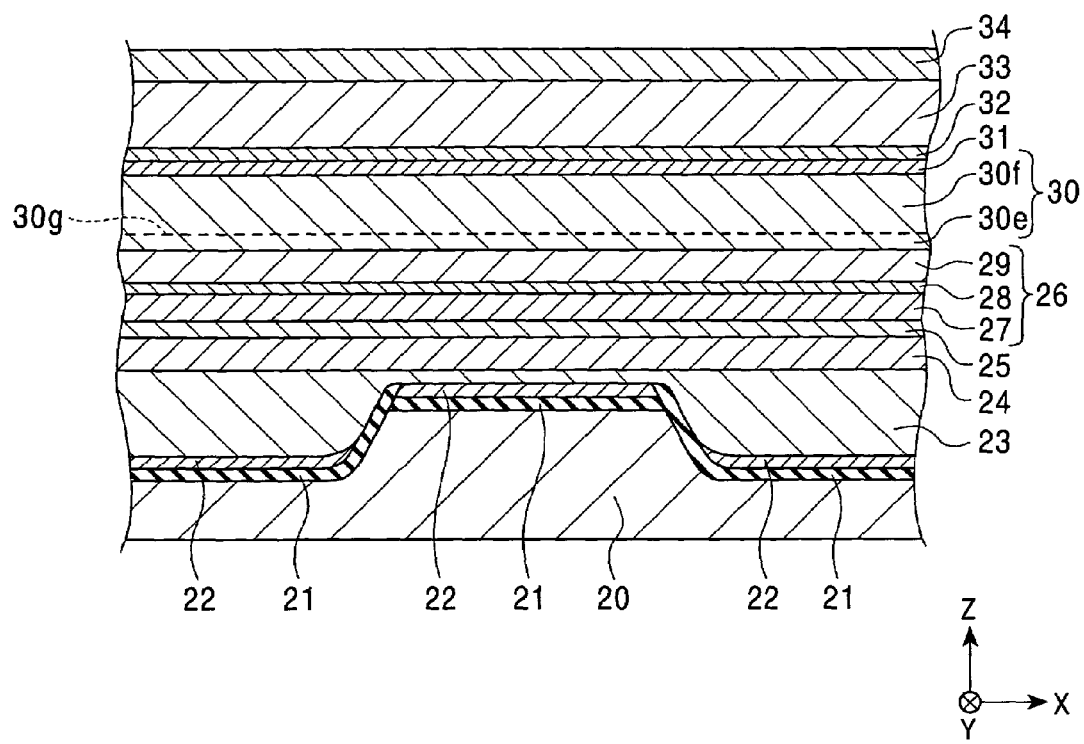
FIG. 30 is a drawing showing a step performed after the step shown in FIG. 29.

In the next step shown in FIG. 30, an upper antiferromagnetic layer 30f thicker than the nonmagnetic metal layer 30e and having the same composition as that of the antiferromagnetic layer is deposited on the nonmagnetic metal layer 30e exposed by removing the nonmagnetic layer 80 and having the same composition as that of the antiferromagnetic layer. The first antiferromagnetic layer 30 comprises the nonmagnetic metal layer 30e and the upper antiferromagnetic layer 30f which are integrally formed. In depositing the upper antiferromagnetic layer 30f, the thickness of the upper antiferromagnetic layer 30f is controlled so that the total thickness of the first antiferromagnetic layer 30 is in the range of 80 Å to 300 Å. The nonmagnetic layer 80 may partially remain at the interface 30g between the nonmagnetic metal layer 30e and the upper antiferromagnetic layer 30f as long as the nonmagnetic metal layer 30e and the upper antiferromagnetic layer 30f are antiferromagnetically coupled with each other to function as one antiferromagnetic layer.

As shown in FIG. 30, a stopper layer 31 made of Cr or the like is formed on the upper antiferromagnetic layer 30f, and a protective layer 32 made of Ta or the like is formed on the stopper layer 31. Furthermore, the electrode layer 33 made of Au or the like is formed on the protective layer 32, and the protective layer 34 made of Ta or the like is formed on the electrode layer 33.

Figure 31:
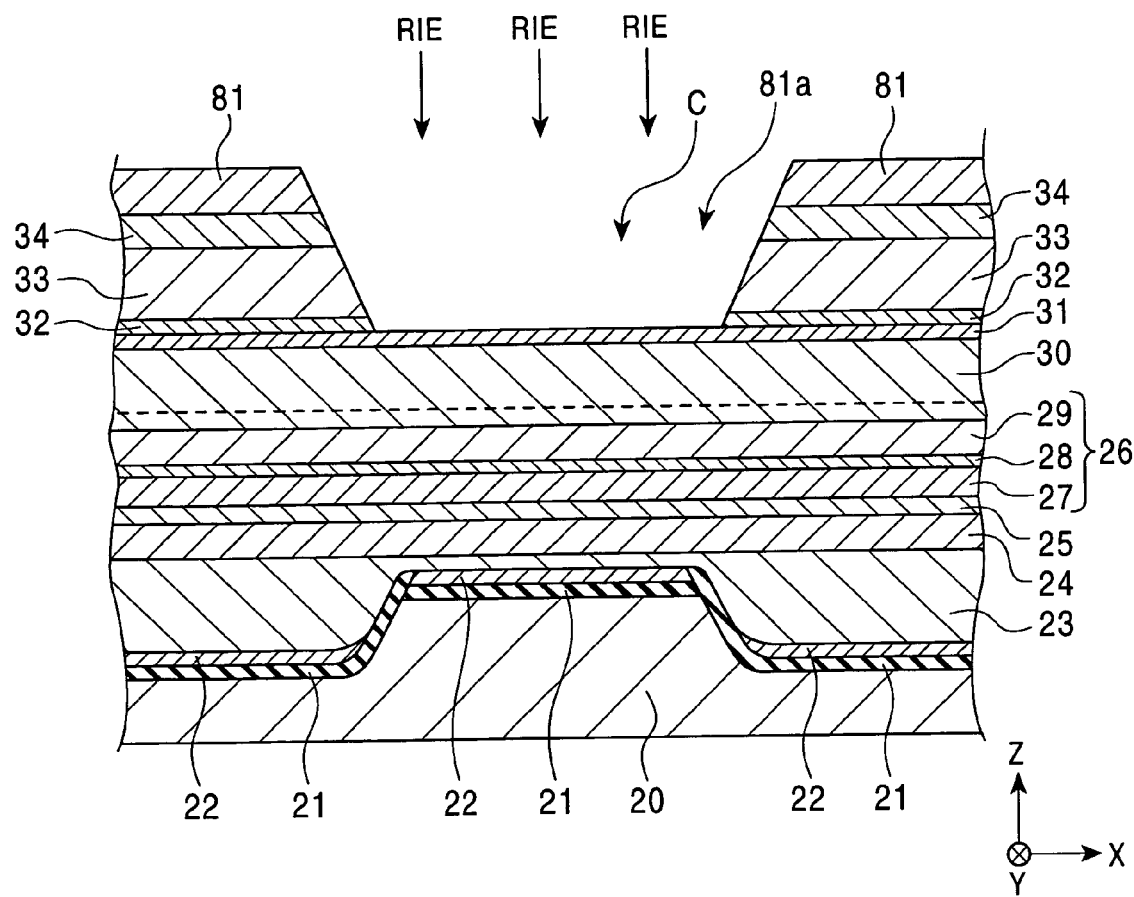
FIG. 31 is a drawing showing a step performed after the step shown in FIG. 30.

In the next step shown in FIG. 31, a mask layer 81 is provided on both side portions of the protective layer 34 in the track width direction (the X direction shown in the drawing). The mask layer 81 may be either a metal layer or a resist layer.

As shown in FIG. 31, the portions of the protective layer 34, the electrode layer 33 and the protective layer 32, which are exposed from a predetermined space 81a formed in the mask layer 81 in the track width direction, are removed by reactive ion etching (RIE). As the etching gas, $CF_4$, $C_3F_8$, a mixed gas of Ar and $CF_4$, or a mixed gas of $C_3F_8$ and Ar is used. As a result, the electrode layers 33 are left only on both side portions of the magnetic detecting element in the track width direction to form the space C between the electrode layers 33. The RIE step is terminated when the stopper layer 31 is exposed from the space C.

Figure 32:
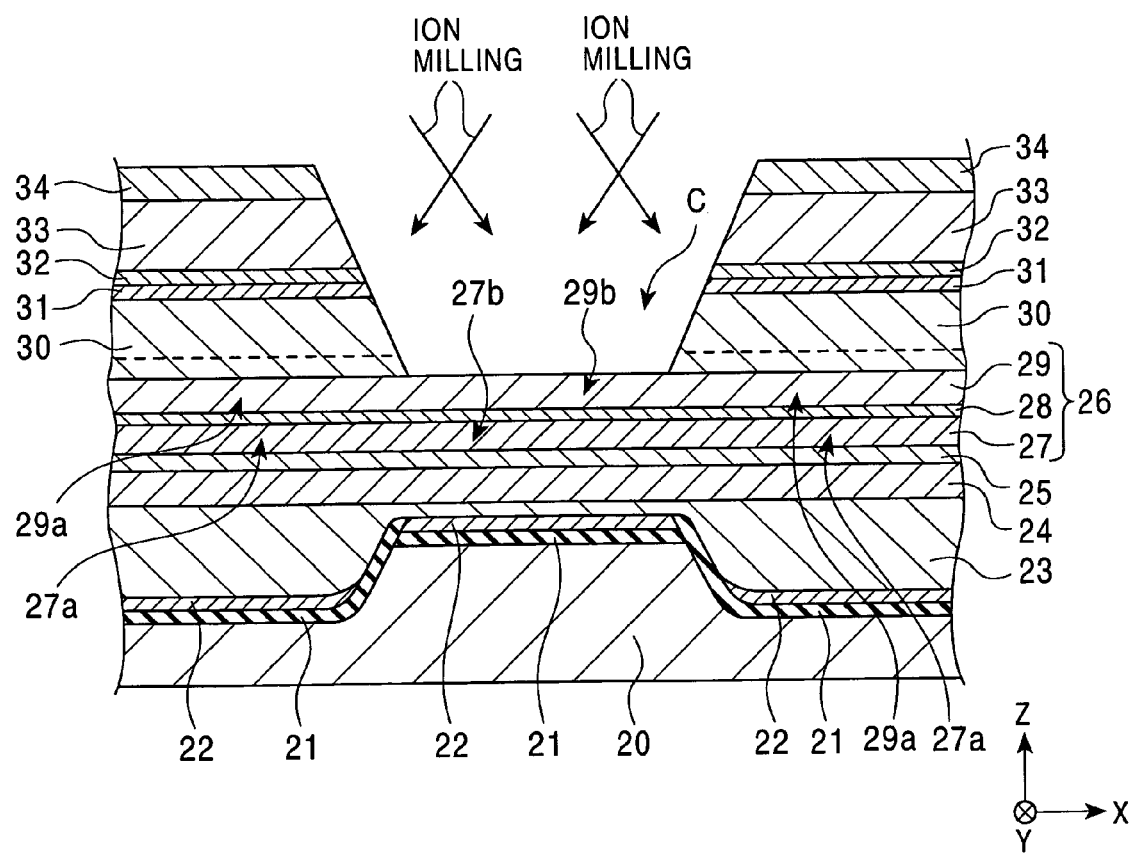
FIG. 32 is a drawing showing a step performed after the step shown in FIG. 31.

In the step shown in FIG. 32, the portions of the stopper layer 31 and the first antiferromagnetic layer 30, which are exposed in the space C, are removed by ion milling. The amount of removal by ion milling can be controlled by a SIMS analyzer. The ion milling is stopped at the moment the first magnetic layer 29 is exposed from the space C. The mask layer 81 is also removed in the ion milling step.

After the step shown I FIG. 32 is performed, the upper gap layer 35 and the upper shield layer 36 shown in FIG. 1 are deposited, and then second magnetic field annealing is performed. In the second magnetic field annealing, the direction of the magnetic field is perpendicular (the Y direction shown in the drawing) to the track width direction. In the second magnetic field annealing, the second applied magnetic field is lower than the exchange anisotropic magnetic field of the second antiferromagnetic layer 23, lower than the spin flop magnetic field of the first and second magnetic layers 29 and 27, and higher than the coercive force and anisotropic magnetic fields of the first and second magnetic layers 29 and 27. When the magnetic moment per unit area of the second magnetic layer 27 is higher than the magnetic moment per unit area of the first magnetic layer 29, the spin flop magnetic field can be increased to widen a margin for the applied magnetic field, thereby desirably facilitating the manufacturing process.

The heat treatment temperature is lower than the blocking temperature of the second antiferromagnetic layer 23. In this case, even when both the second antiferromagnetic layer 23 and the first antiferromagnetic layer 30 are made of the PtMn alloy or PtMnX alloy, the exchange anisotropic magnetic field of the first antiferromagnetic layer 30 can be oriented in the height direction (the Y direction), while the exchange anisotropic magnetic field of the second antiferromagnetic layer 23 is oriented in the track width direction (the X direction). The first antiferromagnetic layer 30 may be made of an IrMn alloy or the like having a lower blocking temperature than that of the second antiferromagnetic layer 23.

In the second magnetic field annealing, the first antiferromagnetic layer 30 is properly transformed to the ordered lattice to produce exchange coupling magnetic fields of an appropriate magnitude between the first antiferromagnetic layer 30 and both side portions 29a of the first magnetic layer 29. Therefore, magnetizations of both side portions 29a of the first magnetic layer 29 are pinned in a direction (the Y direction) perpendicular to the track width direction.

Also, an antiparallel coupling magnetic field occurs between the first magnetic layer 29 and the second magnetic layer 27 due to the RKKY interaction, and thus the magnetization of the second magnetic layer 27 is pinned in antiparallel to the first magnetic layer 29. Furthermore, the magnetizations of the central portions 29b and 27b of the first and second magnetic layers 29 and 27 are pinned while maintaining the antiparallel state by the antiparallel coupling magnetic field due to the RKKY interaction and the bias magnetic field through the exchange interaction in each magnetic layer. The magnetic detecting element shown in FIG. 1 is completed by the above-described steps.

Figure 33:
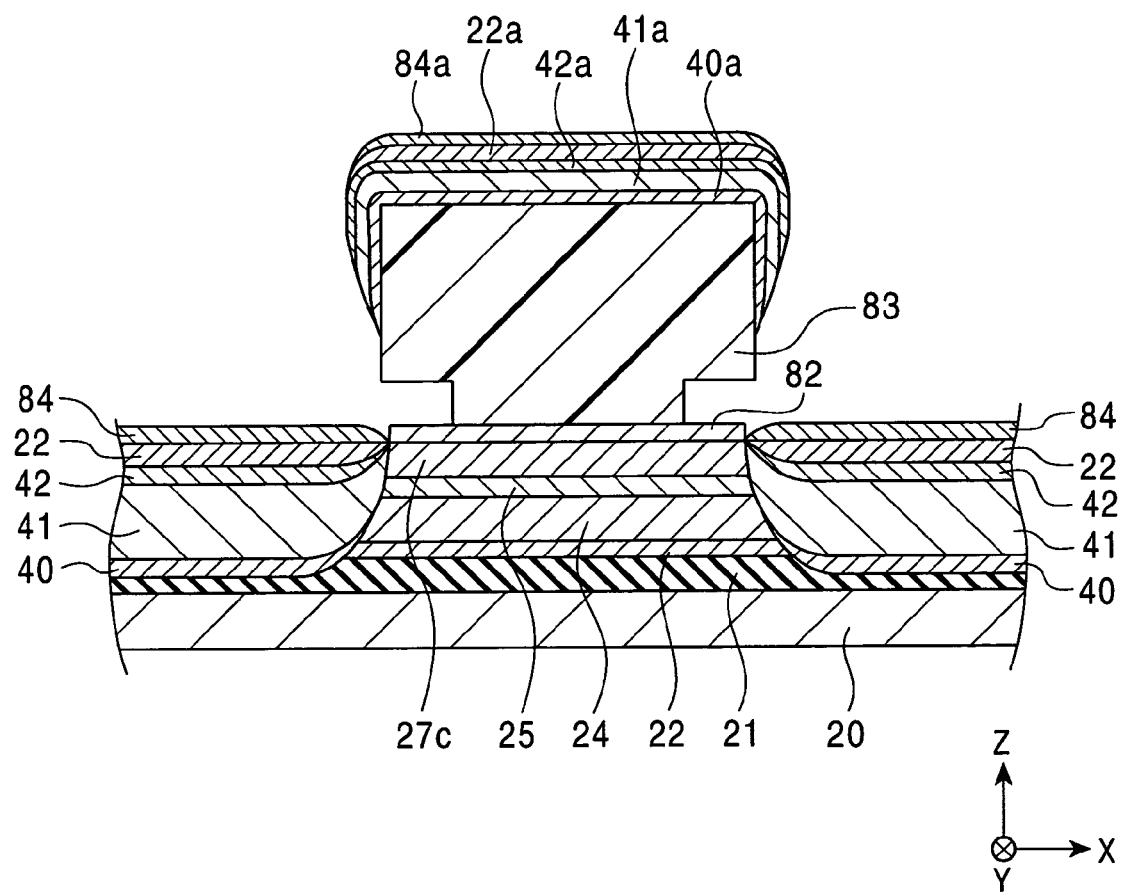
FIG. 33 is a drawing showing a step for manufacturing the magnetic detecting element shown in FIG. 4.
Figure 34:
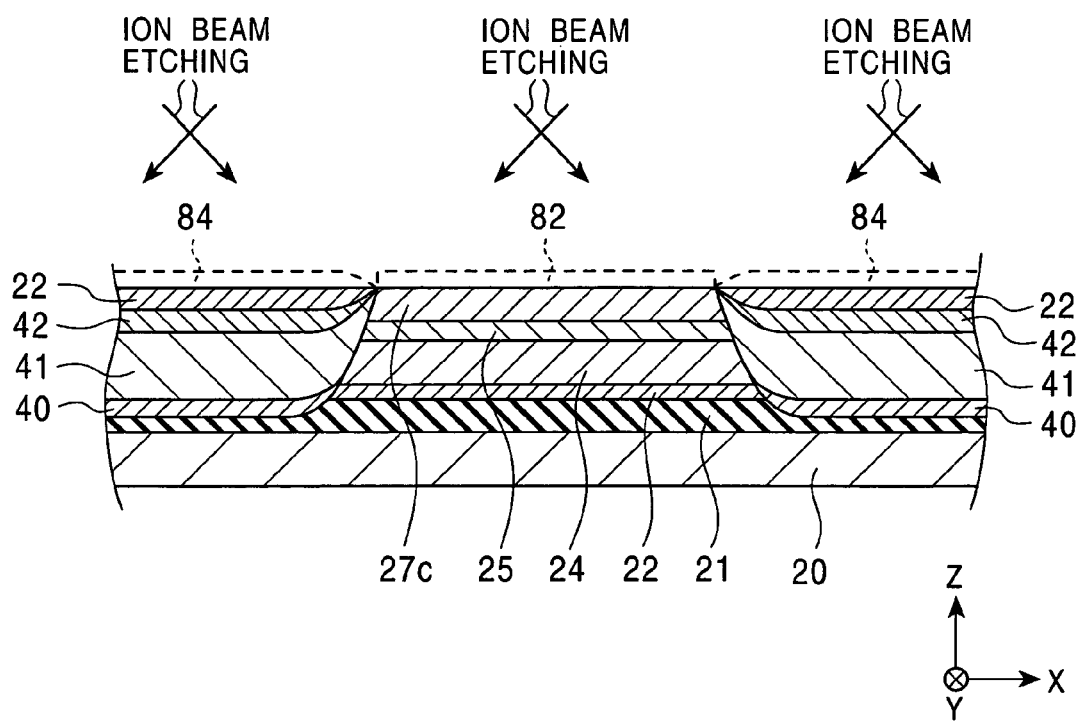
FIG. 34 is a drawing showing a step performed after the step shown in FIG. 33.
Figure 35:
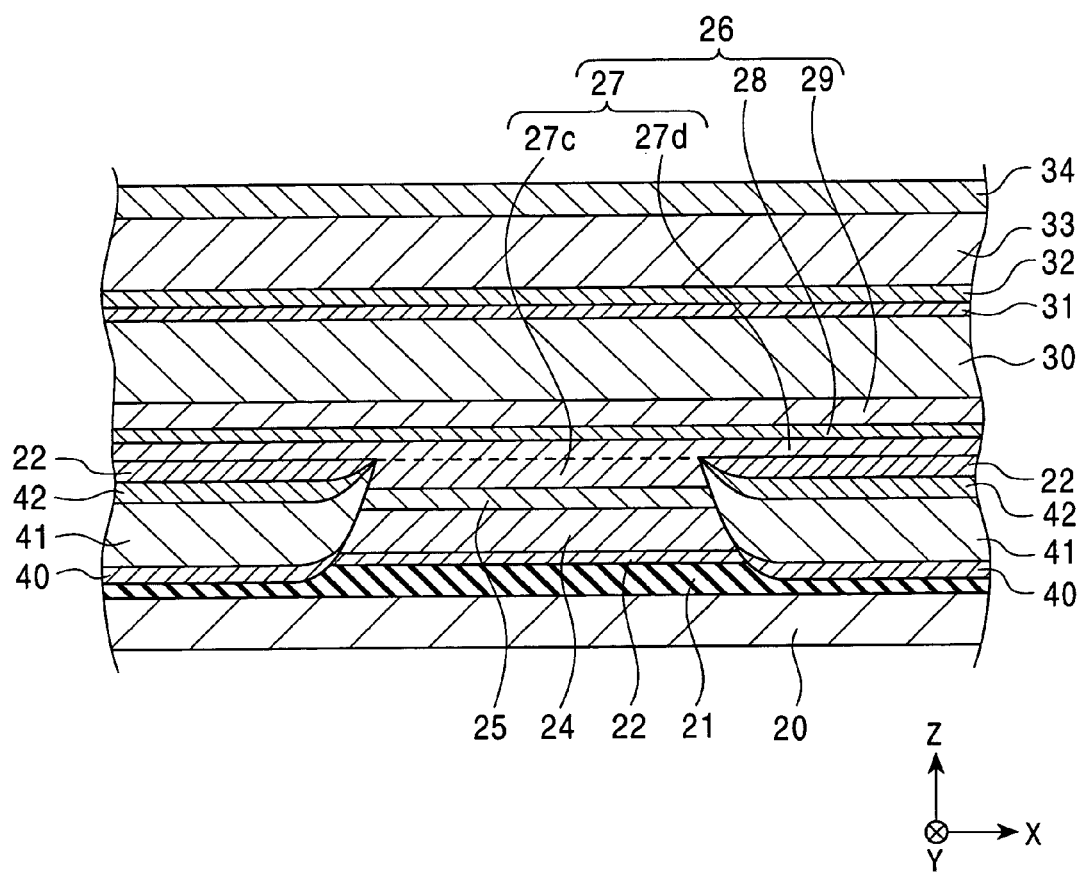
FIG. 35 is a drawing showing a step performed after the step shown in FIG. 34.

FIGS. 33 to 35 are drawings showing respective steps of the method for manufacturing the magnetic detecting element shown in FIG. 4. Each of these drawings is a partial sectional view of the magnetic detecting element in each step, as viewed from the surface facing the recording medium.

In the step shown in FIG. 33, the lower gap layer 21, the seed layer 22, the free magnetic layer 24, the nonmagnetic material layer 25, the lower layer 27c of the second magnetic layer 27 constituting the pinned magnetic layer 26, and a protective layer 82 are continuously deposited on the lower shield layer 20.

The protective layer 82 is preferably made of a nonmagnetic material such as Cu or the like, and formed to a thickness of about 3 Å to 10 Å. Particularly, when Cu is used for the protective layer 82, the upper layer 27d and the lower layer 27c can be caused to function as the second magnetic layer 27 as a unit even when the protective layer 82 slightly remains between the upper layer 27d and the lower layer 27c in the subsequent step of forming the upper layer 27d of the second magnetic layer 27 on the lower layer 27c.

The protective layer 82 is a layer for protecting the lower layer 27c formed below the protective layer 82 from oxidation.

As shown in FIG. 33, a lift off resist layer 83 is formed on the protective layer 82, and in the layers ranging from the seed layer 22 to the protective layer 82, the both side portions in the track width direction, which are not covered with the resist layer 83, are removed by ion milling. Then, as shown in FIG. 33, the bias underlying layers 40 made of Cr, the permanent-magnet layers 41 made of CoPtCr, the protective layers 42 made of Ta, the seed layers 22 made of NiFeCr, and protective layers 84 made of Cr are laminated in that order on both side portions. Each of the protective layers 84 is formed to a thickness of about 3 Å to 10 Å. In this sputtering deposition, a bias underlying material layer 40a, a permanent-magnet material layer 41a, a protective material layer 42a, a seed material layer 22a and a nonmagnetic material layer 84a are also deposited on the top of the resist layer 83.

In the next step shown in FIG. 34, the resist layer 83 is removed, and then the protective layer 82 formed on the lower layer 27c of the second magnetic layer 27 and the protective layers 84 formed on the seed layers 22 are removed by low-energy ion beam etching. As a result, the lower layer 27c and the seed layers 22 are exposed.

In the next step shown in FIG. 35, the upper layer 27d of the second magnetic layer 27 is deposited on the lower layer 27c and on the seed layers 22 to form the second magnetic layer 27 comprising the lower layer 27c and the upper layer 27d which are integrally formed. Furthermore, the nonmagnetic intermediate layer 28, the first magnetic layer 29, the first antiferromagnetic layer 30, the stopper layer 31, the protective layer 32, the electrode layer 33 and the protective layer 34 are deposited on the second magnetic layer 27. Next, the same steps as those shown in FIGS. 31 and 32 are performed to complete the magnetic detecting element shown in FIG. 4. Unlike in FIG. 1, in the magnetic detecting element shown in FIG. 4, only one antiferromagnetic layer is provided, and thus the applied magnetic field and annealing temperature of magnetic field annealing performed for the first antiferromagnetic layer 30 are not so strictly limited as in the second magnetic field annealing in the step shown in FIG. 32. Therefore, the manufacturing process is optimized and facilitated regardless of the order of the magnetic moment per unit area of the second magnetic layer 27 and the magnetic moment per unit area of the first magnetic layer 29. Also, the permanent-magnetic layers 41 may be magnetized after slider processing or the assembly of a head (HGA).

Although the magnetic detecting element shown in FIG. 4 can be manufactured by the above-described steps, each of the magnetic detecting elements shown in FIGS. 3 and 5 to 8 can also be manufactured by the steps shown in FIGS. 33 to 35.

FIGS. 36 to 39 are drawings respectively showing steps of the method for manufacturing the magnetic detecting element shown in FIG. 10. Each of the figures is a partial sectional view of the magnetic detecting element in each step, as viewed from the surface facing the recording medium.

Figure 36:
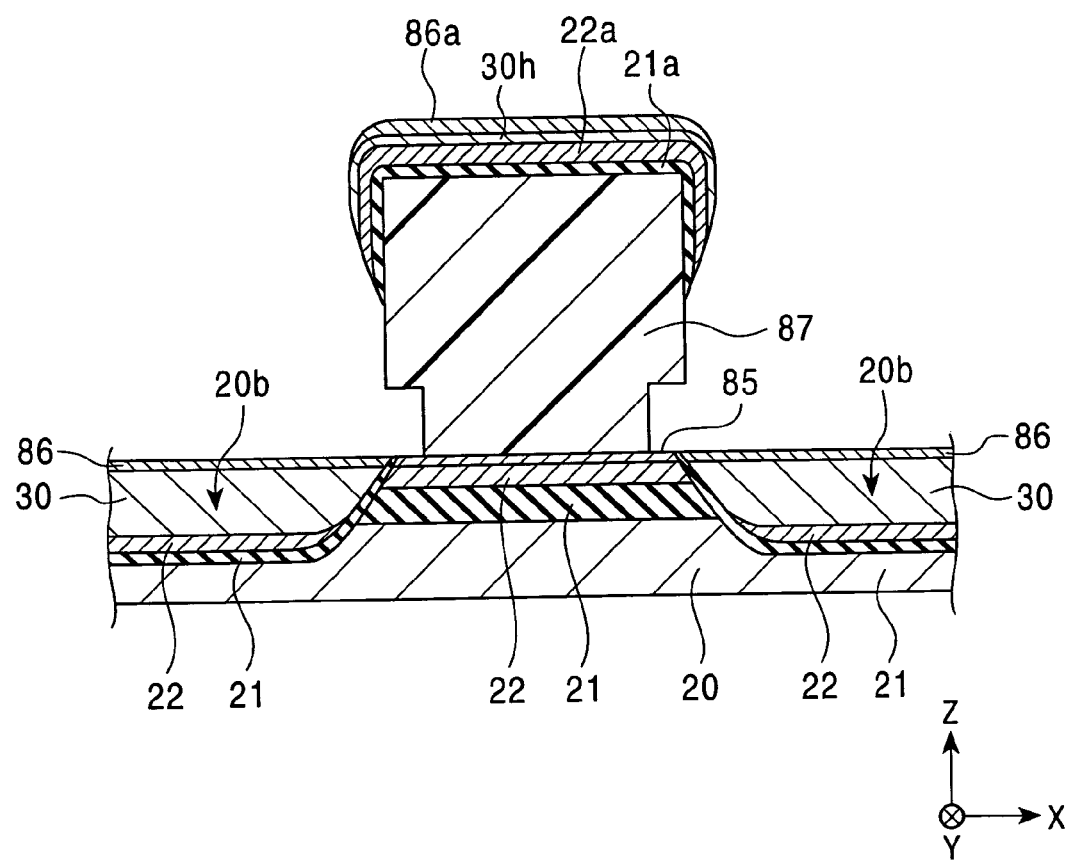
FIG. 36 is a drawing showing a step for manufacturing the magnetic detecting element shown in FIG. 10.

In the step shown in FIG. 36, the lower gap layer 21, the seed layer 22 and a nonmagnetic layer 85 made of Cr, Ru, or the like are deposited on the lower shield layer 20, and then a lift off resist layer 87 is formed on the nonmagnetic layer 85.

Next, the portions of the nonmagnetic layer 85, the seed layer 22, the lower gap layer 21 and the lower shield layer 20, which are not covered with the resist layer 87, are removed by ion milling to form the recesses 20b in both side portions of the lower shield layer 20 in the track width direction (the X direction shown in the drawing). In each of the recesses 20b, the lower gap layer 21, the seed layer 22, the first antiferromagnetic layer 30 and a nonmagnetic layer 86 made of Ru are deposited in that order from the bottom. In this step, a gap material layer 21a, a seed material layer 22a, an antiferromagnetic material layer 30h, and a nonmagnetic material layer 86a are also deposited on the top of the resist layer 87.

Figure 37:
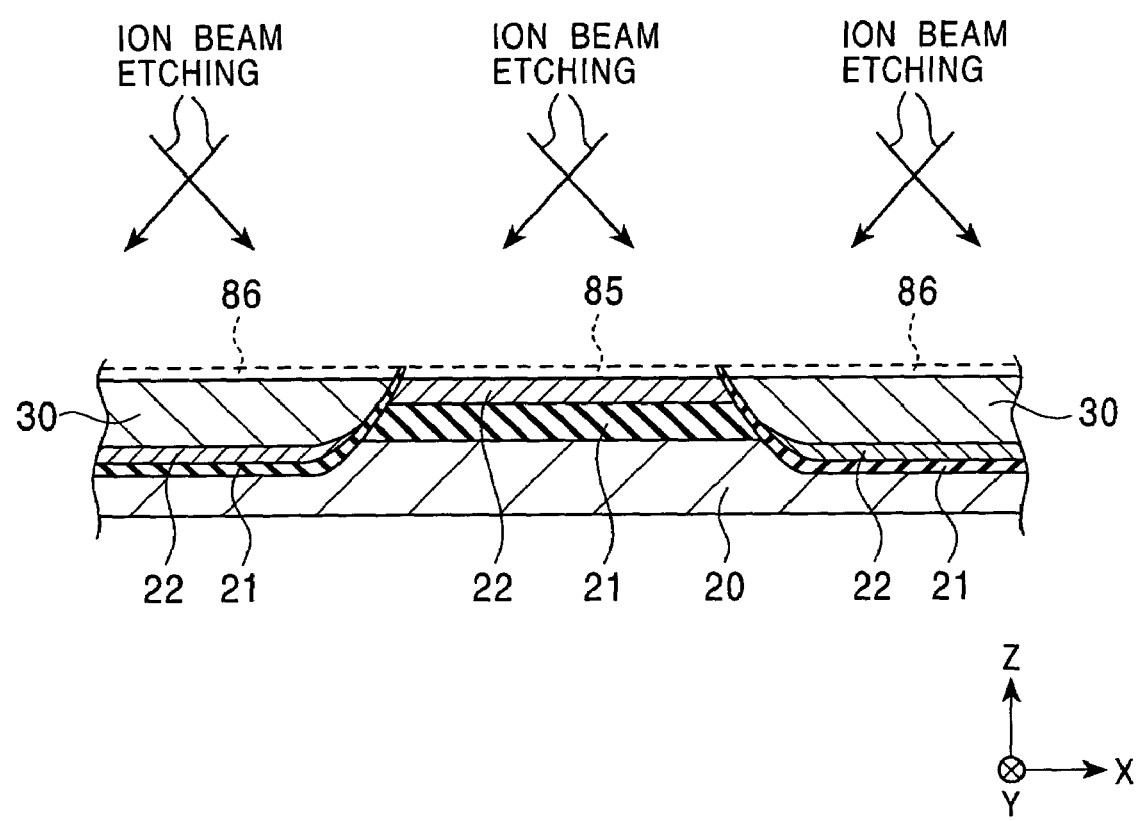
FIG. 37 is a drawing showing a step performed after the step shown in FIG. 36.

In the next step show in FIG. 37, the resist layer 87 is removed, and then the nonmagnetic layers 85 and 86 are removed by ion beam etching. As a result, the surface of the seed layer 22 is exposed from the central portion of the lower shield layer 20, and the surface of the first antiferromagnetic layer 30 is exposed from both side portions of the lower shield layer 20.

Figure 38:
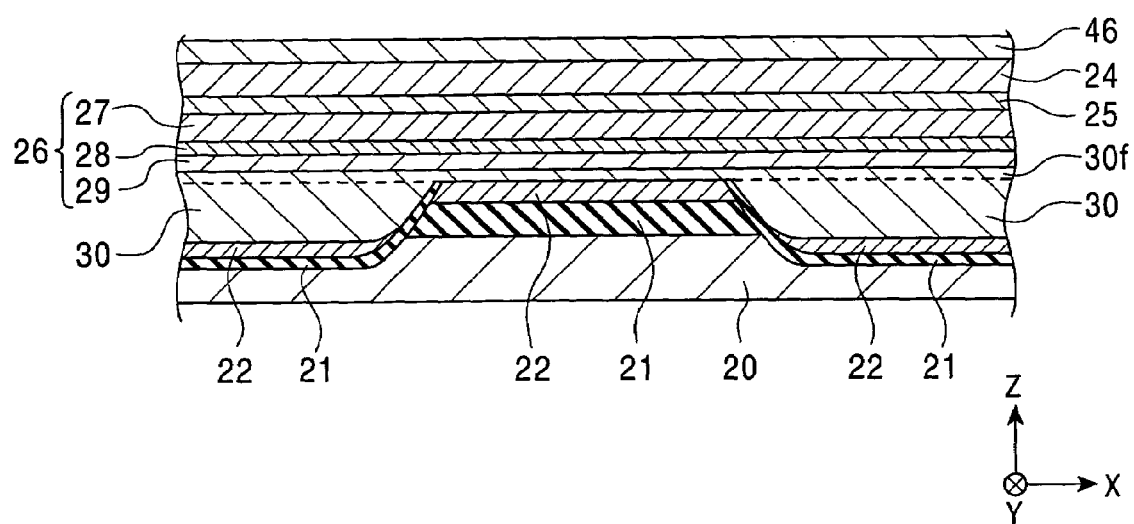
FIG. 38 is a drawing showing a step performed after the step shown in FIG. 37.

In the next step shown in FIG. 38, a nonmagnetic metal layer 30f having the same composition as that of an antiferromagnetic layer and a small thickness, for example, a thickness smaller than 50 Å is deposited on the first antiferromagnetic layer 30 and the seed layer 22 exposed in the previous step. Then, the first magnetic layer 29, the nonmagnetic intermediate layer 28, the second magnetic layer 27, the nonmagnetic material layer 25, the free magnetic layer 24 and the protective layer 46 are deposited on the nonmagnetic metal layer 30f.

When the nonmagnetic metal layer 30f having a thickness smaller than 50 Å and the same composition as that of the antiferromagnetic layer is deposited on the first antiferromagnetic layer 30 and on the seed layer 22, and the first magnetic layer 29 is continuously deposited on the nonmagnetic metal layer 30f, at least a portion of the material layer 30f integrated with the first antiferromagnetic thick layer 30 provided in both side portions of the element is transformed from the disordered lattice to the ordered lattice by magnetic field annealing to produce exchange coupling magnetic fields between the magnetic layer 30f and both side portions of the first magnetic layer 29. In the central portion of the element, the nonmagnetic metal layer 30f cannot be transformed from the disordered lattice to the ordered lattice because the nonmagnetic metal layer 30f is very thin, and thus no exchange coupling field is produced between the nonmagnetic metal layer 30f and the central portion of the first magnetic layer 29.

Figure 39:
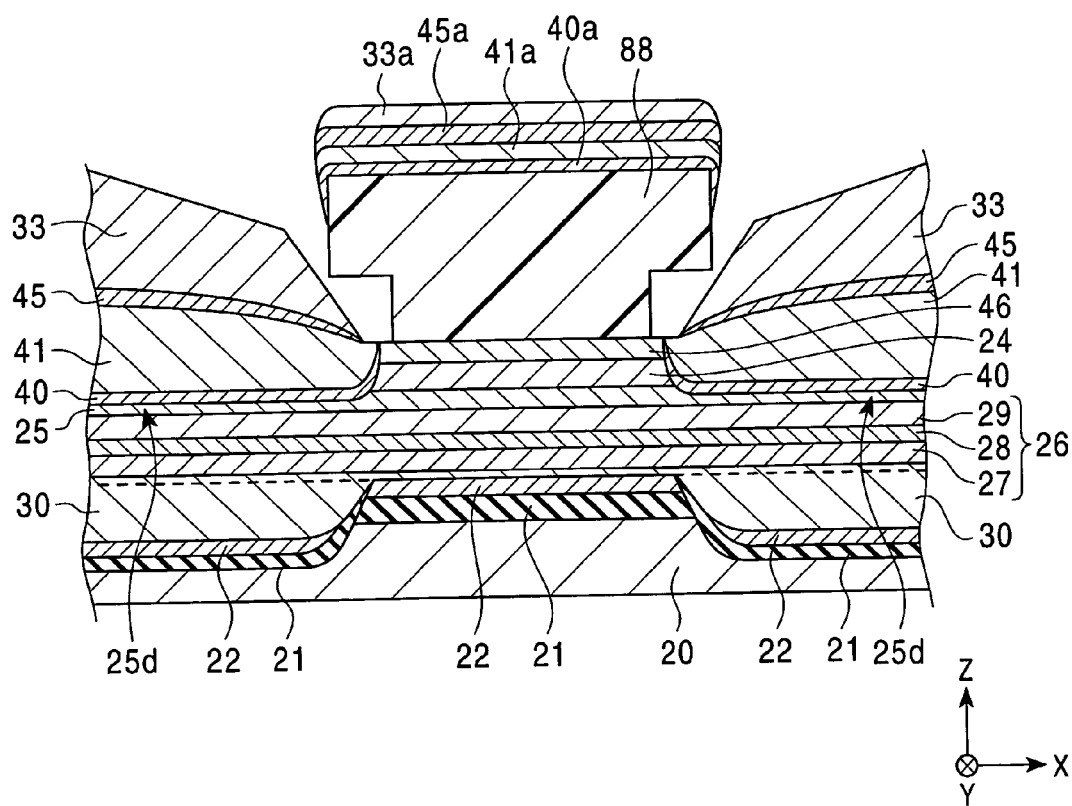
FIG. 39 is a drawing showing a step performed after the step shown in FIG. 38.

In the step shown in FIG. 39, a lift off resist layer 88 is formed on the protective layer 46, and the portions of the protective layer 46, the free magnetic layer 24 and the nonmagnetic material layer 25, which are not covered with the resist layer 88, are removed by ion milling. In this ion milling, both side portions 25d of the nonmagnetic material layer 25 are partially left for protecting the pinned magnetic layer 26 from the ion milling.

Next, the bias underlying layer 40 made of Cr or the like is formed on the nonmagnetic material layer 25, and the permanent-magnet layer 41 is formed on the bias underlying layer 40. Furthermore, the anti-diffusion layer 45 is formed on the permanent-magnet layer 41, and the electrode layer 33 is formed on the anti-diffusion layer 45. In this step, an underlying layer made of Ta or the like is preferably formed between the nonmagnetic material layer 25 and the bias underlying layer 40, for optimizing the crystal orientation of the bias underlying layer 40 and improving the characteristics (coercive force Hc and remanence ratio) of the permanent-magnet layer 41.

In the above-described deposition, a bias underlying material layer 40a, a permanent-magnet material layer 41a, an anti-diffusion material layer 45a and an electrode material layer 33a are also deposited on the top of the resist layer 88. Then, the resist layer 88 is removed, and the permanent-magnet layer 41 is magnetized in the track width direction (the X direction). The magnetic detecting element shown in FIG. 10 can be manufactured by the above-described steps.

Unlike in FIG. 10, in the above-described manufacturing method, the nonmagnetic metal layer 30f (the same as the nonmagnetic metal layer 100 shown in FIG. 19) partially remains on the projection 20a of the lower shield layer 20. However, the nonmagnetic metal layer 30f can be completely removed by the manufacturing method described below.

FIGS. 40 to 43 are drawings respectively showing steps of the method for manufacturing the magnetic detecting element shown in FIG. 11. Each of the figures is a partial sectional view of the magnetic detecting element in each step, as viewed from the surface facing the recording medium.

Figure 40:
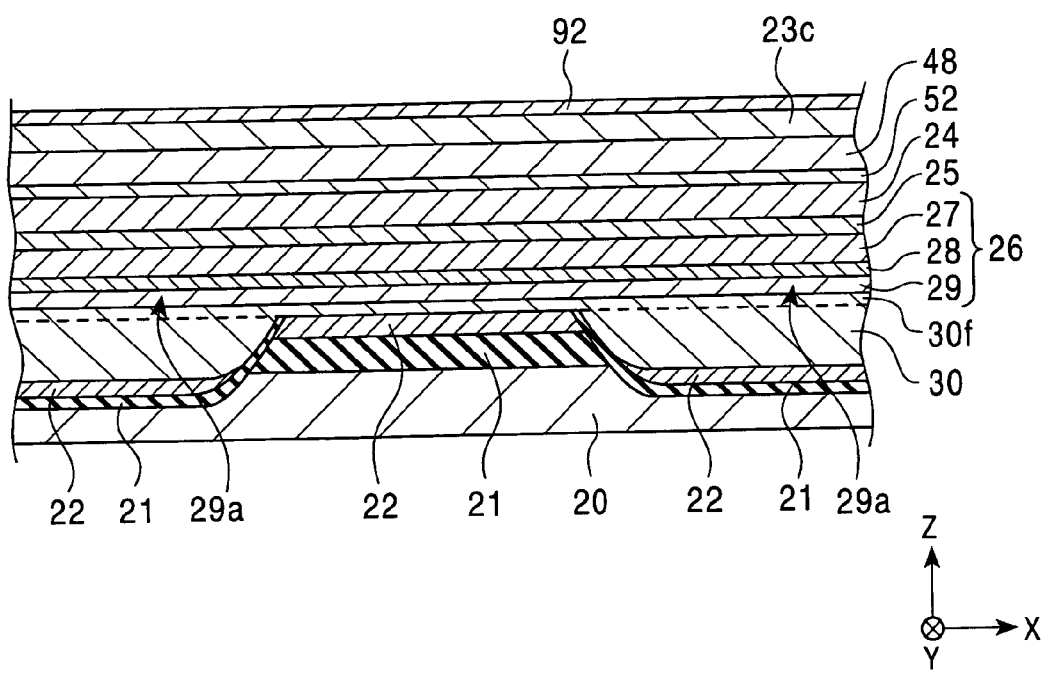
FIG. 40 is a drawing showing a step for manufacturing the magnetic detecting element shown in FIG. 11.

In the step shown in FIG. 40, the same steps as those shown in FIGS. 36 and 37 are performed to deposit the layers up to the first antiferromagnetic layer 30, the nonmagnetic metal layer 30f having the same composition and a thickness smaller than 50 Å, the pinned magnetic layer 26 having the synthetic ferrimagnetic structure, the nonmagnetic material layer 25, the free magnetic layer 24, the nonmagnetic intermediate layer 52, the ferromagnetic layer 48, a nonmagnetic metal layer 23c (thinner than 50 Å) having the same composition as that of an antiferromagnetic layer, and a nonmagnetic layer 92 are continuously deposited on the first antiferromagnetic layer 30. Then, magnetic field annealing is performed to produce exchange coupling magnetic fields between the first antiferromagnetic layer 30 and both side portions 29a of the first magnetic layer 29. Then, the nonmagnetic layer 92 is removed by low-energy ion milling, and the upper layer of the second antiferromagnetic layer 23 is laminated on the lower layer 23c of the second antiferromagnetic layer 23 to form the second antiferromagnetic layer 23 comprising the lower layer 23c and the upper layer integrated with each other. Then, the stopper layer 53 and the protective layer 49 are deposited on the second antiferromagnetic layer 23.

Figure 41:
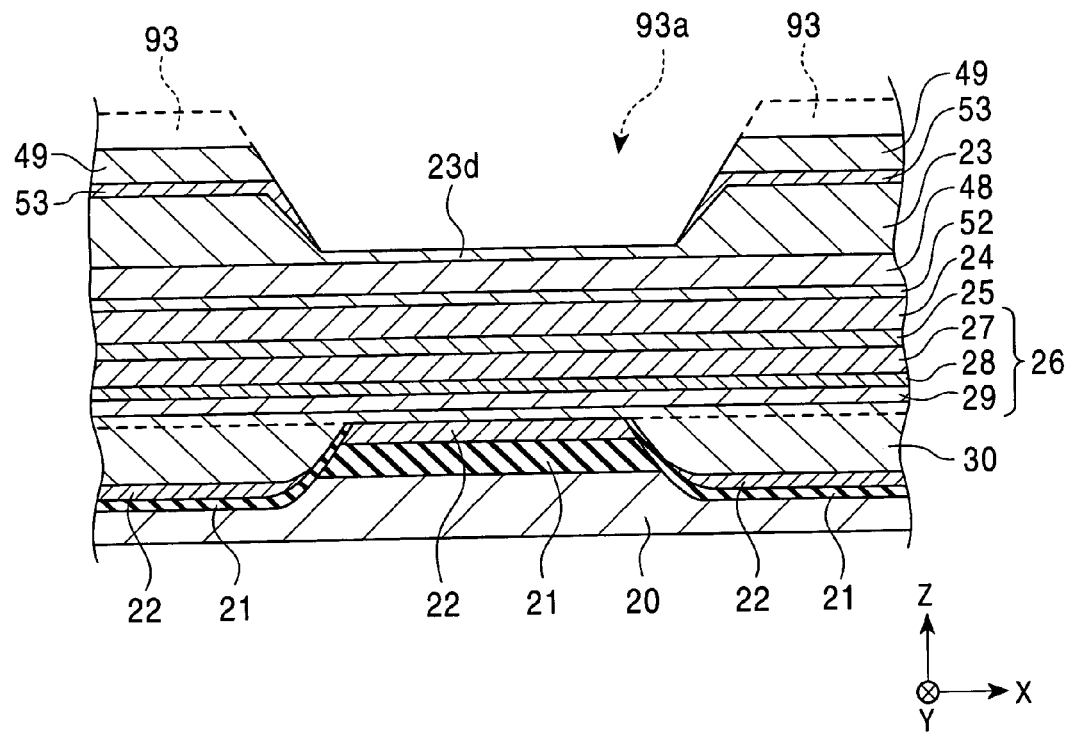
FIG. 41 is a drawing showing a step performed after the step shown in FIG. 40.

In the step shown in FIG. 41, a mask layer 93 having a predetermined space 93a in the track width direction is formed on the protective layer 49, and the protective layer 49 exposed in the space 93a of the mask layer 93 is removed by RIE to expose the stopper layer 53. Then, the stopper layer 53 and the second antiferromagnetic layer 23 are removed by ion milling. In this ion milling, the mask layer 93 is also removed.

In this step, a nonmagnetic metal layer 23d having the same composition as that of the second antiferromagnetic layer 23 may be slightly left in the space 93a as long as the thickness is less than 50 Å.

Figure 42:
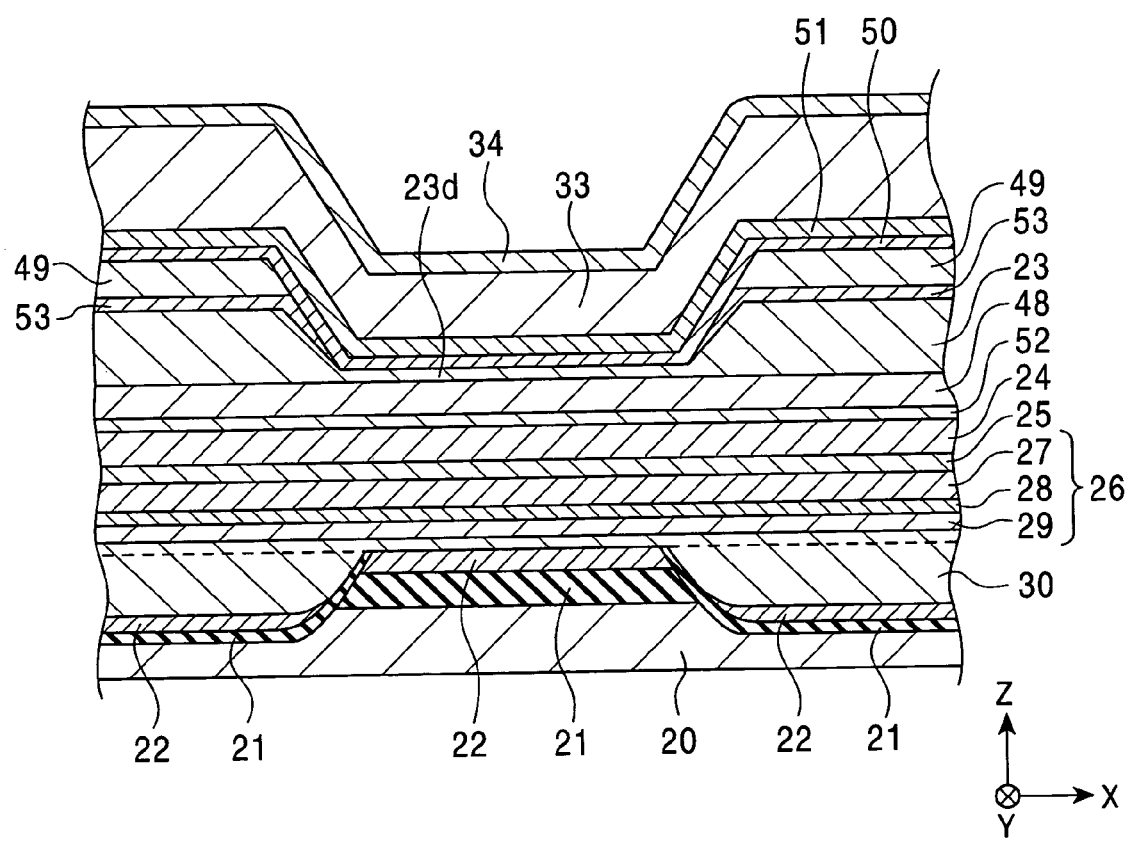
FIG. 42 is a drawing showing a step performed after the step shown in FIG. 41.

In the next step shown in FIG. 42, the stopper layer 50 made of Cr or the like is formed on the region ranging from the protective layer 49 and the central portion 23d of the second antiferromagnetic layer 23, and the protective layer 51 made of Ta or the like is formed on the stopper layer 50. Furthermore, the electrode layer 33 made of Au or the like is formed on the protective layer 51, and the protective layer 34 made of Ta or the like is formed on the electrode layer 33.

Figure 43:
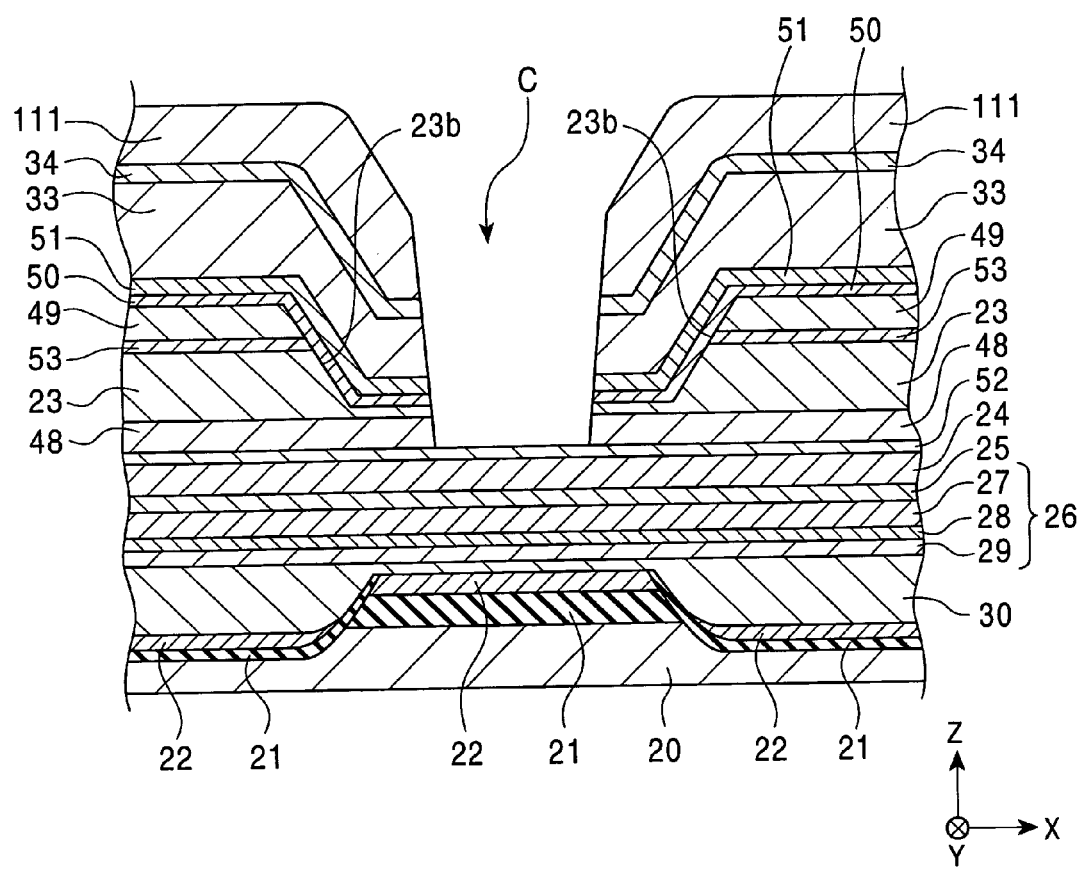
FIG. 43 is a drawing showing a step performed after the step shown in FIG. 42.

In the next step shown in FIG. 43, a mask layer 111 having a space C formed in the track width direction (the X direction) is formed on the protective layer 34. The mask layer 111 is aligned so that the center of the space C of the mask layer 111 in the track width direction coincides with the center of the element in the track width direction. In this step, the mask layer 111 is made of a material which is not or little removed by reactive ion etching (RIE). The mask layer 111 comprises a metal layer formed by lift off using a resist, for example, the mask layer 111 comprises a Cr layer. With the mask layer 111 comprising a metal layer, the mask layer 111 is preferably formed to a thickness of about 100 Å to 500 Å.

The space C formed in the mask layer 111 in the track width direction (the X direction) is preferably narrower than the space between the bottoms of the inner end surfaces 23b of the second antiferromagnetic layer 23 in the track width direction.

After the mask layer 111 is formed, the portions of the protective layer 34 and the electrode layer 33, which are not covered with the mask layer 111, are removed by etching. As the etching, reactive ion etching (RIE) is preferably performed. As the etching gas, $CF_4$, $C_3F_8$, a mixed gas of Ar and $CF_4$, or a mixed gas of $C_3F_8$ and Ar is used.

The etching is stopped when the protective layer 34, the electrode layer 33 and the protective layer 51 are partially removed to expose the surface of the stopper layer 50, and then the stopper layer 50 exposed in the space of the mask 111 is further removed by ion milling. Furthermore, the second antiferromagnetic layer left below the stopper layer 50 is removed. In the step shown in FIG. 43, the ion milling is stopped when the exposed ferromagnetic layer 48 is completely removed. The amount of removal by ion milling can be controlled by a SIMS analyzer. Particularly, low-energy ion milling can be performed because each layer to be removed is thin. Therefore, milling controllability can be improved, and the milling can be precisely stopped at the moment the ferromagnetic layer 48 is completely removed.

Unlike in FIG. 11, in the above-described manufacturing method, the nonmagnetic metal layer 30f having the same composition as that of the antiferromagnetic layer partially remains on the projection 20a of the lower shield layer 20. However, the nonmagnetic metal layer 30f can be completely removed by the manufacturing method described below.

Figure 44:
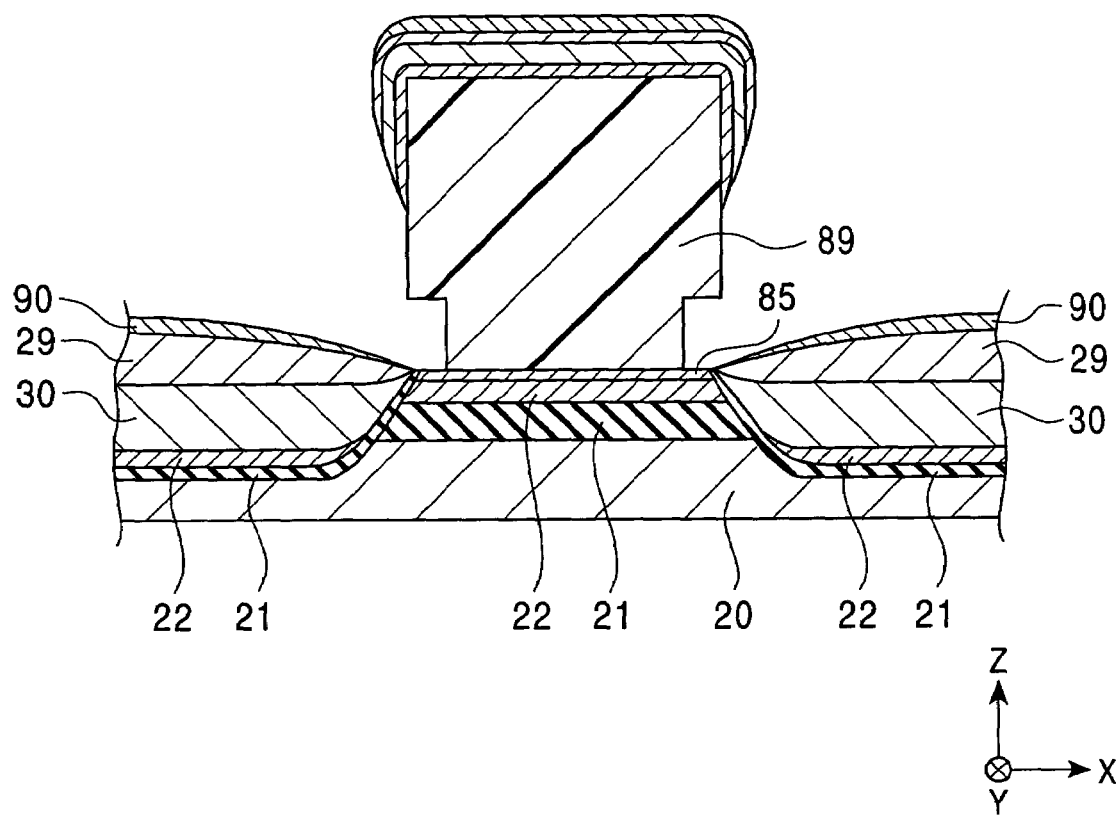
FIG. 44 is a drawing showing a step of a manufacturing method different from the method shown in FIGS. 36 and 37.
Figure 45:
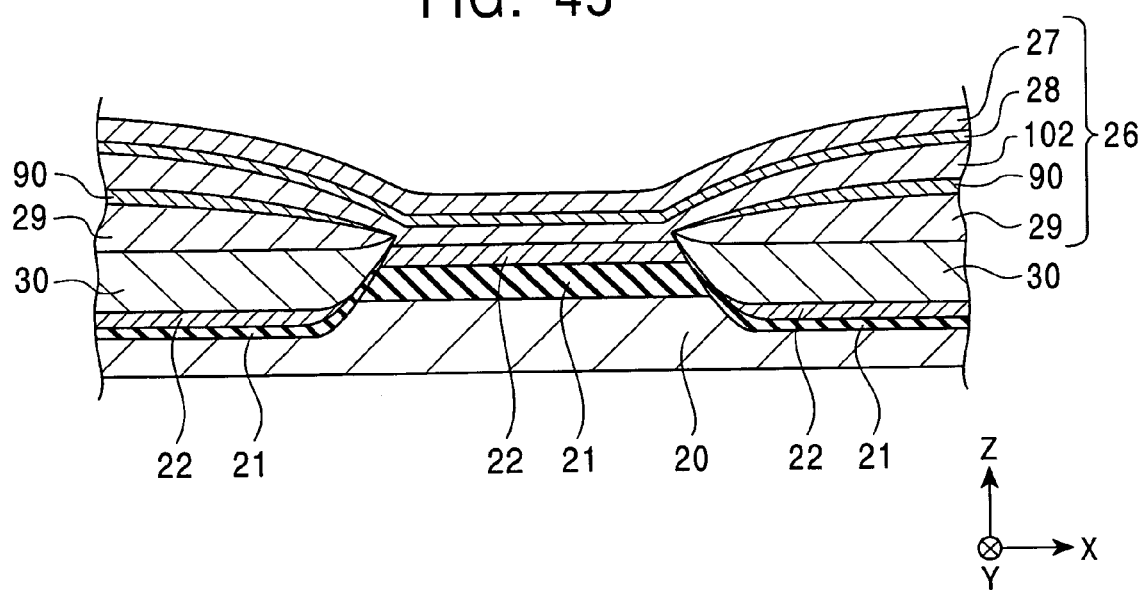
FIG. 45 is a drawing showing a step performed after the step shown in FIG. 44.

FIGS. 44 and 45 are drawings respectively showing steps different from the steps shown in FIGS. 36 and 37 for forming the first antiferromagnetic layer 30 and the pinned magnetic layer 26. Each of the figures is a partial sectional view of the magnetic detecting element in each step, as viewed from the surface facing the recording medium.

In the step shown in FIG. 44, the lower shield layer 20, the lower gap layer 21, the seed layer 22 and the nonmagnetic layer 85 are formed, and the lift off resist layer 89 shown in FIG. 44 is formed on the nonmagnetic material layer 85. Then, the portions of the nonmagnetic layer 85, the seed layer 22, the lower gap layer 21 and the lower shield layer 20, which are not covered with the resist layer 89, are removed by etching. Then, the lower gap layer 21, the seed layer 22, the first antiferromagnetic layer 30, the first magnetic layer 29 and the nonmagnetic layer 90 are deposited on the both side portions of the lower shield layer 20 in the track width direction (the X direction), which are not covered with the resist layer 89. The nonmagnetic layer 90 is made of Ru or the like. After the resist layer 89 is removed, the nonmagnetic layer 85 and the nonmagnetic layer 90 are partially removed.

As shown in FIG. 45, the nonmagnetic layer 90 is partially left on the first magnetic layer 29. Then, the magnetic intermediate layer 102, the nonmagnetic intermediate layer 28, and the second layer 27 are formed on the seed layer 22 at the center of the element and on the nonmagnetic layer 90 to form the pinned magnetic layer 26 comprising the five layers including the first magnetic layer 29, the magnetic intermediate layer 102, the second magnetic layer 27, and the nonmagnetic intermediate layers 28 and 90. The subsequent step is the same as that shown in FIG. 38 in which the nonmagnetic material layer 25, the free magnetic layer 24, etc. are continuously deposited on the pinned magnetic layer 26.

Figure 46:
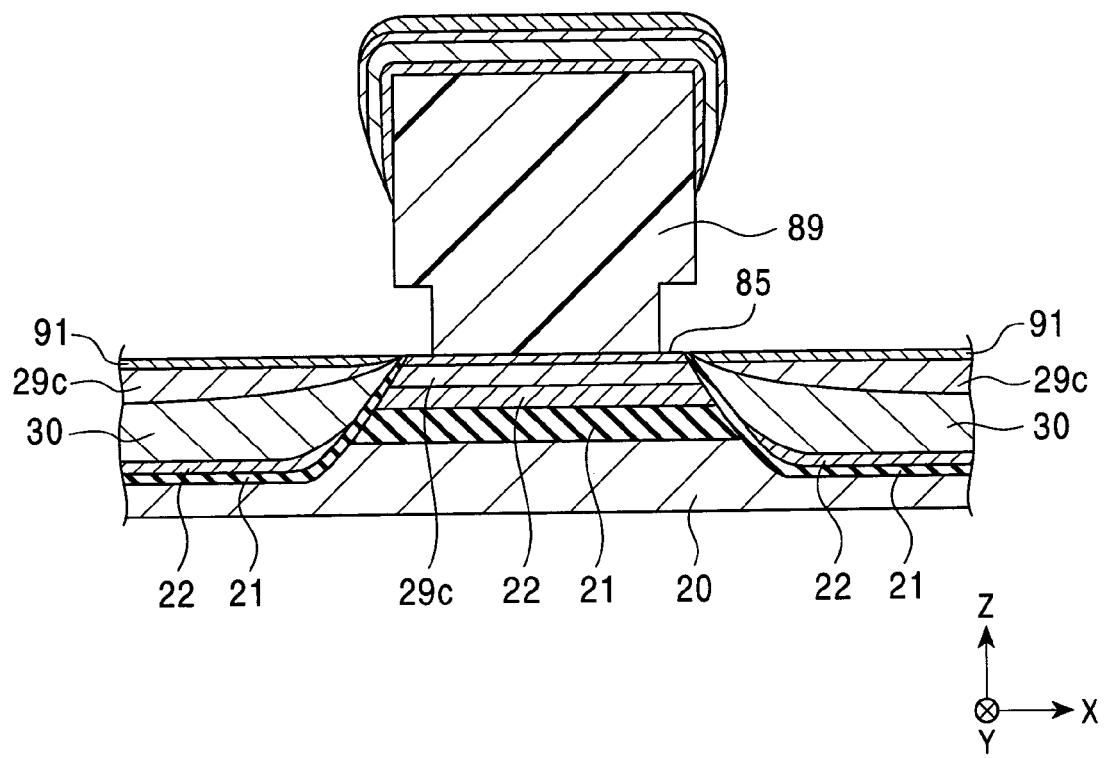
FIG. 46 is a drawing showing a step of a manufacturing method different from the method shown in FIGS. 36 and 37.
Figure 47:
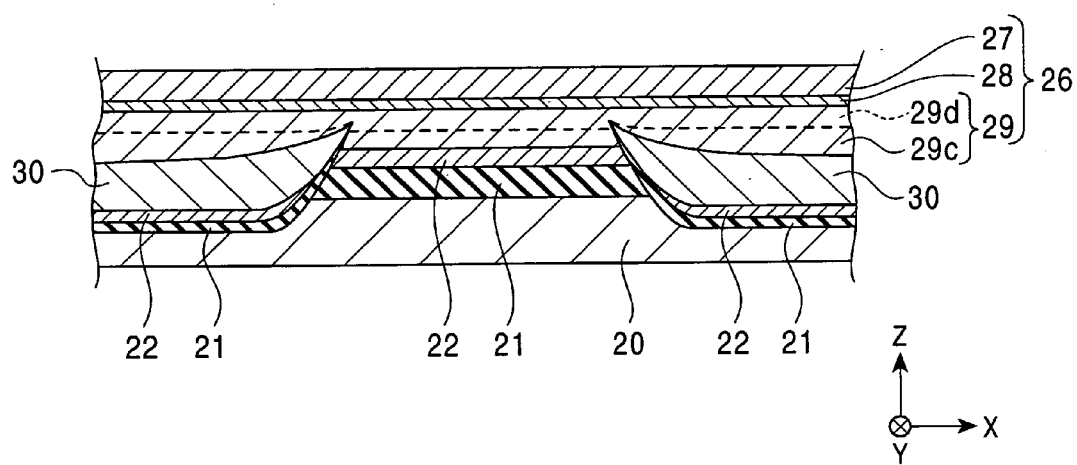
FIG. 47 is a drawing showing a step performed after the step shown in FIG. 46.

FIGS. 46 and 47 are drawings respectively showing steps different from the steps shown in FIGS. 44 and 45 for forming the first antiferromagnetic layer 30 and the pinned magnetic layer 26. Each of the figures is a partial sectional view of the magnetic detecting element in each step, as viewed from the surface facing the recording medium.

In the step shown in FIG. 46, the lower shield layer 20, the lower gap layer 21, the seed layer 22, the lower layer 29c of the first magnetic layer 29 constituting the pinned magnetic layer 26, and the nonmagnetic layer 85 are formed, and the lift off resist layer 89 shown in FIG. 46 is formed on the nonmagnetic material layer 85. Then, the portions of the nonmagnetic layer 85, the lower layer 29c of the first magnetic layer 29, the seed layer 22, the lower gap layer 21 and the lower shield layer 20, which are not covered with the resist layer 89, are removed. Then, the lower gap layer 21, the seed layer 22, the first antiferromagnetic layer 30, the lower layer 29c of the first magnetic layer 29 and the nonmagnetic layer 91 are deposited on the remaining portions of the lower shield layer 20.

Next, the resist layer 89 is removed, and then the nonmagnetic layers 85 and 91 are removed by ion milling. As shown in FIG. 47, the upper layer 29d of the first magnetic layer 29 is then deposited on the lower layer 29c of the first magnetic layer 29, which is exposed by removing the nonmagnetic layers 85 and 91, and the nonmagnetic intermediate layer 28 and the second magnetic layer 27 are further deposited on the upper layer 29d.

In FIG. 47, the boundary between the lower layer 29c and the upper layer 29d is shown by a dotted line. Although the nonmagnetic layers 85 and 91 may be left at the boundary, the lower layer 29c and the upper layer 29d are ferromagnetically coupled with each other to form the first magnetic layer 29. Thus, the pinned magnetic layer 26 comprises the three layers including the first magnetic layer 29, the nonmagnetic intermediate layer 28 and the second magnetic layer 27. The subsequent step is the same as that shown in FIG. 38 in which the nonmagnetic material layer 25, the free magnetic layer 24, etc. are continuously deposited on the pinned magnetic layer 26.

The steps shown in FIGS. 44 to 47 can be performed for manufacturing a magnetic detecting element in which the nonmagnetic metal layer having the same composition as that of the first antiferromagnetic layer 30 is not left on the protection 20a of the lower shield layer 20.

FIGS. 48 and 49 are drawings showing steps of the method for manufacturing the magnetic detecting element shown in FIG. 12. Each of the figures is a partial sectional of the magnetic detecting element in each step, as viewed from the surface facing the recording medium.

In the step shown in FIG. 48, the lower shield layer 20, the lower gap layer 21, the seed layer 22, the first antiferromagnetic layer 30, and the nonmagnetic layer 101 made of Ru or the like are deposited, and then a mask layer 94 comprising resist or the like having a space C in the track width direction is formed on the nonmagnetic layer 101. Then, the portions of the nonmagnetic layer 101 and the first antiferromagnetic layer 30, which are not covered with the mask layer 94, are removed by ion milling or RIE. As a result, the space C is also formed in the first antiferromagnetic layer 30 in the track width direction (the X direction shown in the drawing).

As shown in FIG. 48, then the nonmagnetic layer 95 made of Ru or the like is formed on the mask layer 94 and within the space C, and then the mask layer 94 is separated. Furthermore, the nonmagnetic layers 95 and 101 are removed by low-energy ion beam etching.

In the next step shown in FIG. 49, the nonmagnetic metal layer 30e having the same composition as the antiferromagnetic layer and a thickness, for example, smaller than 50 Å, is deposited on the fist antiferromagnetic layer 30 and within the space C. The same step as that shown in FIG. 40 is then performed to continuously deposit the pinned magnetic layer 26 having the synthetic ferrimagnetic structure, the nonmagnetic material layer 25, the free magnetic layer 24, etc. on the antiferromagnetic layer 30.

Each of the magnetic detecting elements shown in FIGS. 15 to 17, respectively, can be manufactured by a combination of some of the steps shown in FIGS. 28 to 49.

Each of the magnetic detecting elements shown in FIGS. 18 to 20, respectively, can be also manufactured by a combination of some of the steps shown in FIGS. 28 to 49. However, the preferred forms of the first antiferromagnetic layer 30 and the first magnetic layer 29 of the pinned magnetic layer 26 are described above with reference to FIGS. 18 to 20.

Although each of FIGS. 1 to 49 shows only a reproducing MR head section of the magnetic detecting element, the present invention can also be applied to a thin film magnetic head comprising a writing inductive head section laminated on the upper shield layer.

The magnetic detecting element of the present invention can be used for a magnetic sensor as well as a magnetic head incorporated into a hard disk device.

EXAMPLES

Figure 50:
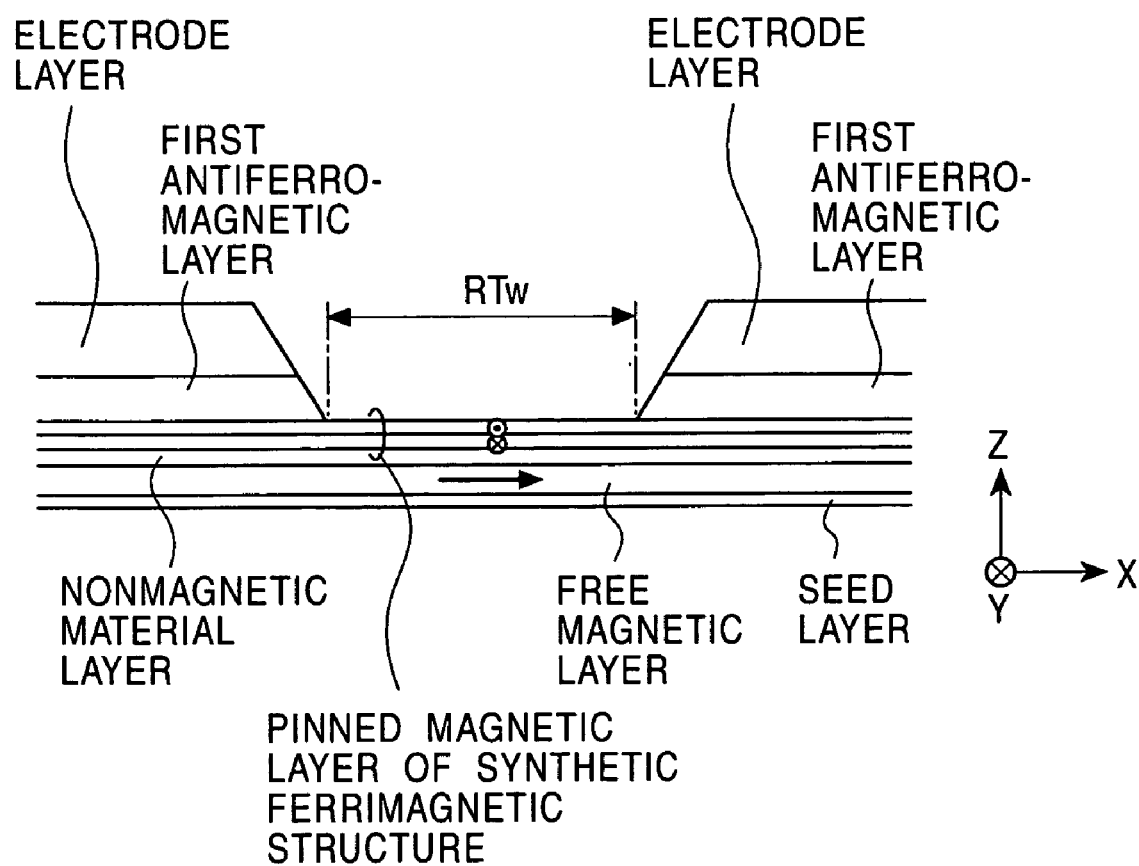
FIG. 50 is a schematic drawing showing the structure of a magnetic detecting element (Example) used in experiments.

The magnetic detecting elements having the structures shown in FIGS. 50 (Example) and 53 (Comparative Example), respectively, were used for determining unidirectional exchange bias magnetic field Hex* and reproduction output (normalized output).

FIG. 50 (Example) is a schematic drawing showing a partial section of the magnetic detecting element, as viewed from a surface facing a recording medium. In FIG. 50, a film structure comprises a seed layer: $(Ni_{0.8}Fe_{0.2})_{60at\%}Cr_{40at\%}$ (60 Å)/a free magnetic layer: $Ni_{80at\%}Fe_{20at\%}$ (35 Å)/$Co_{90at\%}Fe_{10at\%}$ (10 Å)/a nonmagnetic material layer: Cu (21 Å)/a pinned magnetic layer: [second magnetic layer: $Co_{90at\%}Fe_{10at\%}$ (X Å)/nonmagnetic intermediate layer: Ru (9 Å)/first magnetic layer: $Co_{90at\%}Fe_{10at\%}$ (Y Å)]/a first antiferromagnetic layer: $Pt_{50at\%}Mn_{50at\%}$ (200 Å). In this structure, a value in parentheses shows the thickness of each layer. As shown in FIG. 50, magnetization of the free magnetic layer is oriented in the track width direction. However, a permanent-magnet layer and second antiferromagnetic layer for controlling the magnetization of the free magnetic layer are not provided. As shown in FIG. 50, magnetizations of the first and second magnetic layers are antiparallel to each other in parallel with the height direction (the Y direction shown in the drawing).

Also, as shown in FIG. 50, a space is formed at the center of the first antiferromagnetic layer so that the first magnetic layer constituting the pinned magnetic layer is exposed from the space. The width dimension of the space in the track width direction corresponds to a track width RTw which is a physical track width (Physical Read Track Width).

As described above, the thickness of the second magnetic layer is X Å, and the thickness of the first magnetic layer is Y Å. The thickness of each of the magnetic layers was changed to determine the relation between the track width RTw and unidirectional exchange bias magnetic field, and the relation between the track width RTw and normalized output. The unidirectional exchange bias magnetic field Hex* is defined as the magnitude of an external magnetic field with a half of the maximum rate ($\Delta R/R$) of resistance change. The unidirectional exchange bias magnetic field includes an exchange coupling magnetic field produced between the pinned magnetic layer and an antiferromagnetic layer, and a coupling magnetic field due to a RKKY interaction between the CoFe layers constituting the pinned magnetic layer having the synthetic ferrimagnetic structure. By increasing the unidirectional exchange bias magnetic field, the pinned magnetic layer can be properly pinned in a predetermined direction.

Figure 51:
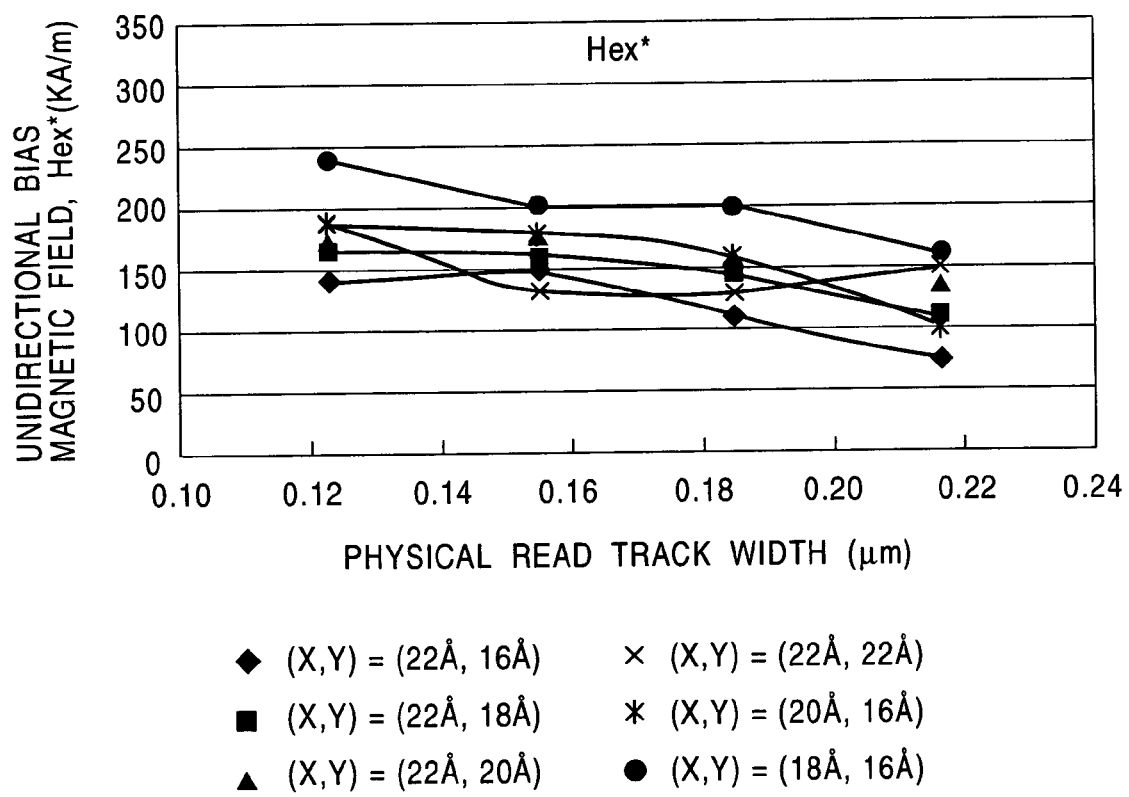
FIG. 51 is a graph showing the relation between the track width RTw and unidirectional exchange bias magnetic field Hex* determined by using the magnetic detecting element shown in FIG. 50.

As shown in FIG. 51, the unidirectional exchange bias magnetic field decreases as the track width RTw increases. However, with the track width RTw of about 0.22 μm, an unidirectional exchange bias magnetic field of as high as about 100 kA/m is produced. It is thought that a unidirectional exchange bias magnetic field of about 80 kA/m is required for pinning the magnetization of the pinned magnetic layer. Therefore, it is found that setting of the track width RTw has some degree of freedom.

Figure 52:
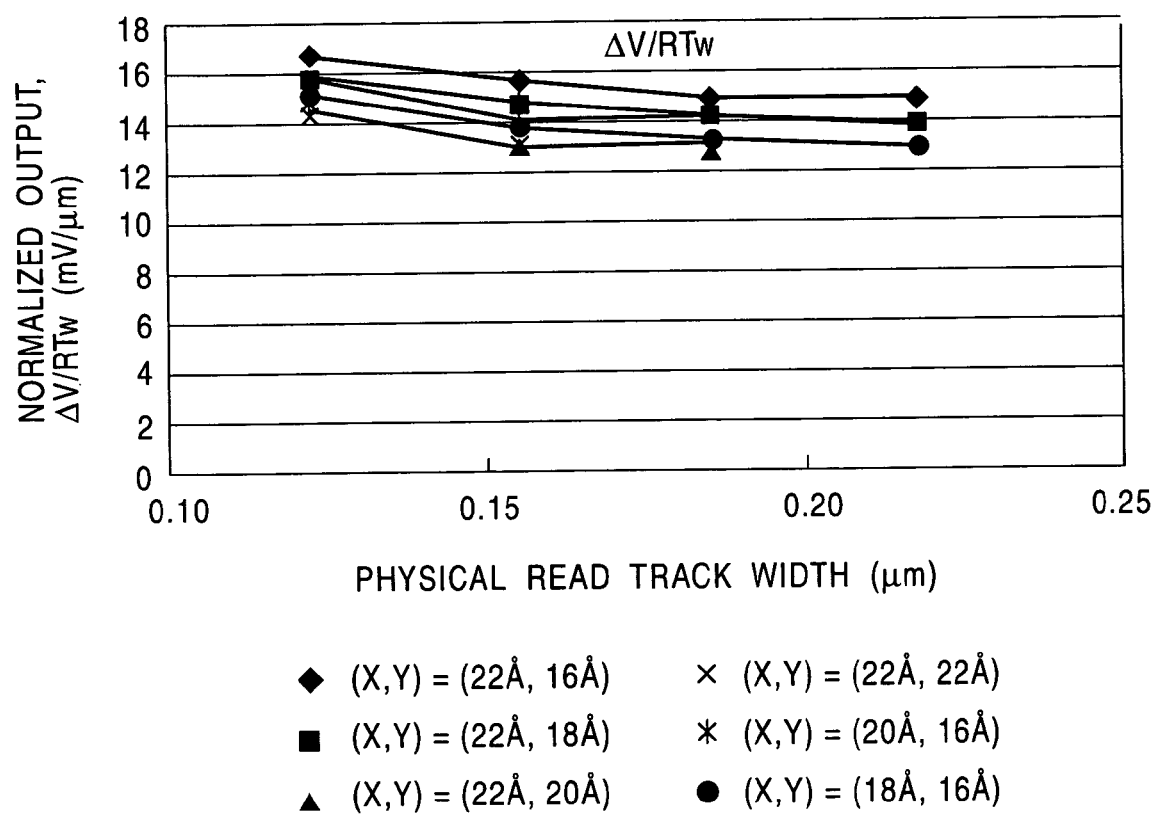
FIG. 52 is a graph showing the relation between the track width RTw and normalized output determined by using the magnetic detecting element shown in FIG. 50.

FIG. 52 is a graph showing the relation between the track width RTw and the reproduction output ($\Delta V/RTw$) normalized with the track width RTw. The normalized output is determined by dividing a voltage difference $\Delta V$ between voltages with uniform magnetic fields of ±4000 Oe (±31 kA/m) applied in the height direction by the track width RTw.

FIG. 52 indicates that the normalized output slightly decreases as the track width RTw increases, but the normalized output is maintained at 12 mV/μm or more even when the track width RTw exceeds 0.2 μm.

Figure 53:
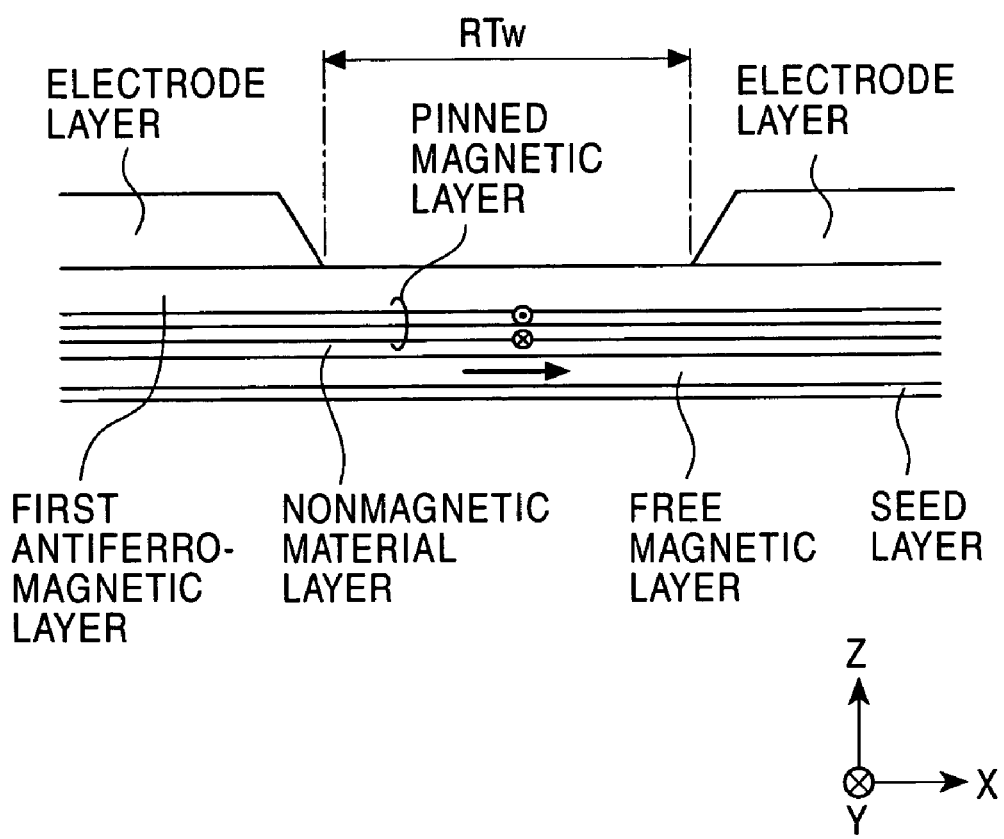
FIG. 53 is a schematic drawing showing the structure of a magnetic detecting element (Comparative Example) used in experiments.

FIG. 53 (Comparative Example) is a schematic drawing showing the partial section of a magnetic detecting element, as viewed from a surface facing a recording medium. The same film structure as that of the magnetic detecting element shown in FIG. 50 is used. As shown in FIG. 53, magnetization of the free magnetic layer is oriented in the track width direction. However, a permanent-magnet layer and second antiferromagnetic layer for controlling the magnetization of the free magnetic layer are not provided. As shown in FIG. 53, magnetizations of the first and second magnetic layers are antiparallel to each other in parallel with the height direction (the Y direction shown in the drawing).

Like in the case shown in FIG. 50, in FIG. 53, the thickness of the second magnetic layer is X Å, and the thickness of the first magnetic layer is Y Å. The thickness of each of the magnetic layers was changed to determine the relation between the track width RTw and unidirectional exchange bias magnetic field, and the relation between the track width RTw and normalized output. Unlike in the magnetic detecting element shown in FIG. 50, in the magnetic detecting element shown in FIG. 53, a space is not formed in the first antiferromagnetic layer in the track width direction (the X direction), but the first antiferromagnetic layer is provided over the entire surface of the first magnetic layer. However, as shown in FIG. 53, a space is provided, in the track width direction, in the electrode layer provided on the first antiferromagnetic layer. The width dimension of the space in the track width direction (the X direction) corresponds to a track width RTw which is a physical track width (Physical Read Track Width).

Figure 54:
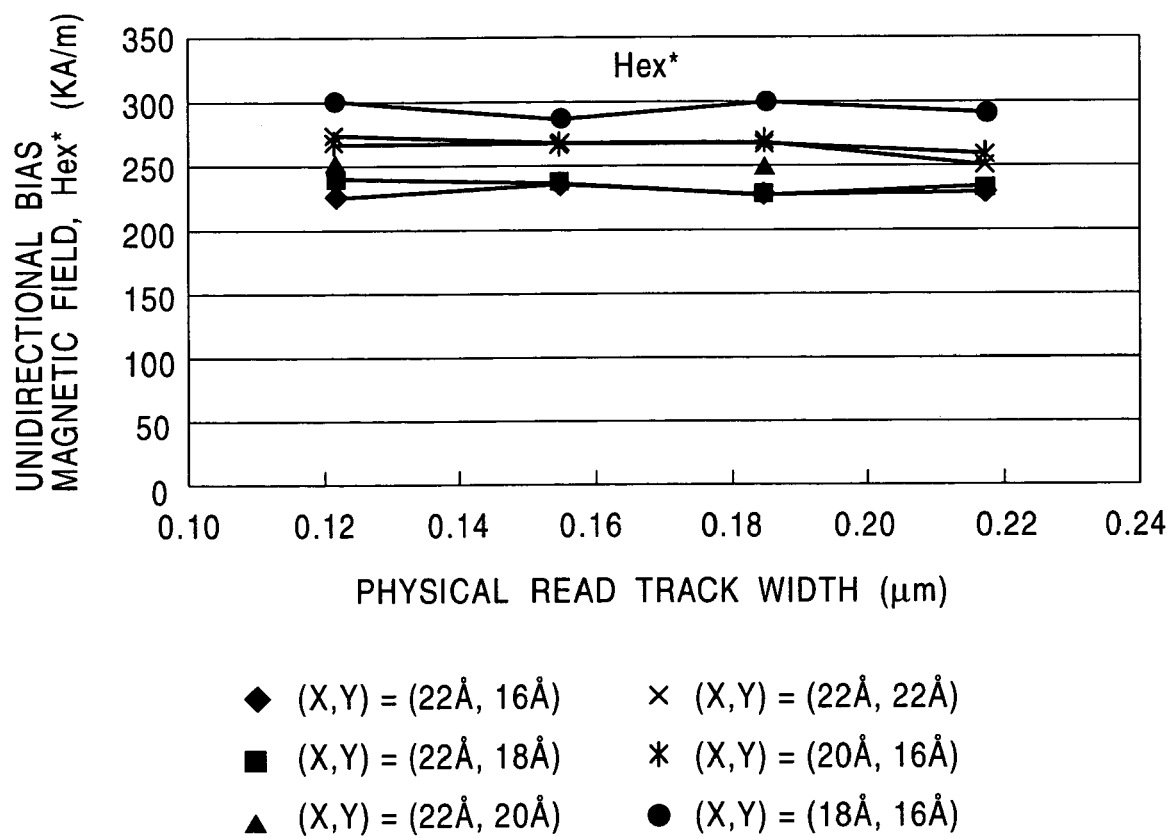
FIG. 54 is a graph showing the relation between the track width RTw and unidirectional exchange bias magnetic field Hex* determined by using the magnetic detecting element shown in FIG. 53.
Figure 55:
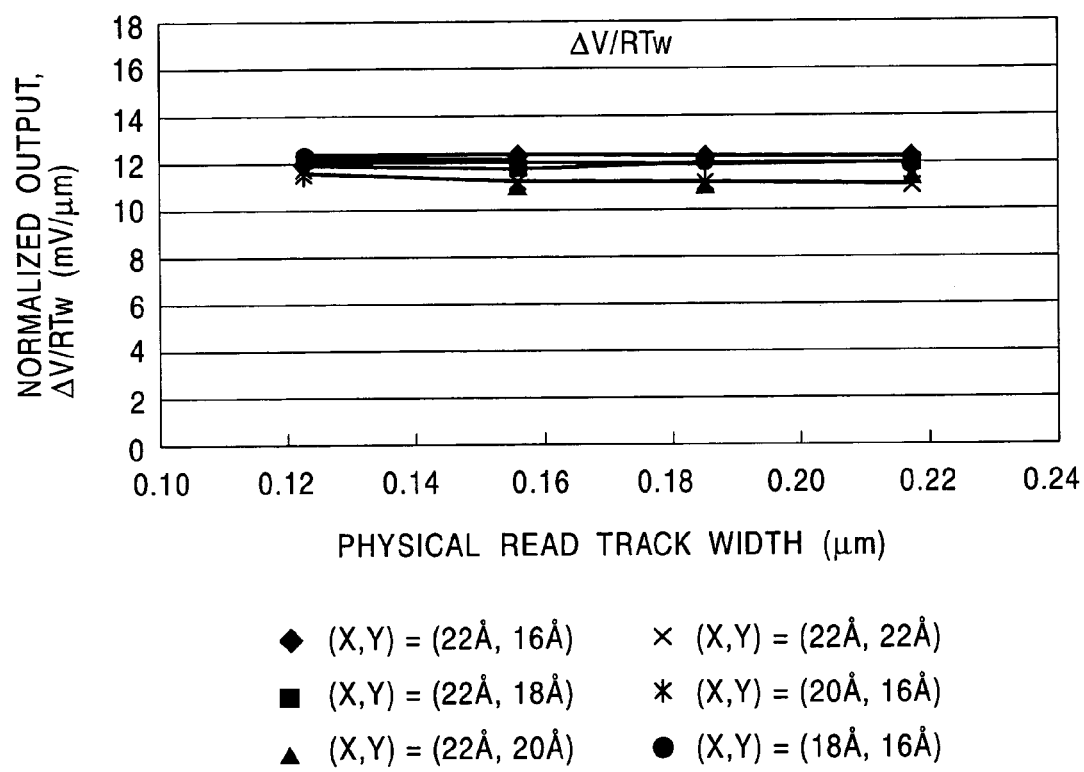
FIG. 55 is a graph showing the relation between the track width RTw and normalized output determined by using the magnetic detecting element shown in FIG. 53.

FIG. 54 indicates that the magnitude of the unidirectional exchange bias magnetic field little changes with increases in the track width RTw. FIG. 55 indicates that the normalized output does not change with increases in the track width RTw.

The magnetic detecting element according to an embodiment of the present invention comprises a first antiferromagnetic layer having the space in the track width direction, as shown in FIG. 50. However, a comparison between FIGS. 51 and 54 shows that the unidirectional exchange bias magnetic field Hex* in the example is lower that that in the comparative example. This is possibly due to the fact that in the example, the first antiferromagnetic layer is not provided on the central portion of the first magnetic layer, and thus no exchange coupling magnetic filed occurs in the central portion of the element. However, it is found that in the example, the unidirectional exchange bias magnetic field Hex* sufficient to properly pin the magnetization of the pinned magnetic layer can be obtained by properly controlling the track width RTw.

As described above, the minimum unidirectional exchange bias magnetic field is thought to be about 80 kA/m. Therefore, FIG. 51 shows that with a track width RTw of 0.2 μm or less, the unidirectional exchange bias magnetic field of about 80 kA/m or more can be obtained.

A comparison between FIGS. 52 and 55 indicates that the normalized output in the example is higher than that in the comparative example. This is possibly due to the fact that in the example, the first antiferromagnetic layer is not provided on the central portion of the first magnetic layer, and thus a shunt loss of the sensing current flowing from the electrode layer is decreased.

Namely, it is found that in the example in which the first antiferromagnetic layer is not provided on the central portion of the first magnetic layer, the unidirectional exchange bias magnetic field sufficient to pin the magnetizations of the first and second magnetic layers of the pinned magnetic layer can be obtained, and the reproduction output can be increased, as compared with a conventional magnetic detecting element.

Also, FIGS. 51 and 52 indicate that the unidirectional exchange bias magnetic field and normalized output can be increased by decreasing the thickness of each of the first and second magnetic layers and decreasing the thickness difference between both magnetic layers.

Next, a magnetic detecting element in which a second antiferromagnetic layer was provided below the free magnetic layer shown in FIG. 50 was manufactured. In this case, the track width RTw was about 0.2 μm.

The magnetic detecting element was used for examining the relation between a synthetic magnetic moment (Nest Mst) per unit and ease (sensitivity) of magnetization rotation of the central portion of the pinned magnetic layer with a magnetic field in the track width direction, the synthetic magnetic moment (Nest Mst) per unit area being obtained by subtracting the magnetic moment per unit area of the first magnetic layer from the magnetic moment per unit area of the second magnetic layer. Also, the relation between a thickness difference and ease (sensitivity) of magnetization rotation of the central portion of the pinned magnetic layer with a magnetic field in the track width direction was examined, the thickness difference being obtained by subtracting the thickness of the first magnetic layer from the thickness of the second magnetic layer.

In experiments, the thickness of each of the first and second magnetic layers was changed to change the magnetic moment (saturation magnetization Ms×thickness t) per unit area of each of the first and second magnetic layers. Then, a ratio $\{\Delta V\ (\pm 100\ \text{Oe}/\Delta V\ (\pm 4000\ \text{Oe})\}$ of a voltage difference ($\Delta V$) between voltages with external magnetic fields of $\pm 100$ Oe to a voltage difference ($\Delta V$) between voltages with external magnetic fields of $\pm 4000$ Oe was determined (an external magnetic field of +100 Oe represents the direction and magnitude of an external magnetic field, for example, in the track width direction, and an external magnetic field of −100 Oe represents the direction and magnitude of an external magnetic field in a direction opposite to the track width direction; and an external magnetic field of +4000 Oe represents the direction and magnitude of an external magnetic field, for example, in the track width direction, and an external magnetic field of −4000 Oe represents the direction and magnitude of an external magnetic field in a direction opposite to the track width direction). The ratio $\Delta V\ (\pm 100\ \text{Oe})/\Delta V\ (\pm 4000\ \text{Oe})$ is an index for a degree of rotation of magnetization of each of the first and second magnetic layers in a weak magnetic field, i.e., the ratio indicates the sensitivity of the pinned magnetic layer to a magnetic field in the track width direction. The magnetic field of 4000 Oe is about $31.6 \times 10^4$ A/m.

Figure 56:
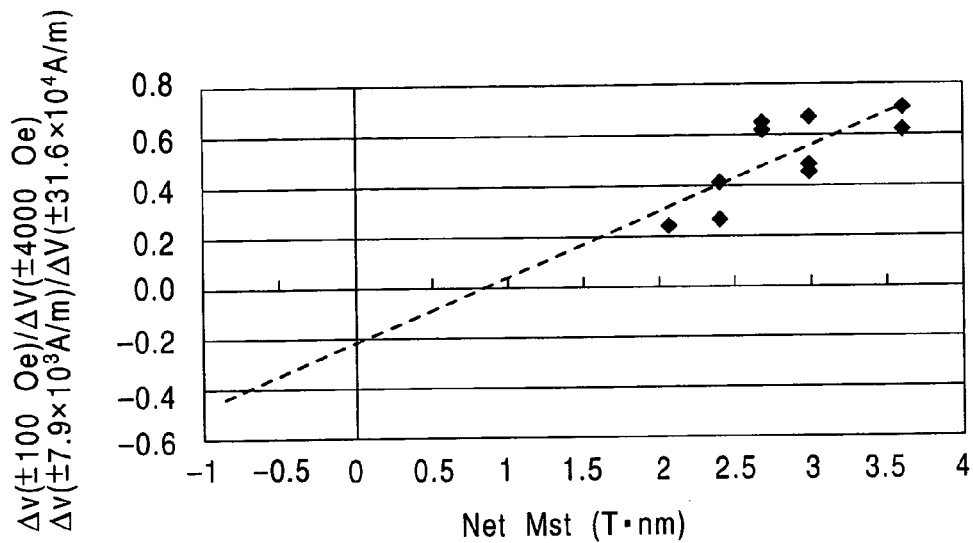
FIG. 56 is a graph showing the relation between $\Delta V$ ($\pm 100$ Oe)/$\Delta V$ ($\pm 4000$ Oe) and a synthetic magnetic moment (Net Mst) per unit area of a pinned magnetic layer of the magnetic detecting element shown in FIG. 50 in which magnetization of a free magnetic layer is pinned by a second antiferromagnetic layer.

FIG. 56 is a graph showing the relation between the synthetic magnetic moment per unit area and the sensitivity $\{\Delta V\ (\pm 100\ \text{Oe}/\Delta V\ (\pm 4000\ \text{Oe})\}$ (simply referred to as "sensitivity" hereinafter). FIG. 56 indicates that the sensitivity gradually decreases as the synthetic magnetic moment per unit area decreases. In FIG. 56, the sensitivity possibly becomes 0 near the synthetic magnetic moment per unit area of 1 (T·nm). It is also found that with the synthetic magnetic moment per unit area of 1.5 (T·nm) or less, the sensitivity can be suppressed to 0.2 or less.

In the experiments, it was found that the sensitivity can be effectively decreased by decreasing the synthetic magnetic moment per unit area within a range.

Figure 57:
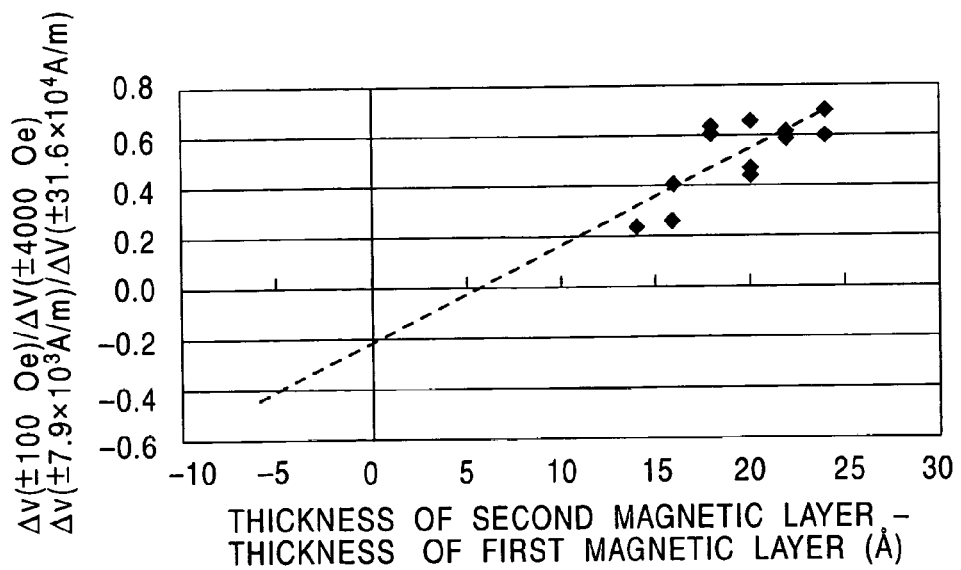
FIG. 57 is a graph showing the relation between $\Delta V$ ($\pm 100$ Oe)/$\Delta V$ ($\pm 4000$ Oe) and a thickness difference obtained by subtracting the thickness of a first magnetic layer from the thickness of a second magnetic layer of the magnetic detecting element shown in FIG. 50 in which magnetization of a free magnetic layer is pinned by a second antiferromagnetic layer.

FIG. 57 is a graph showing the relation between the thickness difference obtained by subtracting the thickness of the first magnetic layer from the thickness of the second magnetic layer and the sensitivity $\{\Delta V\ (\pm 100\ \text{Oe}/\Delta V\ (\pm 4000\ \text{Oe})\}$ (simply referred to as "sensitivity" hereinafter). This graph shows the same tendency as in FIG. 57 that the sensitivity gradually decreases as the thickness difference decreases. FIG. 57 shows that the sensitivity possibly becomes 0 near the thickness difference of 5 Å, and the sensitivity can be suppressed to 0.2 or less by decreasing the thickness difference to 10 Å or less.

Next, a second magnetic layer was formed in a three layer structure of $Co_{90at\%}Fe_{10at\%}$ (10 Å)/$Ni_{80at\%}Fe_{20at\%}$ (30 Å)/$Co_{90at\%}Fe_{10at\%}$ (6 Å) which are deposited in that order from below. In this structure, a value in parentheses shows the thickness of each layer.

Also, the nonmagnetic intermediate layer was formed to a thickness of 9 Å by using Ru, and the first magnetic layer was made of $Co_{90at\%}Fe_{10at\%}$. The thickness of each of the magnetic layers was changed to change the magnitude of the synthetic magnetic moment per unit area and the thickness difference between the first and second magnetic layers.

Figure 58:
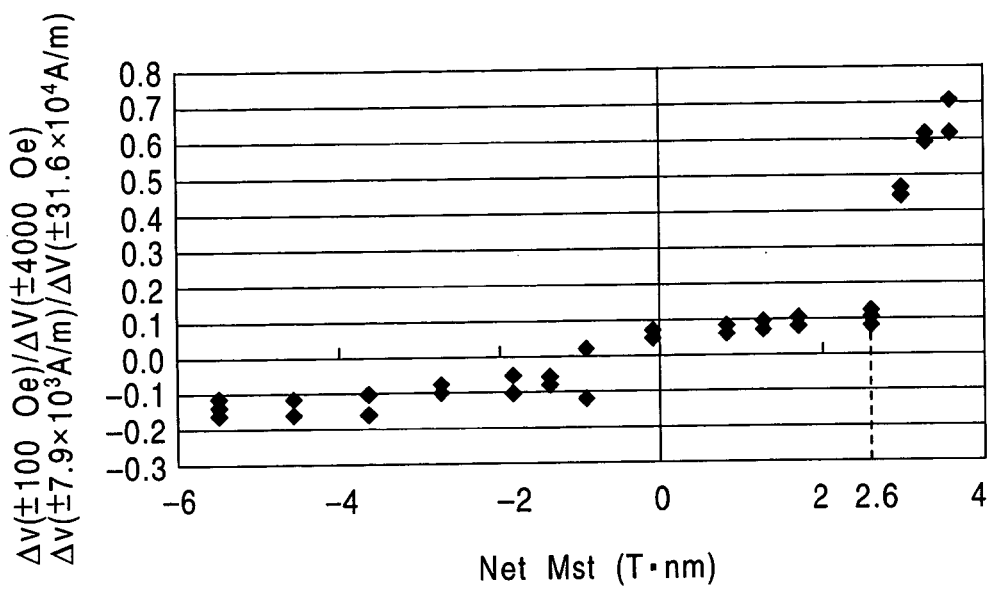
FIG. 58 is a graph showing the relation between $\Delta V$ ($\pm 100$ Oe)/$\Delta V$ ($\pm 4000$ Oe) and the synthetic magnetic moment (Net Mst) per unit area of a pinned magnetic layer of a magnetic detecting element comprising a second magnetic layer made of a material different from that shown in FIG. 50.

FIG. 58 is a graph showing the relation between the synthetic magnetic moment (Nest Mst) per unit area and the sensitivity $\{\Delta V\ (\pm 100\ \text{Oe}/\Delta V\ (\pm 4000\ \text{Oe})\}$ (simply referred to as "sensitivity" hereinafter), the synthetic magnetic moment per unit area being obtained by subtracting the magnetic moment per unit area of the first magnetic layer from the magnetic moment per unit area of the second magnetic layer.

FIG. 58 indicates the same tendency as in FIG. 56 that the sensitivity decreases as the synthetic magnetic moment per unit area decreases. In FIG. 58, the sensitivity rapidly changes with the synthetic magnetic moment per unit area of 2.6 (T·nm) as a boundary. Namely, the sensitivity greatly changes with the synthetic magnetic moment per unit area of 2.6 (T·nm) as an inflection point.

FIG. 58 also indicates that the sensitivity becomes 0.2 or less when the synthetic magnetic moment per unit area is 2.6 (T·nm) or less.

Figure 59:
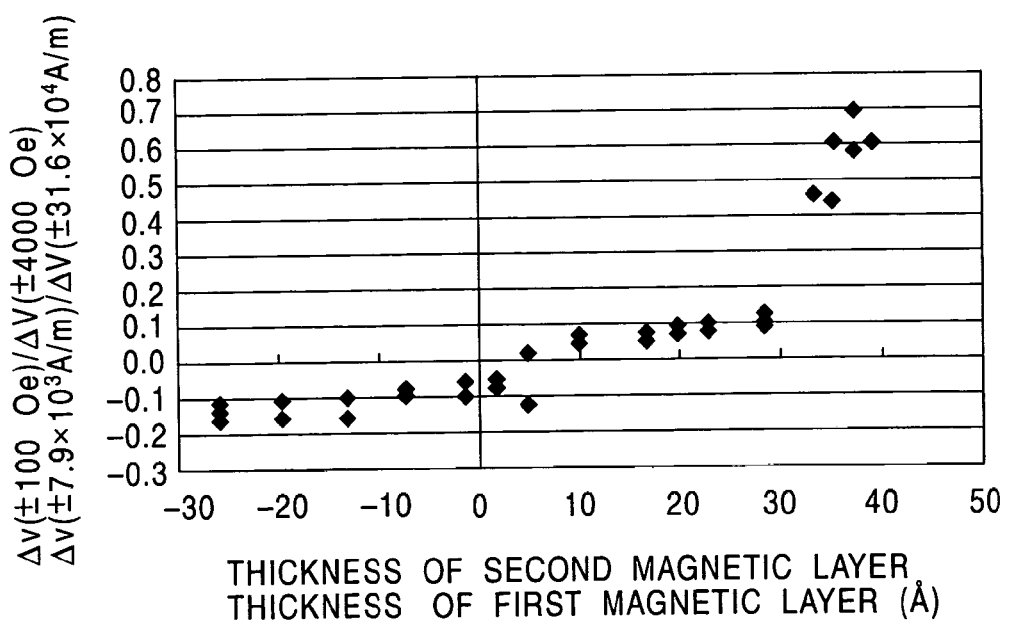
FIG. 59 is a graph showing the relation between $\Delta V$ ($\pm 100$ Oe)/$\Delta V$ ($\pm 4000$ Oe) and a thickness difference obtained by subtracting the thickness of a first magnetic layer from the thickness of a second magnetic layer of a magnetic detecting element comprising a second magnetic layer made of a material different from that shown in FIG. 50.

FIG. 59 is a graph showing the relation between the thickness difference obtained by subtracting the thickness of the first magnetic layer from the thickness of the second magnetic layer and the sensitivity {ΔV (±100 Oe/ΔV (±4000 Oe)} (simply referred to as "sensitivity" hereinafter).

FIG. 59 indicates the same tendency as in FIG. 57 that the sensitivity decreases as the thickness difference decreases.

FIG. 59 indicates that the sensitivity rapidly changes with the thickness difference of 30 Å as a boundary. Namely, the sensitivity greatly changes with the thickness difference of 30 Å as an inflection point. FIG. 59 also reveals that the sensitivity becomes 0.2 or less when the thickness difference becomes 30 Å or less.

In the experiments performed for examining the relations shown in FIGS. 56 to 59, the magnetization of the free magnetic layer was pinned by the exchange coupling magnetic field produced between the free magnetic layer and the second antiferromagnetic layer formed below the whole under surface of the free magnetic layer, and thus the sensitivity was greatly due to a change in magnetization of the central portion of the pinned magnetic layer. Therefore, the synthetic magnetic moment per unit area and the thickness difference are preferably set to decrease the sensitivity as much as possible so that the magnetization of the pinned magnetic layer can be properly pinned.

In the present invention, the preferred synthetic magnetic moment per unit area and thickness difference are determined based on the experimental results shown in FIGS. 56 to 59.

The preferred sensitivity of the central portion of the pinned magnetic layer will be described below. FIG. 58 indicates that the sensitivity rapidly changes with the synthetic magnetic moment per unit area of 2.6 (T·nm) as a boundary, and the sensitivity can be suppressed to 0.2 or less when the synthetic magnetic moment per unit area is 2.6 (T·nm) or less.

FIG. 58 also reveals that the absolute value of the sensitivity can be suppressed to 0.2 or less by setting the synthetic magnetic moment per unit area in the range of −6 (T·nm) to 2.6 (T·nm).

It is also found that a spin flop magnetic field becomes high with the plus synthetic magnetic moment. Therefore, with a high spin flop magnetic field, magnetization pinning of the pinned magnetic layer can be optimized, and the manufacturing process can be facilitated. Particularly, when the first antiferromagnetic layer is disposed above the free magnetic layer, and the second antiferromagnetic layer is used as a magnetization control layer for the free magnetic layer, magnetic field annealing performed for producing the exchange coupling magnetic field between the free magnetic layer and the second antiferromagnetic layer causes a limitation that the magnitude of the magnetic field applied in magnetic field annealing for producing the exchange coupling magnetic field between the first antiferromagnetic layer and the first magnetic layer constituting the pinned magnetic layer must be lower than the exchange coupling magnetic field produced between the free magnetic layer and the second antiferromagnetic layer. Therefore, when the first antiferromagnetic layer is disposed above the free magnetic layer, and the second antiferromagnetic layer is used as the magnetization control layer for the free magnetic layer, the synthetic magnetic moment is preferably set to a plus value because the spin flop magnetic field can be increased to widen the margin for the applied magnetic field and improve ease of the manufacturing process.

When the synthetic magnetic moment is 0 (T·nm), the magnetic moment per unit area of the first magnetic layer is equal to the magnetic moment per unit area of the second magnetic layer, and thus which of the first and second magnetic layers becomes a dominant layer (in which magnetization is oriented in the direction of the applied magnetic field) in magnetic field annealing cannot be determined. It is thus difficult to pin the magnetizations of the first and second magnetic layers in an antiparallel state in parallel with the height direction. It is thus necessary that the synthetic magnetic moment is not 0 (T·nm).

In the present invention, the preferred synthetic magnetic moment is thus −6 (T·nm) 2.6 (T·nm) (except 0 T·nm). When the first antiferromagnetic layer is disposed above the free magnetic layer, and the second antiferromagnetic layer is used as the magnetization control layer for the free magnetic layer, the preferred synthetic magnetic moment is in the range of 0 (T·nm) 2.6 (T·nm).

In each of the structures shown in FIGS. 3 to 8 in which the second antiferromagnetic layer is not used, and only one time of magnetic field annealing is performed, or in each of the structures shown in FIGS. 10 to 12 in which the pinned magnetic layer disposed on the lower side, and magnetization of the pinned magnetic layer is pinned by first magnetic field annealing, the synthetic magnetic moment may be less than 0 (T·nm) because annealing can be performed in a strong magnetic field (a magnetic field in which the magnetizations of the first and second magnetic layers are parallel to each other in the same direction).

However, in the experiments performed for obtaining the results shown in FIG. 56, the magnetic detecting element comprising the first and second magnetic layers made of a CoFe alloy was used. In this case, the sensitivity can be suppressed to 0.2 or less by setting the synthetic magnetic moment to 1.5 (T·nm) or less. Therefore, when both the magnetic detecting element comprising the first and second magnetic layers are made of the CoFe alloy, the synthetic magnetic moment is more preferably set to 0 (T·nm) to 1.5 (T·nm).

Next, the preferred thickness difference will be described. FIG. 59 indicates that in order to suppress the absolute value of the sensitivity to 0.2 or less, the thickness difference may be −30 Å to 30 Å. However, with a minus thickness difference, the same defect as described above easily occurs when the first antiferromagnetic layer is disposed above the free magnetic layer, and the second antiferromagnetic layer is used as the magnetization control layer for the free magnetic layer. In this case, the thickness difference is preferably a plus value.

In the experiments performed for obtaining the results shown in FIG. 59, the second magnetic layer having the three layer structure of CoFe/NiFe/CoFe was used, and the first magnetic layer having the single layer structure of CoFe was used. Therefore, the saturation magnetizations of the first and second magnetic layers were different values. Thus, even when the first and second magnetic layer have a same thickness, i.e., even when the thickness difference is 0 Å, the synthetic magnetic moment per unit area does not become 0 (T·nm).

In the present invention, the preferred thickness difference is thus −30 Å to 30 Å. Therefore, when the first antiferromagnetic layer is disposed above the free magnetic layer, and the second antiferromagnetic layer is used as the magnetization control layer for the free magnetic layer, the thickness difference is preferably 0 Å to 30 Å.

However, in the experiments performed for obtaining the results shown in FIG. 57, the magnetic detecting element comprising the first and second magnetic layers made of a CoFe alloy was used. In this case, the sensitivity can be suppressed to 0.2 or less by setting the thickness difference to 10 Å or less, and when the thickness difference is 0 Å, the synthetic magnetic moment becomes to 0 (T·nm). Therefore, the thickness difference is more preferably set to 0 Å to 10 Å.

In the above-described experiments, as shown in FIG. 50, the first antiferromagnetic layer had the space in the track width direction, and a nonmagnetic metal layer having the same composition as that of the first antiferromagnetic layer was not provided in the space.

Thus, experiments were performed with attention to the nonmagnetic metal layer and the first magnetic layer constituting the pinned magnetic layer.

First, a CoFe layer (first magnetic layer) was laminated on a PtMn layer (nonmagnetic metal layer) with changing composition ratios of the PtMn layer for examining changes in magnetostriction of CoFe.

The multilayer film below was deposited and annealed at 290° C. for 4 hours. In the multilayer film below, a second magnetic layer and free magnetic layer were omitted because only the magnetostriction of the first magnetic layer was measured.

Silicon substrate/alumina (1000 Å)/($Ni_{0.8}Fe_{0.2}$)$_{60}Cr_{40}$ (52 Å)/$Pt_xMn_{100-x}$ (30 Å)/$Co_{90}Fe_{10}$ (20 Å)/Ru (9 Å)

The magnetostriction was measured by an optical lever method. A magnetic field was applied in parallel with the film plane of the multilayer film with a laser beam applied to the surface of the multilayer film. A deflection of the multilayer film due to magnetostriction was read as a change in the reflection angle of the laser beam to measure the magnetostrictive constant of the multilayer film.

Figure 60:
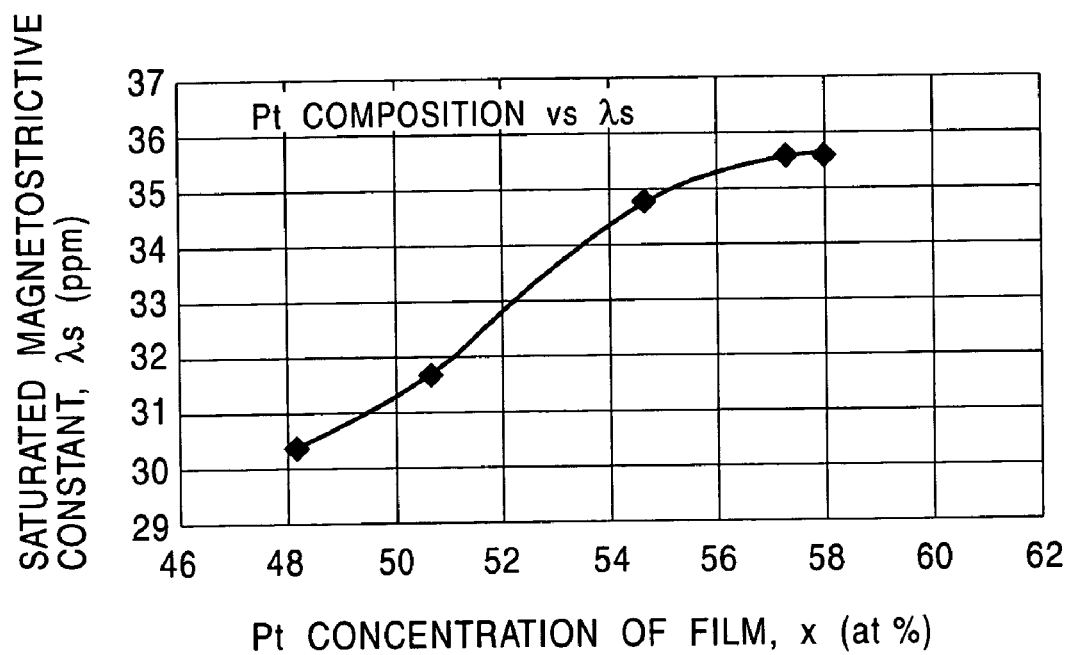
FIG. 60 is a graph showing changes in magnetostriction of CoFe with changes in the composition ratio of a PtMn layer with a CoFe layer laminated thereon.

The results are shown in FIG. 60. FIG. 60 indicates that the magnetostrictive constant of the multilayer film increases as the Pt concentration of the PtMn layer increases. Particularly, the magnetostrictive constant rapidly increases with the Pt concentration of 51 atomic percent or more, and the rate of increase in the magnetostrictive constant decreases with the Pt concentration of 55 atomic percent or more.

This is possibly due to the fact that the crystal lattice constant of PtMn increases as the Pt concentration of the PtMn layer increases, and thus a distortion near the interface between the PtMn layer and the CoFe layer increases.

Next, a CoFe layer was laminated on a PtMn layer, and a Co layer was laminated on a PtMn layer for comparing the magnetostrictive constants of Co and CoFe.

The multilayer film below was deposited and annealed at 290° C. for 4 hours.

Silicon substrate/alumina (1000 Å)/($Ni_{0.8}Fe_{0.2}$)$_{60}Cr_{40}$ (52 Å)/$Pt_{50}Mn_{50}$ (0 Å or 30 Å)/Pin 1 (X Å)/Ru (9 Å)/Cu (85 Å)/Ta (30 Å) (wherein Pin 1 represents $Co_{90}Fe_{10}$ or Co)

The magnetostriction was measured by an optical lever method.

Figure 61:
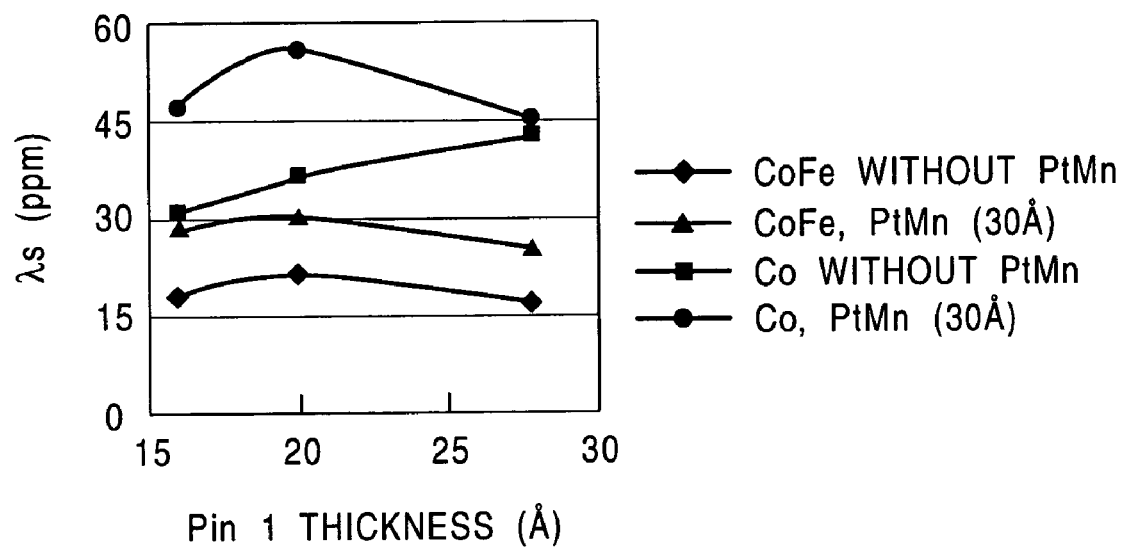
FIG. 61 is a graph showing the magnetostrictive constants of CoFe and Co of a CoFe layer laminated on a PtMn layer and a Co layer laminated on a PtMn layer, respectively.

The results are shown in FIG. 61. With the PtMn layer provided below the first magnetic layer (referred to as "Pin 1" hereinafter), the magnetostrictive constant is higher than that without the PtMn layer whether the Pin 1 comprises Co or CoFe. When the Pin 1 comprises Co, the magnetostrictive constant is higher than that when the Pin 1 comprises CoFe.

When the Pin 1 comprises Co, and the PtMn layer (30 Å) is provided below the Pin 1, the magnetostrictive constant increases as the thickness of the Pin 1 increases in the range of 16 Å to 20 Å. However, the magnetostrictive constant decreases when the thickness of the Pin 1 increases from 20 Å.

This indicates that, the effect of increasing the magnetostrictive constant by a distortion produced near the interface between the Pin 1 and the PtMn layer decreases as the Pin 1 becomes excessively thick.

Next, a PtMn layer was laminated on the Pin 1 for comparing the magnetostrictive constants of Co and CoFe.

The multilayer film below was deposited and annealed at 290° C. for 4 hours.

Silicon substrate/alumina (1000 Å)/($Ni_{0.8}Fe_{0.2}$)$_{60}Cr_{40}$ (52 Å)/Cu (85 Å)/Ru (9 Å)/Pin 1 (X Å)/$Pt_{50}Mn_{50}$ (0 Å or 30 Å)/Ta (30 Å) (wherein Pin 1 represents $Co_{90}Fe_{10}$ or Co)

The magnetostriction was measured by an optical lever method.

Figure 62:
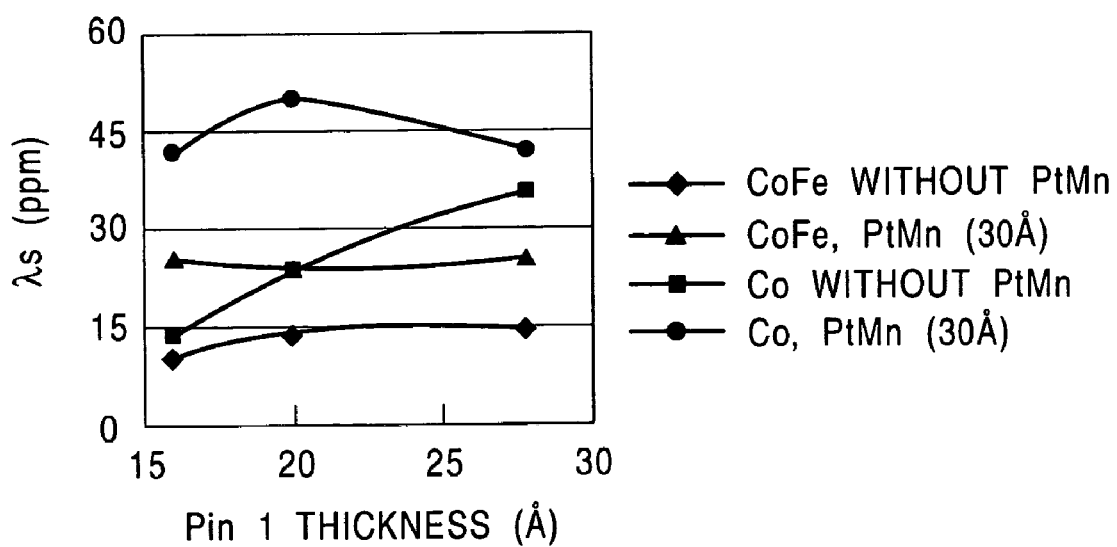
FIG. 62 is a graph showing the magnetostrictive constants of CoFe and Co of a CoFe layer on which a PtMn layer is laminated, and a Co layer on which a PtMn layer is laminated, respectively.
Figure 63:
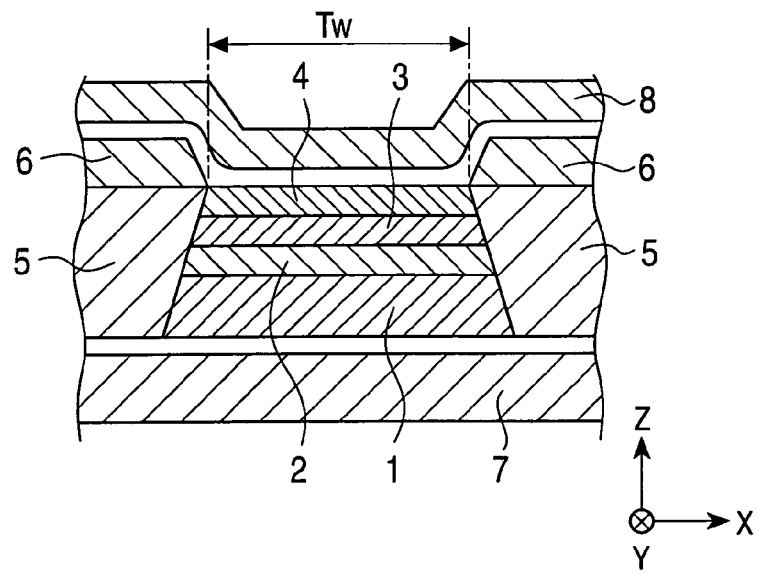
FIG. 63 is a partial sectional view of the structure of a conventional magnetic detecting element, as viewed from a surface facing a recording medium.
Figure 64:
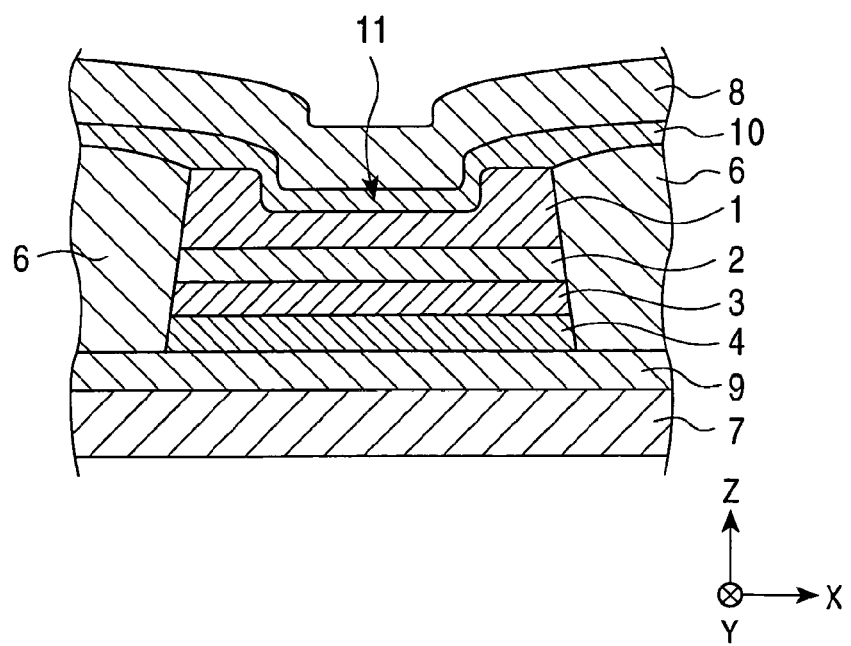
FIG. 64 is a partial sectional view of a magnetic detecting element transcribed from FIG. 1 of Japanese Unexamined Patent Application Publication No. 2000-163717.

The results are shown in FIG. 62. With the PtMn layer provided above the Pin 1, the same tendency as that with the PtMn layer provided below the Pin 1 is shown.

Namely, with the PtMn layer provided above the Pin 1, the magnetostrictive constant is higher than that without the PtMn layer whether the Pin 1 comprises Co or CoFe. When the Pin 1 comprises Co, the magnetostrictive constant is higher than that when the Pin 1 comprises CoFe. When the Pin 1 comprises Co, and the PtMn layer (30 Å) is provided above the Pin 1, the magnetostrictive constant increases as the thickness of the Pin 1 increases in the range of 16 Å to 19 Å. However, the magnetostrictive constant decreases when the thickness of the Pin 1 increases from 19 Å.

Next, a PtMn layer was laminated o a multilayer film of a laminated synthetic ferrimagnetic structure for measuring magnetostriction. The multilayer film below was deposited and annealed at 290° C. for 4 hours. In the multilayer film, a free magnetic layer was omitted because only the magnetostriction of a pinned magnetic layer was measured.

Silicon substrate/alumina (1000 Å)/($Ni_{0.8}Fe_{0.2}$)$_{60}Cr_{40}$ (52 Å)/$Pt_{50}Mn_{50}$ (30 Å)/Pin 1 (6 Å)/Ru (9 Å)/Pin 2 (40 Å)/Cu (85 Å)/Ta (30 Å) (wherein each of Pin 1 and Pin 2 represents $Co_{90}Fe_{10}$, $Fe_{50}Co_{50}$ or Co)

The magnetostriction was measured by a bending method. In the bending method, the multilayer film was bent to apply a uniaxial distortion, and the magnetostrictive constant is measured by a change in uniaxial anisotropy due to a reverse magnetostrictive effect. The results are shown in Table 1.

TABLE 1

| First magnetic layer | $Co_{90}Fe_{10}$ | Co | $Fe_{50}Co_{50}$ |
| Second magnetic layer | $Co_{90}Fe_{10}$ | Co | $Co_{90}Fe_{10}$ |
| λs (ppm) | +13.6 | +54.4 | +29.5 |

The experimental results reveal that with the Pin 1 and Pin 2 each made of Co, the magnetostrictive constant is higher than that with the Pin 1 and Pin 2 each made of CoFe.

The experimental results shown in FIGS. 60 to 62 and Table 1 indicate that for example, when the nonmagnetic metal layer 100 having a small thickness (50 Å or less) and the same composition as that of the first antiferromagnetic layer 30 is provided in the space of the first antiferromagnetic layer 30, as shown in FIG. 18, the magnetostrictive constant of the central portion 29b of the first magnetic layer 29 can be increased, and the magnetization of the central portion 29b of the first magnetic layer 29 can be stably pinned by the magnetoelastic effect.

In the present invention described in detail above, a pinned magnetic layer comprises a first magnetic layer in contact with a first antiferromagnetic layer, a second magnetic layer facing the first magnetic layer in the thickness direction, and a nonmagnetic intermediate layer interposed between the first and second magnetic layers, and the first antiferromagnetic layer has a space formed therein in the track width direction. Also, in both side portions of at least the first magnetic layer in the track width direction, the first antiferromagnetic layer is provided in contact with both side portions in the thickness direction to produce exchange coupling magnetic fields only between the first antiferromagnetic layer and both sides portions of the first magnetic layer. Therefore, magnetization of the pinned magnetic layer can be pinned, reproduction output can be improved, and narrowing of the gap can be realized. Furthermore, a magnetic detecting element with high resistance to electrostatic damage (ESD) can be manufactured. Thus, a magnetic detecting element adaptable for a future higher recording density can be provided.

What is claimed is:

1. A magnetic detecting element comprising:
 a multilayer film comprising a pair of first antiferromagnetic layers, a pinned magnetic layer, a nonmagnetic material layer and a free magnetic layer, which are laminated in that order on a substrate; and
 a pair of magnetization control layers for controlling magnetization of the free magnetic layer, wherein the pair of magnetization control layers has a predetermined space in the track width direction which faces the free magnetic layer,
 wherein the pinned magnetic layer comprises a first magnetic layer extending in a track width direction in contact with the pair of first antiferromagnetic layers, a second magnetic layer facing the first magnetic layer in a thickness direction, and a nonmagnetic intermediate layer interposed between the first and second magnetic layers, magnetizations of the first and second magnetic layers being antiparallel to each other;
 the pair of first antiferromagnetic layers has a predetermined space in the track width direction so that the pair of first antiferromagnetic layers is in contact with both side portions of the first magnetic layer in the thickness direction;
 an electric resistance in the space changes in relation to a magnetization direction of the free magnetic layer and a magnetization direction of the second magnetic layer;
 wherein a minimum dimension of the space between the pair of magnetization control layers is the same as or smaller than a minimum dimension of the predetermined space in the track width direction of the pair of first antiferrromagnetic layers.

2. The magnetic detecting element according to claim 1, wherein the multilayer film comprises a free magnetic layer, a nonmagnetic material layer, a pinned magnetic layer and a pair of first antiferromagnetic layers, which are laminated in that order from below, and the pair of magnetization control layers comprises a pair of second antiferromagnetic layers provided below the free magnetic layer to have a predetermined space in the track width direction so that the pair of magnetization control layers are in contact with bottoms of both side portions of the free magnetic layer, the pair of first antiferromagnetic layers being in contact with tops of both side portions of the first magnetic layer constituting the pinned magnetic layer.

3. The magnetic detecting element according to claim 1, wherein the pair of magnetization control layers comprise permanent-magnet layers in direct contact with both side portions of the free magnetic layer.

4. The magnetic detecting element according to claim 2, wherein assuming that a minimum dimension of the space provided in the pair of first antiferromagnetic layers in the track width direction is WP, and a minimum dimension of the space provided in the pair of magnetization control layers in the track width direction is Wf1, Wf1 is smaller than WP.

5. The magnetic detecting element according to claim 4, wherein the minimum dimension WP is 0.2 μm or less.

6. The magnetic detecting element according to claim 1, wherein the multilayer film comprises a free magnetic layer, a nonmagnetic material layer, a pinned magnetic layer and a pair of first antiferromagnetic layers, which are laminated in that order from below, the pair of magnetization control layers comprise permanent-magnet layers provided on both sides of at least the free magnetic layer and the nonmagnetic layer in the track width direction, the pinned magnetic layer is disposed on the nonmagnetic material layer to partially or entirely extend from the nonmagnetic layer to the permanent-magnet layers, and the pair of first antiferromagnetic layers are provided in contact with the both side portions of the first magnetic layer constituting the pinned magnetic layer.

7. The magnetic detecting element according to claim 6, wherein both side regions comprising the respective permanent-magnet layers are disposed on both sides of at least the free magnetic layer and the nonmagnetic material layer in the track width direction, and the pinned magnetic layer is provided on the nonmagnetic material layer to extend from the nonmagnetic material layer to both side regions of the element.

8. The magnetic detecting element according to claim 6, wherein both side regions comprising the respective permanent-magnet layers are disposed on both sides of at least the free magnetic layer, the nonmagnetic material layer and the second magnetic layer and nonmagnetic intermediate layer constituting the pinned magnetic layer in the track width direction, and the first magnetic layer constituting the pinned magnetic layer is provided on the nonmagnetic intermediate layer to extend from the nonmagnetic intermediate layer to both side regions of the element.

9. The magnetic detecting element according to claim 6, wherein assuming that a minimum dimension of the space provided in the pair of first antiferromagnetic layers in the track width direction is WP, and a minimum width dimension of the free magnetic layer in the track width direction is Wf2, Wf2 is the same as or smaller than WP.

10. The magnetic detecting element according to claim 1, wherein the multilayer film comprises a pair of first antiferromagnetic layers, a pinned magnetic layer, a nonmagnetic material layer, and a free magnetic layer, which are laminated in that order from below, and the pair of first antiferromagnetic layers are provided with a predetermined space in the track width direction so that the pair of first antiferromagnetic layers are in contact with bottoms of both side portions of the first magnetic layer in the track width direction.

11. The magnetic detecting element according to claim 10, wherein the substrate provided below the pair of first antiferromagnetic layers have recessed portions provided in both side portions in the track width direction to have a predetermined depth, the pair of first antiferromagnetic layers being disposed in the recessed portions with the predetermined space in the track width direction.

12. The magnetic detecting element according to claim 10, wherein the pair of magnetization control layers comprise a pair of second antiferromagnetic layers provided on the free magnetic layer to make contact with both side portions of the free magnetic layer and have a predetermined space in the track width direction.

13. The magnetic detecting element according to claim 12, wherein assuming that a minimum dimension of the space provided in the pair of first antiferromagnetic layers in the track width direction is WP, and a minimum dimension of the space provided in the pair of magnetization control layers in the track width direction is Wf3, Wf3 is smaller than WP.

14. The magnetic detecting element according to claim 10, wherein permanent-magnet layers each serving as the magnetization control layer are provided on both sides of the free magnetic layer in the track width direction so that bottoms of the permanent-magnet layers are positioned above at least the pinned magnetic layer.

15. The magnetic detecting element according to claim 14, wherein assuming that a minimum dimension of the space provided in the first antiferromagnetic layer in the track width direction is WP, and a minimum width dimension of the free magnetic layer in the track width direction is Wf4, Wf4 is the same as or smaller than WP.

16. The magnetic detecting element according to claim 1, further comprising electrode layers provided on both side portions of the multilayer film such that a direction of a sensing current magnetic field formed by a sensing current flowing from the electrode layers to the multilayer film coincides with a direction of a synthetic magnetic moment per unit area of the magnetic layers constituting the pinned magnetic layer.

17. The magnetic detecting element according to claim 1, further comprising a nonmagnetic metal layer having the same composition as that of the pair of first antiferromagnetic layers and provided in the space to make contact with the first magnetic layer, the nonmagnetic metal layer provided in the space being a disordered crystal structure layer thinner than the pair of first antiferromagnetic layers.

18. The magnetic detecting element according to claim 17, wherein a crystal of the first magnetic layer is epitaxial or heteroepitaxial with a crystal of the nonmagnetic metal layer, an end surface of the pinned magnetic layer is open near a surface facing a recording medium, and the nonmagnetic metal layer is made of a PtMn alloy.

19. The magnetic detecting element according to claim 17, wherein a crystal of the first magnetic layer is epitaxial or heteroepitaxial with a crystal of the nonmagnetic metal layer, an end surface of the pinned magnetic layer is open near a surface facing a recording medium, and the nonmagnetic metal layer is made of X—Mn alloy (wherein X is at least one element of Pt, Pd, Ir, Rh, Ru, Os, Ni, and Fe).

20. The magnetic detecting element according to claim 19, wherein in the vicinity of an interface with a central portion of the first magnetic layer or over the entire region of the nonmagnetic metal layer, the nonmagnetic metal layer assumes a face-centered cubic lattice (fcc) structure in which an equivalent crystal plane represented by a $\{111\}$ plane is preferentially oriented in parallel with the interface.

21. The magnetic detecting element according to claim 19, wherein a thickness of the nonmagnetic metal layer is 5 Å to 50 Å.

22. The magnetic detecting element according to claim 19, wherein the content of X element in the X—Mn alloy is 55 atomic percent to 95 atomic percent.

23. The magnetic detecting element according to claim 19, wherein in the vicinity of an interface with the nonmagnetic metal layer or over the entire region of a central portion of the first magnetic layer of the pinned magnetic layer, at least the central portion facing the nonmagnetic metal layer in the thickness direction assumes a face-centered cubic lattice (fcc) structure in which an equivalent crystal plane represented by a $\{111\}$ plane is preferentially oriented in parallel with the interface.

24. The magnetic detecting element according to claim 23, wherein the first magnetic layer of the pinned magnetic layer is made of Co or $Co_xFe_y$ ($y \leq 20$, x+y=100).

25. The magnetic detecting element according to claim 19, wherein in the vicinity of an interface with the nonmagnetic metal layer or over the entire region of a central portion of the first magnetic layer of the pinned magnetic layer, at least the central portion facing the nonmagnetic metal layer in the thickness direction assumes a body-centered cubic lattice (bcc) structure in which an equivalent crystal plane represented by a $\{110\}$ plane is preferentially oriented in parallel with the interface.

26. The magnetic detecting element according to claim 25, wherein the first magnetic layer of the pinned magnetic layer is made of Co or $Co_xFe_y$ ($y \geq 20$, x+y=100).

27. The magnetic detecting element according to claim 19, wherein in the vicinity of an interface with the nonmagnetic metal layer, at least a central portion of the first magnetic layer of the pinned magnetic layer facing the nonmagnetic metal layer in the thickness direction assumes a face-centered cubic lattice (fcc) structure in which an equivalent crystal plane represented by a $\{111\}$ plane is preferentially oriented in parallel with the interface, and in the vicinity of an interface with the nonmagnetic intermediate layer, the central portion assumes a body-centered cubic lattice (bcc) structure in which an equivalent crystal plane represented by a $\{110\}$ plane is preferentially oriented in parallel with the interface.

28. The magnetic detecting element according to claim 27, wherein the first magnetic layer of the pinned magnetic layer has a composition comprising Co or $Co_xFe_y$ ($y \leq 20$, x+y=100) near the interface with the nonmagnetic metal layer, and the first magnetic layer of the pinned magnetic layer has a composition comprising $Co_xFe_y$ ($y \geq 20$, x+y=100) near the interface with the nonmagnetic intermediate layer.

29. The magnetic detecting element according to claim 28, wherein the first magnetic layer of the pinned magnetic layer has a Fe concentration gradually increasing in a direction from the interface with the nonmagnetic metal layer to the interface with the nonmagnetic intermediate layer.

30. The magnetic detecting element according to claim 19, wherein a value obtained by dividing a difference between a distance of nearest neighbor atoms of the nonmagnetic metal layer and that of a central portion of the first magnetic layer of the pinned magnetic layer in a planar direction parallel to the interface by a distance between nearest neighbor atoms of the first magnetic layer is 0.05 to 0.20.

31. The magnetic detecting element according to claim 19, wherein the first magnetic layer has a positive magnetostrictive constant.

32. The magnetic detecting element according to claim 19, further comprising electrode layers made of Cr, α-Ta or Rh and provided on both sides portions of the magnetic detecting element in the track width direction.

33. The magnetic detecting element according to claim 19, wherein the first magnetic layer has a positive magnetostrictive constant.

34. The magnetic detecting element according to claim 19, further comprising electrode layers made of Cr, α-Ta or Rh and provided on both sides portions of the magnetic detecting element in the track width direction.

35. A magnetic detecting element comprising:
a multilayer film comprising a pair of first antiferromagnetic layers, a pinned magnetic layer, a nonmagnetic material layer and a free magnetic layer, which are laminated in that order on a substrate; and
a pair of magnetization control layers for controlling magnetization of the free magnetic layer,
wherein the pinned magnetic layer comprises a first magnetic layer extending in a track width direction in contact with the pair of first antiferromagnetic layers, a second magnetic layer facing the first magnetic layer in a thickness direction, and a nonmagnetic intermediate layer interposed between the first and second magnetic layers, magnetizations of the first and second magnetic layers being antiparallel to each other;
the pair of first antiferromagnetic layers have a predetermined space in the track width direction so that the pair of first antiferromagnetic layers are in contact with both side portions of the first magnetic layer in the thickness direction;
an electric resistance in the space changes in relation to a magnetization direction of the free magnetic layer and a magnetization direction of the second magnetic layer;
wherein the magnetic detecting element further comprises a nonmagnetic metal layer having the same composition as that of the pair of first antiferromagnetic layers and provided in the space to make contact with the first magnetic layer, the nonmagnetic metal layer provided in the space being a disordered crystal structure layer thinner than the pair of first antiferromagnetic layers;
wherein a crystal of the first magnetic layer is epitaxial or heteroepitaxial with a crystal of the nonmagnetic metal layer, an end surface of the pinned magnetic layer is open near a surface facing a recording medium, and the nonmagnetic metal layer is made of X—Mn alloy (wherein X is at least one element of Pt, Pd, Ir, Rh, Ru, Os, Ni, and Fe); and
further wherein in the vicinity of an interface with a central portion of the first magnetic layer or over the entire region of the nonmagnetic metal layer, the nonmagnetic metal layer assumes a face-centered cubic lattice (fcc) structure in which an equivalent crystal plane represented by a {111} plane is preferentially oriented in parallel with the interface.

36. The magnetic detecting element according to claim 35, wherein a thickness of the nonmagnetic metal layer is 5 Å to 50 Å.

37. The magnetic detecting element according to claim 35, wherein the Pt content of the content of X element in the X—Mn alloy is 55 atomic percent to 95 atomic percent.

38. The magnetic detecting element according to claim 35, wherein in the vicinity of an interface with the nonmagnetic metal layer or over the entire region of a central portion of the first magnetic layer of the pinned magnetic layer, at least the central portion facing the nonmagnetic metal layer in the thickness direction assumes a face-centered cubic lattice (fcc) structure in which an equivalent crystal plane represented by a {111} plane is preferentially oriented in parallel with the interface.

39. The magnetic detecting element according to claim 35, wherein the first magnetic layer of the pinned magnetic layer is made of Co or $Co_xFe_y$ ($y \leq 20$, $x+y=100$).

40. The magnetic detecting element according to claim 35, wherein the first magnetic layer of the pinned magnetic layer is made of Co or $Co_xFe_y$ ($y \geq 20$, $x+y=100$).

41. The magnetic detecting element according to claim 35, wherein in the vicinity of an interface with the nonmagnetic metal layer, at least a central portion of the first magnetic layer of the pinned magnetic layer facing the nonmagnetic metal layer in the thickness direction assumes a face-centered cubic lattice (fcc) structure in which an equivalent crystal plane represented by a {111} plane is preferentially oriented in parallel with the interface, and in the vicinity of an interface with the nonmagnetic intermediate layer, the central portion assumes a body-centered cubic lattice (bcc) structure in which an equivalent crystal plane represented by a {110} plane is preferentially oriented in parallel with the interface.

42. The magnetic detecting element according to claim 35, wherein the first magnetic layer of the pinned magnetic layer has a composition comprising Co or $Co_xFe_y$ ($y \leq 20$, $x+y=100$) near the interface with the nonmagnetic metal layer, and the first magnetic layer of the pinned magnetic layer has a composition comprising $Co_xFe_y$ ($y \geq 20$, $x+y=100$) near the interface with the nonmagnetic intermediate layer.

43. The magnetic detecting element according to claim 35, wherein the first magnetic layer of the pinned magnetic layer has a Fe concentration gradually increasing in a direction from the interface with the nonmagnetic metal layer to the interface with the nonmagnetic intermediate layer.

44. The magnetic detecting element according to claim 35, wherein a value obtained by dividing a difference between a distance of nearest neighbor atoms of the nonmagnetic metal layer and that of a central portion of the first magnetic layer of the pinned magnetic layer in a planar direction parallel to the interface by a distance between nearest neighbor atoms of the first magnetic layer is 0.05 to 0.20.

45. The magnetic detecting element according to claim 35, wherein the first magnetic layer has a positive magnetostrictive constant.

46. The magnetic detecting element according to claim 35, further comprising electrode layers made of Cr, α-Ta or Rh and provided on both sides portions of the magnetic detecting element in the track width direction.

47. A magnetic detecting element comprising:
a multilayer film comprising a pair of first antiferromagnetic layers, a pinned magnetic layer, a nonmagnetic material layer and a free magnetic layer, which are laminated in that order on a substrate; and
a pair of magnetization control layers for controlling magnetization of the free magnetic layer,
wherein the pinned magnetic layer comprises a first magnetic layer extending in a track width direction in contact with the pair of first antiferromagnetic layers, a second magnetic layer facing the first magnetic layer in a thickness direction, and a nonmagnetic intermediate layer interposed between the first and second magnetic layers, magnetizations of the first and second magnetic layers being antiparallel to each other;

the pair of first antiferromagnetic layers has a predetermined space in the track width direction so that the pair of first antiferromagnetic layers is in contact with both side portions of the first magnetic layer in the thickness direction;

an electric resistance in the space changes in relation to a magnetization direction of the free magnetic layer and a magnetization direction of the second magnetic layer;

wherein the magnetic detecting element further comprises a nonmagnetic metal layer having the same composition as that of the pair of first antiferromagnetic layers and provided in the space to make contact with the first magnetic layer, the nonmagnetic metal layer provided in the space being a disordered crystal structure layer thinner than the pair of first antiferromagnetic layers;

wherein a crystal of the first magnetic layer is epitaxial or heteroepitaxial with a crystal of the nonmagnetic metal layer, an end surface of the pinned magnetic layer is open near a surface facing a recording medium, and the nonmagnetic metal layer is made of X—Mn alloy (wherein X is at least one element of Pt, Pd, Ir, Rh, Ru, Os, Ni, and Fe); and wherein in the vicinity of an interface with the nonmagnetic metal layer, at least a central portion of the first magnetic layer of the pinned magnetic layer facing the nonmagnetic metal layer in the thickness direction assumes a face-centered cubic lattice (fcc) structure in which an equivalent crystal plane represented by a {111} plane is preferentially oriented in parallel with the interface, and in the vicinity of an interface with the nonmagnetic intermediate layer, the central portion assumes a body-centered cubic lattice (bcc) structure in which an equivalent crystal plane represented by a {110} plane is preferentially oriented in parallel with the interface.

48. The magnetic detecting element according to claim 47, wherein a thickness of the nonmagnetic metal layer is 5 Å to 50 Å.

49. The magnetic detecting element according to claim 47, wherein the Pt content of the content of X element in the X—Mn alloy is 55 atomic percent to 95 atomic percent.

50. The magnetic detecting element according to claim 47, wherein the first magnetic layer of the pinned magnetic layer has a composition comprising Co or $Co_xFe_y$ (y≦20, x+y=100) near the interface with the nonmagnetic metal layer, and the first magnetic layer of the pinned magnetic layer has a composition comprising $Co_xFe_y$ (y≧20, x+y=100) near the interface with the nonmagnetic intermediate layer.

51. The magnetic detecting element according to claim 47, wherein the first magnetic layer of the pinned magnetic layer has a Fe concentration gradually increasing in a direction from the interface with the nonmagnetic metal layer to the interface with the nonmagnetic intermediate layer.

52. The magnetic detecting element according to claim 47, wherein a value obtained by dividing a difference between a distance of nearest neighbor atoms of the nonmagnetic metal layer and that of a central portion of the first magnetic layer of the pinned magnetic layer in a planar direction parallel to the interface by a distance between nearest neighbor atoms of the first magnetic layer is 0.05 to 0.20.

53. The magnetic detecting element according to claim 47, wherein the first magnetic layer has a positive magnetostrictive constant.

54. The magnetic detecting element according to claim 47, further comprising electrode layers made of Cr, α-Ta or Rh and provided on both sides portions of the magnetic detecting element in the track width direction.

55. A magnetic detecting element comprising:

a multilayer film comprising a pair of first antiferromagnetic layers, a pinned magnetic layer, a nonmagnetic material layer and a free magnetic layer, which are laminated in that order on a substrate; and a pair of magnetization control layers for controlling magnetization of the free magnetic layer, wherein the pinned magnetic layer comprises a first magnetic layer extending in a track width direction in contact with the pair of first antiferromagnetic layers, a second magnetic layer facing the first magnetic layer in a thickness direction, and a nonmagnetic intermediate layer interposed between the first and second magnetic layers, magnetizations of the first and second magnetic layers being antiparallel to each other;

the pair of first antiferromagnetic layers has a predetermined space in the track width direction so that the pair of first antiferromagnetic layers is in contact with both side portions of the first magnetic layer in the thickness direction;

an electric resistance in the space changes in relation to a magnetization direction of the free magnetic layer and a magnetization direction of the second magnetic layer;

wherein the magnetic detecting element further comprises a nonmagnetic metal layer having the same composition as that of the pair of first antiferromagnetic layers and provided in the space to make contact with the first magnetic layer, the nonmagnetic metal layer provided in the space being a disordered crystal structure layer thinner than the pair of first antiferromagnetic layers;

wherein a crystal of the first magnetic layer is epitaxial or heteroepitaxial with a crystal of the nonmagnetic metal layer, an end surface of the pinned magnetic layer is open near a surface facing a recording medium, and the nonmagnetic metal layer is made of X—Mn alloy (wherein X is at least one element of Pt, Pd, Ir, Rh, Ru, Os, Ni, and Fe); and wherein a value obtained by dividing a difference between a distance of nearest neighbor atoms of the nonmagnetic metal layer and that of a central portion of the first magnetic layer of the pinned magnetic layer in a planar direction parallel to the interface by a distance between nearest neighbor atoms of the first magnetic layer is 0.05 to 0.20.

56. The magnetic detecting element according to claim 55, wherein a thickness of the nonmagnetic metal layer is 5 Å to 50 Å.

57. The magnetic detecting element according to claim 55, wherein the Pt content of the content of X element in the X—Mn alloy is 55 atomic percent to 95 atomic percent.

58. The magnetic detecting element according to claim 55, wherein in the vicinity of an interface with the nonmagnetic metal layer or over the entire region of a central portion of the first magnetic layer of the pinned magnetic layer, at least the central portion facing the nonmagnetic metal layer in the thickness direction assumes a face-centered cubic lattice (fcc) structure in which an equivalent crystal plane represented by a {111} plane is preferentially oriented in parallel with the interface.

59. The magnetic detecting element according to claim 55, wherein the first magnetic layer of the pinned magnetic layer is made of Co or $Co_xFe_y$ ($y \leq 20$, $x+y=100$).

60. The magnetic detecting element according to claim 55, wherein in the vicinity of an interface with the nonmagnetic metal layer or over the entire region of a central portion of the first magnetic layer of the pinned magnetic layer, at least the central portion facing the nonmagnetic metal layer in the thickness direction assumes a body-centered cubic lattice (bcc) structure in which an equivalent crystal plane represented by a {110} plane is preferentially oriented in parallel with the interface.

61. The magnetic detecting element according to claim 55, wherein the first magnetic layer of the pinned magnetic layer is made of Co or $Co_xFe_y$ ($y \geq 20$, $x+y=100$).

62. The magnetic detecting element according to claim 55, wherein the first magnetic layer of the pinned magnetic layer has a composition comprising Co or $Co_xFe_y$ ($y \leq 20$, $x+y=100$) near the interface with the nonmagnetic metal layer, and the first magnetic layer of the pinned magnetic layer has a composition comprising $Co_xFe_y$ ($y \geq 20$, $x+y=100$) near the interface with the nonmagnetic intermediate layer.

63. The magnetic detecting element according to claim 55, wherein the first magnetic layer of the pinned magnetic layer has a Fe concentration gradually increasing in a direction from the interface with the nonmagnetic metal layer to the interface with the nonmagnetic intermediate layer.

* * * * *